United States Patent
Kanda

(10) Patent No.: US 9,442,372 B2
(45) Date of Patent: Sep. 13, 2016

(54) PIGMENT DISPERSION COMPOSITION, PHOTOCURABLE COMPOSITION AND COLOR FILTER

(75) Inventor: Hiromi Kanda, Shizuoka-ken (JP)

(73) Assignee: FUJIFILM Corporation, Tokyo (JP)

(*) Notice: Subject to any disclaimer, the term of this patent is extended or adjusted under 35 U.S.C. 154(b) by 851 days.

(21) Appl. No.: 12/207,221

(22) Filed: Sep. 9, 2008

(65) Prior Publication Data

US 2009/0082487 A1    Mar. 26, 2009

(30) Foreign Application Priority Data

Sep. 26, 2007  (JP) ................................. 2007-249766
Mar. 18, 2008  (JP) ................................. 2008-069319

(51) Int. Cl.
C08F 2/46       (2006.01)
G03F 7/00       (2006.01)
G03F 7/105      (2006.01)
C08L 29/12      (2006.01)

(52) U.S. Cl.
CPC .............. *G03F 7/0007* (2013.01); *G03F 7/105* (2013.01); *C08F 2/46* (2013.01); *C08L 29/12* (2013.01)

(58) Field of Classification Search
CPC ......... G03F 7/0007; C08F 2/46; C08L 29/12
USPC .......................................................... 522/81
See application file for complete search history.

(56) References Cited

U.S. PATENT DOCUMENTS

| | | | |
|---|---|---|---|
| 5,424,364 A | 6/1995 | Simms et al. | |
| 5,852,123 A | 12/1998 | Huybrechts | |
| 6,037,390 A * | 3/2000 | Page et al. | 523/160 |
| 6,100,312 A | 8/2000 | Suzuki et al. | |
| 6,146,769 A * | 11/2000 | Anton | 428/500 |
| 6,391,519 B1 | 5/2002 | Kunita | |
| 6,521,715 B1 * | 2/2003 | Ma | 525/379 |
| 2003/0058357 A1 * | 3/2003 | Aotsuka | 348/272 |
| 2003/0134221 A1 * | 7/2003 | Nishiyama et al. | 430/170 |
| 2004/0192828 A1 | 9/2004 | Mitsuhata et al. | |
| 2005/0186442 A1 * | 8/2005 | Gros | 428/626 |
| 2005/0191580 A1 * | 9/2005 | Takahashi et al. | 430/270.1 |
| 2006/0016026 A1 * | 1/2006 | Tateishi et al. | 8/539 |
| 2006/0135686 A1 * | 6/2006 | Killilea et al. | 524/556 |
| 2007/0099094 A1 * | 5/2007 | Nemoto et al. | 430/7 |
| 2007/0172769 A1 * | 7/2007 | Kanna et al. | 430/311 |
| 2007/0178405 A1 * | 8/2007 | Kanda et al. | 430/270.1 |
| 2007/0211126 A1 * | 9/2007 | Bauer et al. | 347/100 |
| 2008/0281036 A1 * | 11/2008 | Ito et al. | 524/556 |
| 2008/0305433 A1 * | 12/2008 | Kanda et al. | 430/285.1 |
| 2010/0047531 A1 | 2/2010 | Baum et al. | |

FOREIGN PATENT DOCUMENTS

| | | |
|---|---|---|
| EP | 0 927 751 A1 | 7/1999 |
| EP | 1072401 A2 | 1/2001 |
| EP | 1072927 A2 | 1/2001 |
| EP | 1484366 A1 | 12/2004 |
| EP | 1600473 A2 | 11/2005 |
| JP | 4-139262 A | 5/1992 |
| JP | 4-345609 A | 12/1992 |
| JP | 7-292039 A | 11/1995 |
| JP | 9-279097 A | 10/1997 |
| JP | 11-001525 A | 1/1999 |
| JP | 2000-062338 A | 2/2000 |
| JP | 2000-075485 A | 3/2000 |
| JP | 2000-095992 A | 4/2000 |
| JP | 3094403 B2 | 10/2000 |
| JP | 2000-336291 A | 12/2000 |
| JP | 2001-356474 A | 12/2001 |
| JP | 2003-270784 A | 9/2003 |
| JP | 2003-313389 A | 11/2003 |
| JP | 2004-012820 A | 1/2004 |
| JP | 2004-287409 | 10/2004 |
| JP | 2006-106530 A | 4/2006 |
| WO | WO 03/002660 A1 | 1/2003 |
| WO | WO 2006011338 A1 * | 2/2006 |
| WO | WO 2006/066809 A1 | 6/2006 |
| WO | WO 2006108570 A1 * | 10/2006 |

OTHER PUBLICATIONS

Office Action issued Jan. 14, 2013, in corresponding Chinese Patent Application No. 200810215752.4 and an English translation thereof.

Office Action issued May 27, 2013, in corresponding Chinese Patent Application No. 200810215752.4 and an English translation thereof.

Office Action issued in corresponding Japanese Patent Application No. 2008-069319 dated Sep. 25, 2012 and the Partial English Translation.

Notice of Examination Report issued by Taiwan Intellectual Property Office on Feb. 27, 2014 in Taiwanese Patent Application No. 097134477, and partial English language translation thereof (6 pages).

Office Action issued Jul. 4, 2016, by the European Patent Office in corresponding European Patent Application No. 08016027.8, 5 pages.

* cited by examiner

*Primary Examiner* — Michael Pepitone
(74) *Attorney, Agent, or Firm* — Buchanan, Ingersoll & Rooney PC

(57) ABSTRACT

There is provided a pigment dispersion composition having high pigment dispersibility and dispersion stability and favorable color characteristics even when containing a high concentration of pigment; a photocurable composition superior in developability and pixel surface smoothness, allowing high contrast; and a color filter having high contrast. A pigment dispersion composition containing a polymeric compound having a specific group or the like dissociated by an alkali is used.

14 Claims, No Drawings

(54) PIGMENT DISPERSION COMPOSITION, PHOTOCURABLE COMPOSITION AND COLOR FILTER

CROSS-REFERENCE TO RELATED APPLICATION

This application claims priority under 35 USC 119 from Japanese Patent Application Nos. 2007-249766 and 2008-069319, the disclosures of which are incorporated by reference herein.

BACKGROUND OF THE INVENTION

1. Field of the Invention

The invention relates to a pigment dispersion composition capable of being utilized in imaging materials such as color filters and color proofs, and photocurable materials such as ink and paint; a photocurable composition appropriate for forming a color filter for a liquid crystal display and a solid-state image sensing device; a color filter using the photocurable composition; and a method of production thereof.

2. Description of the Related Art

In recent years, applications of color filters in liquid crystal displays (LCDs), have expanded beyond monitors to include televisions and the like. Accordingly, high specification color properties with respect to chromaticity and contrast have been desired. Similarly, high quality color properties such as reductions in color irregularities and improvements in color separation have been demanded for applications of image sensors (solid-state image sensing devices).

In relation to the above, there has arisen a demand that pigment be dispersed in a minuter state (favorable dispersibility) and that pigment be retained in a stable dispersion state (favorable dispersion stability). If dispersibility is insufficient, fringes (notches in an edge portion) and surface irregularities are caused in a formed colored resist film, and problems occur, such as a decrease in chromaticity and dimensional accuracy of a color filter to be produced, and a remarkable decrease in contrast. If dispersion stability is insufficient, the following problems in particular are easily caused during the production processes of a color filter: uniformity of film thickness is decreased in a process of applying a colored photocurable composition; photosensitivity is decreased in a process of exposing; and alkali solubility is decreased in a process of developing. In addition, when dispersion stability of a pigment is poor, the components of a colored photocurable composition cohere and increase the viscosity thereof over time and significantly decrease pot life, which is problematic.

In order to address such problems, a pigment dispersant comprising a polymer combined with an organic pigment has been proposed (refer to Japanese Patent Application Laid-Open (JP-A) No. 4-139262). The use of a copolymer containing acid groups such as carboxylic acid and a radical of sulfonic acid or the like, and a polymer containing maleimide substituted with a phenolic acid group has also been proposed (refer to Japanese Patent No. 3094403 and JP-A No. 2004-287409).

However, when the particle diameter of a pigment is made minute, the surface area of pigment particles increases, and cohesive force among the pigment particles is strengthened, such that it has been difficult for dispersibility and dispersion stability to be compatible at a high level.

When producing a color filter by using the pigment dispersion composition, a photocurable composition is applied to and dried on a substrate or a substrate with a light blocking layer of a desired pattern previously formed thereon, and thereafter irradiated with radioactive rays (hereinafter referred to as "expose") through the desired pattern and developed to obtain a pixel in each color. However, in a color filter thus produced, a problem exists in that that residue and scumming easily occur on the substrate at an unexposed portion thereof, or at the light blocking layer, during the developing process, and post-baked pixels after developing are inferior in film coating properties; for example, they are poor in surface smoothness. Moreover, the degree of residue and scumming on the substrate or the light blocking layer and deterioration of surface smoothness tends to become more remarkable as the concentration of the pigment contained in the photocurable composition increases, so that it has been difficult to achieve sufficient color density in a conventional photocurable composition for a color filter.

SUMMARY OF THE INVENTION

The present invention has been made in view of the above circumstances and provides a pigment dispersion composition, a photocurable composition and a color filter being made therewith.

A first aspect of the present invention provides a pigment dispersion composition containing a polymeric compound (A) comprising one or more of a partial structure selected from either of the following formulae (1) and (2), and a weight-average molecular weight of 1,000 to 100,000, and pigment (B).

$$-Q^1-Q^2-Z- \quad \text{Formula (1)}$$

wherein in formula (1), $Q^1$ denotes —(C=O)— or —SO$_2$—, $Q^2$ denotes —NH— or —CHR$^8$—, and Z denotes —(C=O)—R$^9$— or —SO$_2$—R$^9$—. R$^8$ denotes a hydrogen atom, a halogen atom, a cyano group or an alkyl group, and R$^9$ denotes an alkylene group, a cycloalkylene group or an arylene group. R$^8$ and R$^9$ may be linked to each other through a linking group.

$$-Rf-OH \quad \text{Formula (2)}$$

wherein in formula (2), Rf denotes an alkylene group with at least one fluorine atom substituted.

A second aspect of the present invention provides a photocurable composition containing the pigment dispersion composition according to the first aspect, alkali-soluble resin, a photo polymerizable compound and a photo polymerization initiator.

A third aspect of the present invention provides a color filter comprising the photocurable composition according to the second aspect used.

A fourth aspect of the present invention provides devices such as a liquid crystal display or a solid-state image sensing device using the color filter according to the third aspect.

DETAILED DESCRIPTION OF THE INVENTION

The invention has been made in view of the above, and the object thereof is to provide a pigment dispersion composition having high pigment dispersibility and dispersion stability and favorable color characteristics even in the case of containing pigment at high concentration; a photocurable composition superior in developability and surface smoothness of a picture element, allowing high contrast, in composing a color filter; a color filter having favorable color characteristics and high contrast; a liquid crystal display and a solid-state image sensing device using a color filter; and a producing method of a color filter, and the invention is intended for achieving the object.

Through earnest studies, the inventors of the invention have obtained a pigment fluid dispersion composition with dispersion stability, realizing a high dispersion state, by using a pigment dispersion composition containing a polymeric compound containing an alkali dissociative group having specific structure to find out a photocurable composition offering high color characteristics and favorable developability.

That is to say, the constitution of the invention is as follows.

<1>. A pigment dispersion composition containing a polymeric compound (A) comprising one or more of a partial structure selected from either of the following formulae (1) and (2), and a weight-average molecular weight of 1,000 to 100,000, and pigment (B).

-Q$^1$-Q$^2$-Z-    Formula (1)

wherein in formula (1), Q$^1$ denotes —(C=O)— or —SO$_2$—,
Q$^2$ denotes —NH— or —CHR$^8$—, and
Z denotes —(C=O)—R$^9$— or —SO$_2$—R$^9$—.
R$^8$ denotes a hydrogen atom, a halogen atom, a cyano group or an alkyl group, and
R$^9$ denotes an alkylene group, a cycloalkylene group or an arylene group.
R$^8$ and R$^9$ may be linked to each other through a linking group.

-Rf-OH    Formula (2)

wherein in formula (2), Rf denotes an alkylene group with at least one fluorine atom substituted.

<2>. The pigment dispersion composition according to the item <1>, wherein the formula (1) is —(C=O)—CHR$^8$—(C=O)—R$^7$—.

In the formula, R$^8$ signifies the same as the formula (1), and R$^7$ denotes an alkylene group, a cycloalkylene group and an arylene group.

<3>. The pigment dispersion composition according to the item <1> or <2>, wherein the polymeric compound (A) is a polymeric compound containing 5 to 100% by mass of a repeating unit containing one or more of a partial structure selected from the formulae (1) and (2).

<4>. The pigment dispersion composition according to any one of the items <1> to <3>, wherein an acid value of the polymeric compound (A) is 30 to 300 mgKOH/g.

<5>. The pigment dispersion composition according to any one of the items <1> to <4>, wherein the polymeric compound (A) is a compound comprising polycaprolactone as a graft chain.

<6>. A photocurable composition containing the pigment dispersion composition according to any one of the items <1> to <5>, alkali-soluble resin, a photo-polymerizable compound and a photo polymerization initiator.

<7>. A color filter comprising the photocurable composition according to the item <6> used.

<8>. A liquid crystal display using the color filter according to the item <7>.

<9>. A solid-state image sensing device using the color filter according to the item <7>.

That is, a polymeric compound of the invention has an either partial structure of the formulae (1) and (2), and the formula (1) first exhibits alkali solubility by dissociating in the alkali developing process. The formula (2) is a weakly acidic or hydrophobic acidic group. In conventionally used acidic groups exhibiting strong hydrophilic property, such as carboxylic acid group and sulfonic acid group, the problem is the interaction with a basic dispersant during the dispersing process, the preparing process of a photocurable composition and the preservation of a photocurable composition. However, a polymeric compound of the invention allows the interaction with a basic dispersant to be reduced. Thus, the dispersant may be freely designed and the dispersing function of the dispersant may be sufficiently performed.

With regard to a colored photocurable composition using a pigment dispersion composition of the invention, polymer liquid adheres to a piping area for coating and a coating head area with difficulty; therefore, residence of the liquid in the piping is decreased and adhesion of dried foreign matter to the coating head area is decreased, so that it is conceived that a color filter particularly superior in surface smoothness may be obtained. Also, it is conceived that the reason therefor is that fluid dispersion and a photocurable composition resulting from association between an alkali-soluble polymer and a dispersant may be prevented from thickening with time, and the pigment may be prevented from cohering. In addition, alkaline development progresses mildly; therefore, it is assumed that discrimination between an exposed area and an unexposed area is made so easily that favorable development pattern is obtained and residue and scumming are rendered favorable.

DESCRIPTION OF THE PREFERRED EMBODIMENT

The invention is hereinafter described in detail.

[Pigment Dispersion Composition]

A pigment dispersion composition of the present invention is such as to contain in organic solvent a polymeric compound (A) having one kind or more of a group selected from either of the formulae (1) and (2), and a weight-average molecular weight of 1,000 to 100,000, and at least one kind of pigment (B), which pigment dispersion composition may be composed as required by using another component such as a resin component. The partial structure selected from either of these formulae (1) and (2) has the function of being dissociated by alkali to be dissolved in alkali and the function of exhibiting weak acidity to be dissolved in alkali, respectively. Thus, the use of the polymeric compound (A) as a pigment dispersant does not cause a pigment dispersion composition and a photocurable composition to exhibit strong hydrophilic property, so that a dispersion state of the pigment is favorable, the pigment is prevented from cohering and favorable color characteristics are obtained, and additionally color characteristics such as high contrast and developability may be developed in composing a color filter, for example.

Polymeric Compound (A)

A pigment dispersant of the invention contains a polymeric compound (A) having a group selected from the following formulae (1) and (2), and a weight-average molecular weight of 1,000 to 100,000. The use of this polymeric compound (A) as a pigment dispersant causes a dispersion state of the pigment in organic solvent to be favorable, and allows high developability and surface smoothness to be developed even in the case of containing the pigment at high concentration, for example, in composing a color filter.

 Formula (1)

Here, $Q^1$ denotes —(C=O)— or —SO$_2$—,
$Q^2$ denotes —NH— or —CHR$^8$—, and
Z denotes —(C=O)—R$^9$— or —SO$_2$—R$^9$—.
Also, $R^8$ denotes a hydrogen atom, a halogen atom, a cyano group or an alkyl group, and
$R^9$ denotes an alkylene group, a cycloalkylene group or an arylene group.
$R^8$ and $R^9$ may be linked to each other through a linking group.

 Formula (2)

Here, Rf denotes an alkylene group with at least one fluorine atom substituted.

Specific examples of the partial structure (occasionally referred to as acid group or acid group structure hereinafter) represented by the formula (1) include the following structures.

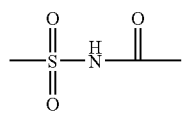 (1-a)

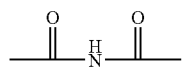 (1-b)

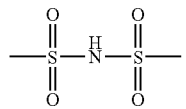 (1-c)

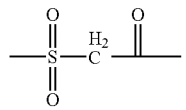 (1-d)

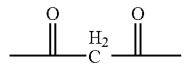 (1-e)

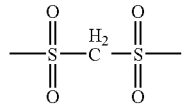 (1-f)

Examples of an acid group represented by the formula (2) include —C(CF$_3$)$_2$OH, —C(C$_2$F$_5$)$_2$OH, —C(CF$_3$)(CH$_3$)OH and —CH(CF$_3$)OH, and —C(CF$_3$)$_2$OH is preferable.

The amount of an acid group of the formulae (1) and (2) contained in the polymeric compound (A) may be properly adjusted in accordance with the kind of the dispersed pigment. The amount of a repeating unit containing an acid group is preferably 5 to 100% by mass, preferably 10 to 80% by mass and more preferably 20 to 60% by mass. Preferable acid value is 30 to 300 mgKOH/g, more preferably 50 to 200 mgKOH/g. An acid value of less than 30 mgKOH/g renders development incapable and causes development residue. An acid value of more than 300 mgKOH/g renders dispersion stability unfavorable and quickens the rate of alkaline development too much to obtain appropriate development latitude.

Acid value is determined by measuring the amount (mg) of potassium hydroxide necessary for neutralizing 1 g of the polymeric compound. The polymeric compound (A) having desired acid value may be obtained by adjusting the number of acid groups in a monomer, the molecular weight of a monomer and the composition ratio of a monomer to control the number of acidic groups in the polymeric compound.

The polymeric compound (A) is preferable for the reason that the formulae (1) and (2) may be introduced thereinto by polymerizing monomers specifically represented by the following formulae (G-I) to (G-III).

 (G-I)

 (G-II)

 (G-III)

In the formulae (G-I) to (G-III), $R^3$ denotes a hydrogen atom or a methyl group. $S^1$ denotes a linking group represented by the above-mentioned formulae (1-a) to (1-f). R denotes an alkyl group, a cycloalkyl group or an aryl group optionally having a substituent. Rf denotes an alkylene group with at least one fluorine atom substituted. $W^2$ denotes a single bond, a single linking group or a linking group composed of an optional combination, selected from atomic groups such as

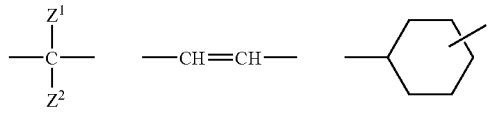

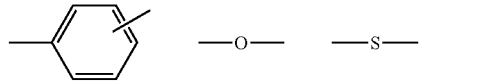

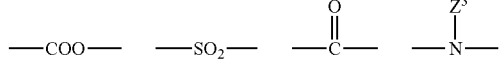

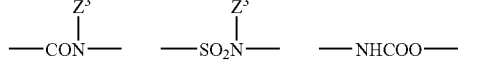

($Z^1$ and $Z^2$ denote a hydrogen atom, a halogen atom, an alkyl group having 1 to 6 carbon atoms, a cyano group and a hydroxyl group, and $Z^3$ denotes a hydrogen atom, an alkyl group having 1 to 18 carbon atoms and an aryl group having 6 to 20 carbon atoms.)

Further, the formulae (G-I) to (G-III) are preferably represented by the following formulae (G-IV) to (G-VII).

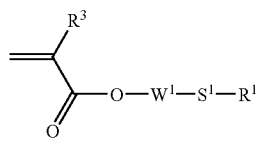
(G-IV)

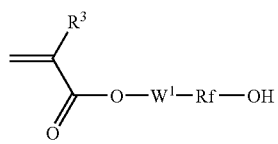
(G-V)

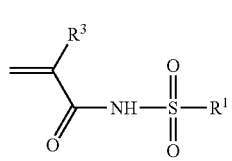
(G-VI)

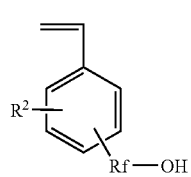
(G-VII)

(W$^1$ denotes a single linking group or a linking group composed of an optional combination, selected from alkylene, alkoxy and ester. S$^1$ denotes a linking group represented by the above-mentioned formulae (1-a) to (1-f). R$^1$ denotes an alkyl group, a cycloalkyl group or an aryl group optionally having a substituent. R$^2$ denotes a hydrogen atom, a halogen atom, an alkyl group having 1 to 6 carbon atoms, an alkoxy group and a cyano group. R$^3$ denotes a hydrogen atom or a methyl group. Rf denotes an alkylene group with at least one fluorine atom substituted.)

More specifically, the formula (G-IV) is preferably represented by the following formula.

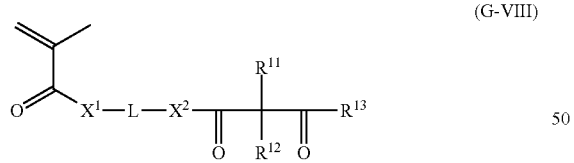
(G-VIII)

In the above-mentioned formula (G-VIII), R$^{11}$ and R$^{12}$ denote a hydrogen atom or an alkyl group having 1 to 4 carbon atoms, R$^{13}$ denotes an alkyl group having 1 to 6 carbon atoms, L denotes a linking group selected from alkylene having 2 to 6 carbon atoms, ether having 2 to 6 carbon atoms, ester having 2 to 6 carbon atoms, amide having 2 to 6 carbon atoms and urea having 2 to 6 carbon atoms, and X$^1$ and X$^2$ denote O or NR$^4$ each independently. Here, R$^4$ denotes a hydrogen atom or an alkyl group having 1 to 4 carbon atoms.

Specific examples of the formulae (G-III) to (G-VIII) are shown below. R$^3$ denotes a hydrogen atom or a methyl group.

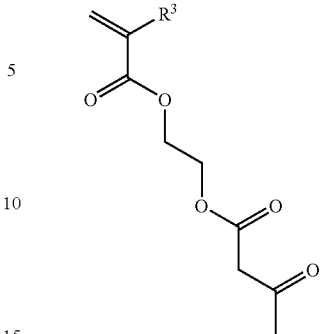
G-1

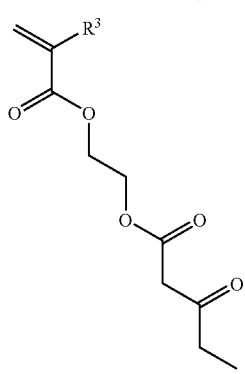
G-2

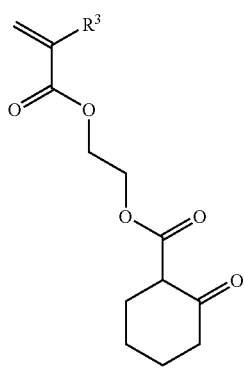
G-3

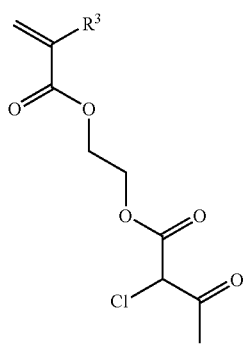
G-4

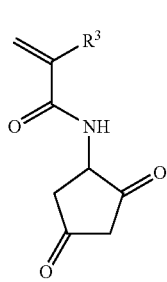
G-5

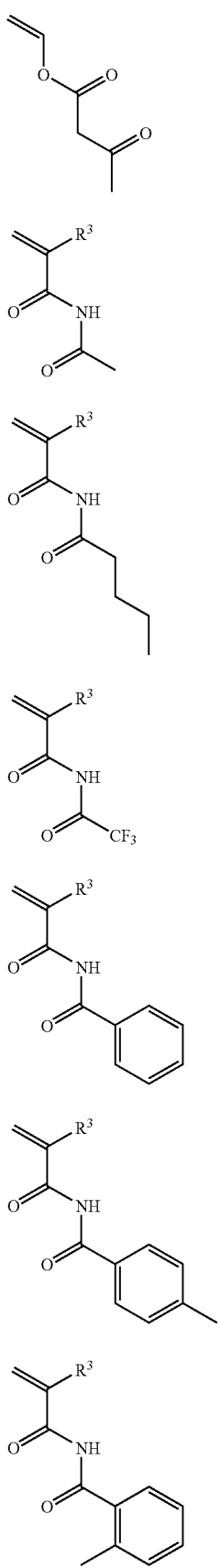
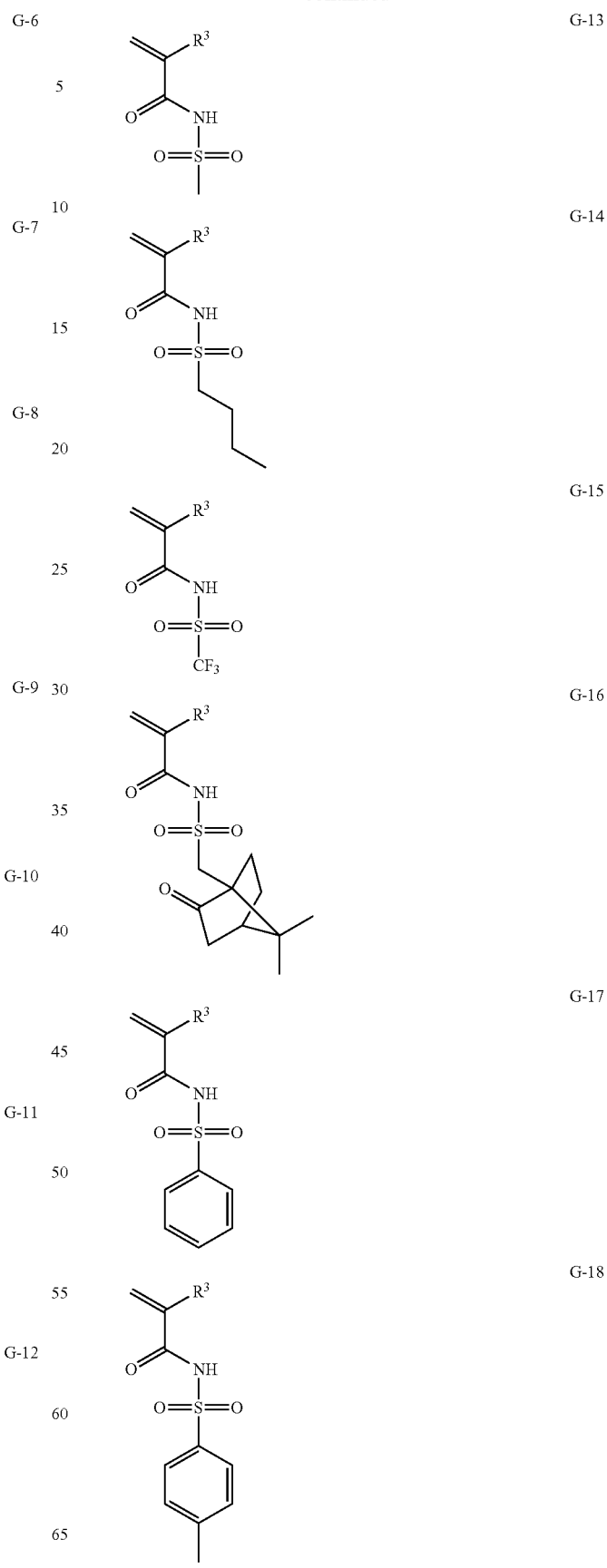

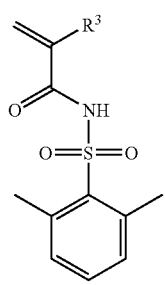
G-19
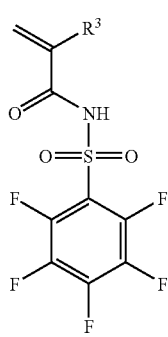
G-20
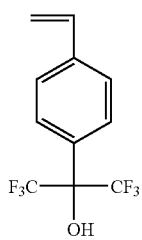
G-21
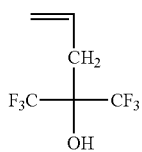
G-22
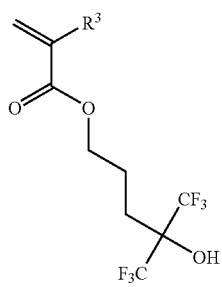
G-23
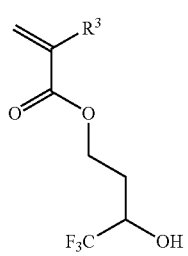
G-24
G-25
G-26
G-27
G-28
A polymeric compound (A) having a specific acid group of the invention may be also synthesized by polymerizing a monomer as described above or by reacting a polymeric compound as a precursor with a low-molecular weight compound having an acid group. A polymeric compound (A) having a specific acid group of the invention is more preferably at least one kind selected from a block polymer, a graft polymer and a terminal-modified polymer.

It is conceived that a polymeric compound (A) having a specific acid group of the invention is adsorbed on the surface of pigment in the dispersing process to act so as to prevent reaggregation. Thus, the polymeric compound (A) of the invention may be a straight-chain random copolymer, but yet examples of a preferable structure include a block polymer, a graft polymer and a terminal-modified polymer, which are more effective.

(Straight-Chain Random Copolymer)

A straight-chain random copolymer may be obtained by subjecting a monomer containing an acid group represented by the above-mentioned formulae (G-I) to (G-III) and another copolymerizable monomer to an optional polymerization method such as radical polymerization. Another copolymerizable monomer, which is described in detail in the section of a block polymer, may be optionally selected by one kind or more from monomers such as (i) a monomer having an organic coloring matter structure or a heterocyclic structure, (ii) a monomer having an acidic group, (iii) a monomer having a basic nitrogen atom, (iv) a monomer having an urea group, an urethane group, a hydrocarbon group having 4 or more carbon atoms, having a coordinating oxygen atom, an alkoxysilyl group, an epoxy group, an isocyanate group and a hydroxyl group, (v) a monomer containing an ionic functional group, (vi) (meth)acrylates, crotonates, vinyl esters, dimaleates, difumarates, diitaconates, (meth)acrylamides, styrenes, vinyl ethers, vinyl ketones, olefins, maleimides and (meth)acrylonitrile. One kind or more selected from the monomer groups (i) to (iii) is preferably contained.

The preferable weight-average molecular weight of the straight-chain random copolymer is not particularly limited and yet preferably in a range of 1,000 to 100,000, more preferably in a range of 3,000 to 50,000. A weight-average molecular weight of 1,000 or more allows the effect of stabilizing more effectively, while a weight-average molecular weight of 100,000 or less allows more effective adsorption to perform favorable dispersibility.

(Block Polymer)

A block polymer is not particularly limited and examples thereof include a block polymer composed of pigment adsorption block (a), block having an acid group (b) and block being not adsorbed in pigment (c). A monomer composing the pigment adsorption block (a) is not particularly limited and examples thereof include a monomer having a functional group capable of being adsorbed in pigment. Specific examples thereof include a monomer having an organic coloring matter structure or a heterocyclic structure, a monomer having an acidic group, and a monomer having a basic nitrogen atom.

Examples of monomers having an organic dye structure or a heterocyclic structure include: phthalocyanine-, insolubule azo-, azo lake-, anthraquinone-, quinacridone-, dioxazine-, diketopyrolopyrrole-, anthrapyridine-, anthanthrone-, indanthrone-, flavanthrone-, perinone-, perylene- and thioindigo-dye structures; and heterocyclic structure such as thiophene, furan, xanthene, pyrrole, pyrroline, pyrrolidine, dioxolane, pyrazole, pyrazoline, pyrazolidine, imidazole, oxazol, thiazole, oxadiazole, triazole, thiadiazole, pyran, pyridine, piperidine, dioxane, morpholine, pyridazine, pyrimidine, piperazine, triazine, trithiane, isoindoline, isoindolinone, benzimidazolone, benzothiazole, succinic imide, phthalimide, naphthalimide, hydantoin, indole, quinoline, carbazole, acridine, acridone, and anthraquinone.

Although there are no particularly limitations, more specific examples of such a monomer include the following structures.

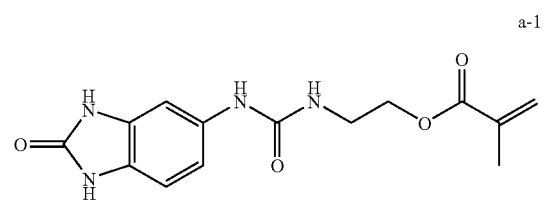

a-1

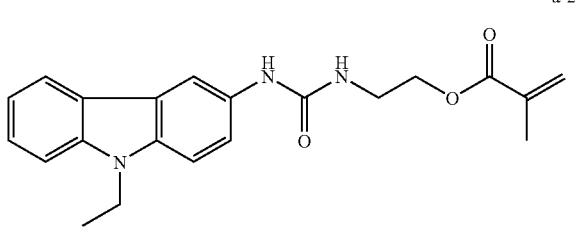

a-2

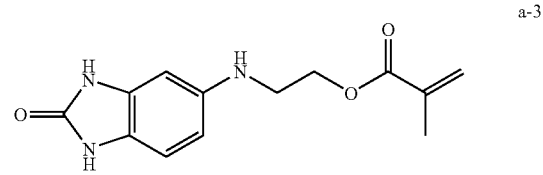

a-3

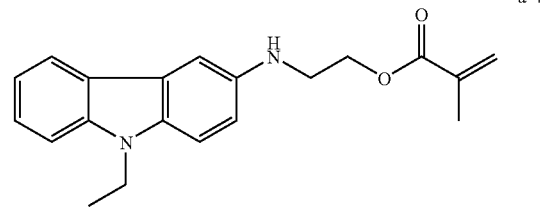

a-4

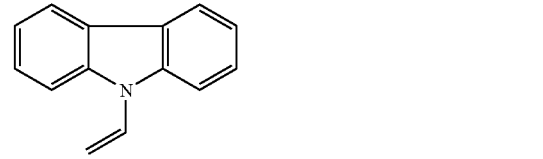

a-5

a-6

a-7

a-8

-continued
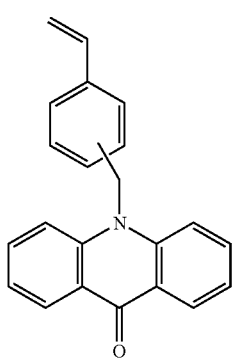
a-9
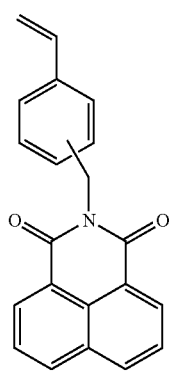
a-10
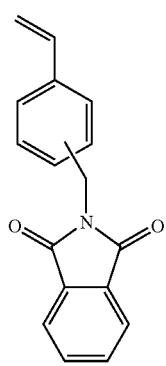
a-11
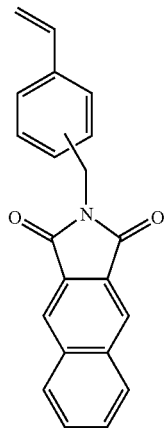
a-12
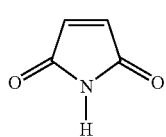
a-13
-continued
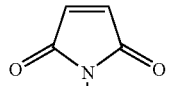
a-14
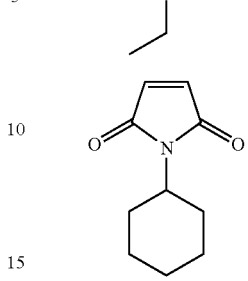
a-15
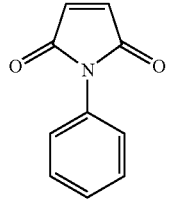
a-16
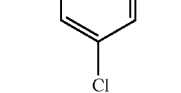
a-17
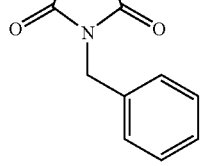
a-18
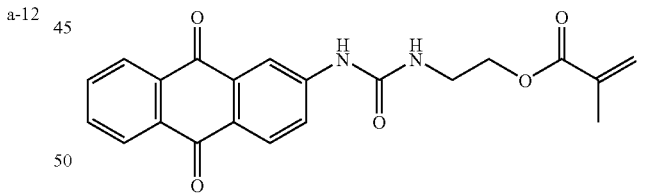
a-19
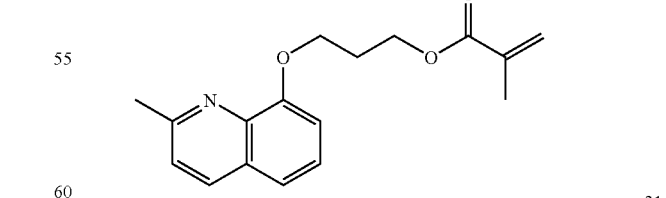
a-20
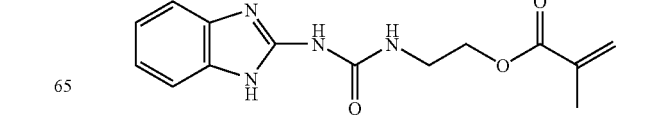
a-21

-continued a-22 a-23 a-24

Examples of monomers having an acidic group include a vinyl monomer having a carboxyl group, a vinyl monomer having a sulfonic acid group, and a vinyl monomer having a phosphoric acid group. Examples of vinyl monomers having a carboxyl group include (meth)acrylic acid, vinylbenzoic acid, maleic acid, maleic acid monoalkyl ester, fumaric acid, itaconic acid, crotonic acid, cinnamic acid, an acrylic acid dimer and the like.

Addition products of hydroxyl group containing monomers, such as 2-hydroxyethyl(meth)acrylate with cyclic anhydrides, such as maleic anhydride, phthalic anhydride, and cyclohexanedicarboxylic anhydride, may also be used, and (ω-carboxy-polycaprolactone mono(meth)acrylate and the like may also be used. Anhydride containing monomers, such as maleic anhydride, itaconic anhydride, and citraconic anhydride, may also be used as a precursor of a carboxyl group.

(Meth)acrylic acid is particularly preferable from the standpoints of ability to form a copolymer, cost, solubility, and the like.

Examples of vinyl monomers having a sulfonic acid group include 2-acrylamido-2-methylpropanesulfonic acid and the like, and examples of vinyl monomers having a phosphoric acid group include phosphate mono(2-acryloyloxyethyl ester) and phosphate mono(1-methyl-2-acryloyloxyethyl ester), and the like. The polymeric compound (A) includes the specific acid group of the invention independently to the acidic group of the above described monomers having an acidic group.

Examples of monomers having a basic nitrogen atom that can be used include: hetrocycle containing monomers, such as vinylpyridine, vinylimidazole, vinyltriazole and the like; and (meth)acrylate esters, such as N,N-dimethylaminoethyl (meth)acrylate, N,N-dimethylaminopropyl(meth)acrylate, 1-(N,N-dimethylamino)-1,1-dimethylmethyl(meth)acrylate, N,N-dimethylaminohexyl(meth)acrylate, N,N-diethylaminoethyl(meth)acrylate, N,N-diisopropyl-aminoethyl(meth) acrylate, N,N-di-n-butylaminoethyl(meth)acrylate, N,N-diisobutylaminoethyl(meth)acrylate, morpholinoethyl(meth) acrylate, piperidinoethyl(meth)acrylate, 1-pyrrolidinoethyl (meth)acrylate, N,N-methyl-2-pyrrolidylaminoethyl(meth) acrylate, N,N-methyl-phenylaminoethyl(meth)acrylate, and the like; (meth)acrylamides, such as N—(N',N'-dimethylaminoethyl)acrylamide, N—(N',N'-dimethylaminoethyl) methacrylamide, N—(N',N'-diethyl aminoethyl)acrylamide, N—(N',N'-diethyl aminoethyl)methacrylamide, N—(N',N'-dimethylaminopropyl)acrylamide, N—(N',N'-dimethylaminopropyl)methacrylamide, N—(N',N'-diethylaminopropyl) acrylamide, N—(N',N'-diethylaminopropyl) methacrylamide, 2-(N,N-dimethylamino)ethyl(meth) acrylamide, 2-(N,N-diethylamino)ethyl(meth)acrylamide, 3-(N,N-diethylamino)propyl(meth)acrylamide, 3-(N,N-dimethylamino)propyl(meth)acrylamide, 1-(N,N-dimethylamino)-1,1-dimethylmethyl(meth)acrylamide and 6-(N,N-diethylamino)hexyl(meth)acrylamide, morpholino(meth) acrylamide, piperidino(meth)acrylamide, N-methyl-2-pyrrolidyl(meth)acrylamide; styrenes, such as N,N-dimethylamino styrene and N,N-dimnethylamino methylstyrene; and the like.

A monomer having a hydrocarbon group with 4 or more carbon atoms containing a urea group, a urethane group, and an oxygen ligand, or a monomer containing an alkoxy silyl group, an epoxy group, an isocyanate group, or a hydroxyl group, can also be used.

Specific examples include monomers of the following structures.

a-25 a-26 a-27 a-28 a-29

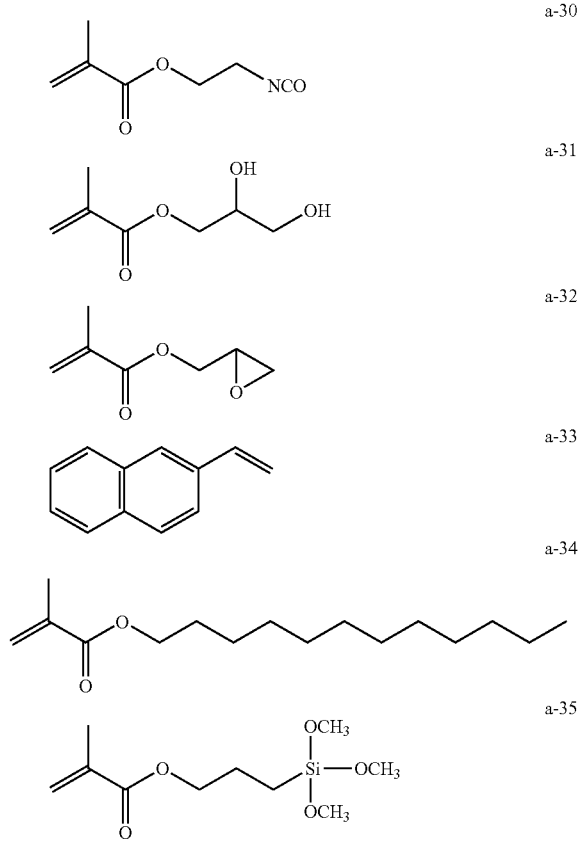

Monomers containing an ionic functional group can be used.

Examples of ionic vinyl monomers (anionic vinyl monomers and cationic vinyl monomers) include anionic vinyl monomers, such as alkali metal salts of the above vinyl monomers having acidic groups and salts of organic amines (for example, tertiary amines, such as triethylamine and dimethylamino ethanol), and cationic vinyl monomers, such as nitrogen-containing vinyl monomers quaternerized with: an alkyl halide (alkyl group: 1 to 18 carbon atoms, halogen atom: chlorine atom, bromine atom or iodine atom); a benzyl halide, such as benzyl chloride or benzyl bromide; an alkylsulfonate (alkyl group: 1 to 18 carbon atoms), such as methanesulfonate; an alkyl arylsulfonate (alkyl group: 1 to 18 carbon atoms), such as benzenesulfonate or toluenesulfonate; a dialkyl sulfate (alkyl group: 1 to 4 carbon atoms); or the like, and dialkyl diaryl ammonium salts and the like.

The above monomers having a functional group for adsorbing to the pigment may be selected appropriately according to the type of dispersed pigment, and may be used singly or in combinations of two or more thereof.

The monomer composing the block having an acid group (b) includes the monomers described above and preferably the monomers represented by above formulae (G-I) to (G-III). The above monomers having an acidic group may be selected appropriately according to the type of dispersed pigment, and may be used singly or in combinations of two or more thereof.

There are no particular limitations to the monomer configuring a non-pigment adsorbing block (c) and monomers that can be used include, for example: (meth)acrylate esters, crotonic acid esters, vinyl esters, maleic acid diesters, fumarate diester, itaconic acid diesters, (meth)acrylamides, styrenes, vinyl ethers, vinyl ketones, olefins, maleimides, (meth)acrylonitrile and the like. The monomers that configure a non-pigment adsorbing block may be used singly, or in combinations of two or more thereof.

Examples of (meth)acrylate esters include methyl(meth)acrylate, ethyl (meth)acrylate, n-propyl(meth)acrylate, isopropyl(meth)acrylate, n-butyl(meth)acrylate, isobutyl(meth)acrylate, t-butyl(meth)acrylate, amyl(meth)acrylate, n-hexyl (meth)acrylate, cyclohexyl(meth)acrylate, t-butylcyclohexyl (meth)acrylate, 2-ethylhexyl(meth)acrylate, t-octyl(meth)acrylate, dodecyl(meth)acrylate, octadecyl(meth)acrylate, acetoxyethyl(meth)acrylate, phenyl(meth)acrylate, 4-hydroxybutyl(meth)acrylate, 2-methoxyethyl(meth)acrylate, 2-ethoxyethyl(meth)acrylate, 2-(2-methoxyethoxy)ethyl (meth)acrylate, 2-chloroethyl(meth)acrylate, vinyl(meth)acrylate, 2-phenylvinyl(meth)acrylate, 1-propenyl(meth)acrylate, allyl(meth)acrylate, 2-allyloxyethyl(meth)acrylate, propargyl(meth)acrylate, benzyl(meth)acrylate, diethylene glycol monomethyl ether(meth)acrylate, diethylene glycol monoethyl ether(meth)acrylate, triethylene glycol monomethyl ether(meth)acrylate, triethylene glycol monoethyl ether(meth)acrylate, polyethylene glycol monomethyl ether (meth)acrylate, polyethylene glycol monoethyl ether(meth) acrylate, β-phenoxyethoxyethyl(meth)acrylate, nonylphenoxypolyethylene glycol(meth)acrylate, dicyclopentenyl (meth)acrylate, dicyclopentenyl oxyethyl(meth)acrylate, trifluoroethyl(meth)acrylate, octafluoro pentyl(meth)acrylate, perfluoro octylethyl(meth)acrylate, dicyclopentanyl (meth)acrylate, tribromophenyl(meth)acrylate, tribromophenyloxyethyl (meth)acrylate, γ-butyrolactone(meth)acrylate, and the like.

Examples of crotonic acid esters include butyl crotonate, hexyl crotonate, and the like. Examples of vinyl esters include vinyl acetate, vinylchloro acetate, vinyl propionate, vinyl butyrate, vinyl methoxy acetate, vinyl benzoate, and the like. Examples of maleic acid diesters include dimethyl maleate, diethyl maleate, dibutyl maleate, and the like. Examples of fumaric acid diesters include dimethyl fumarate, diethyl fumarate, dibutyl fumaric, and the like. Examples of itaconic acid diesters include dimethyl itaconate, diethyl itaconate, dibutyl itaconate, and the like.

Examples of (meth)acrylamides include (meth)acrylamide, N-methyl(meth)acrylamide, N-ethyl(meth)acrylamide, N-propyl(meth)acrylamide, N-isopropyl(meth)acrylamide, N-n-butyl acrylic(meth)amide, N-t-butyl(meth)acrylamide, N-cyclohexyl(meth)acrylamide, N-(2-methoxy ethyl)(meth) acrylamide, N,N-dimethyl(meth)acrylamide, N,N-diethyl (meth)acrylamide, N-phenyl(meth)acrylamide, N-nitrophenyl acrylamide, N-ethyl-N-phenylacrylamide, N-benzyl (meth)acrylamide, (meth)acryloyl morpholine, diacetone acrylamide, N-methylolacrylamide, N-hydroxyethylacrylamide, vinyl(meth)acrylamide, N,N-diaryl(meth)acrylamide, N-allyl(meth)acrylamide, and the like.

Examples of styrenes include styrene, methylstyrene, dimethylstyrene, trimethylstyrene, ethylstyrene, isopropylstyrene, butylstyrene, hydroxystyrene, methoxystyrene, butoxystyrene, acetoxystyrene, chlorostyrene, dichlorostyrene, bromnostyrene, chloromethylstyrene, protected hydroxystyrenes that can be deprotected using an acidic group (for example, t-Boc or the like), vinylbenzoic acid methyl ester and α-methylstyrene, and the like.

Examples of vinyl ethers include methyl vinyl ether, ethyl vinyl ether, 2-chloroethyl vinyl ether, hydroxyethyl vinyl ether, propylvinyl ether, butyl vinyl ether, hexyl vinyl ether, octyl vinyl ether, methoxyethyl vinyl ether, phenyl vinyl ether, and the like.

Examples of vinyl ketones include methyl vinyl ketone, ethyl vinyl ketone, propyl vinyl ketone, phenyl vinyl ketone, and the like. Examples of olefins include ethylene, propylene, isobutylene, butadiene, isoprene, and the like. Examples of maleimides include maleimide, butylmaleimide, cyclohexyl maleimide, phenyl maleimide, and the like. Examples of (meth)acrylonitriles include methacrylonitrile, acrylonitrile, and the like.

The block polymer compound in the present invention can be obtained by employing conventional methods. For example, living polymerization, the iniferter method, and the like are known. Besides these, another known method is, when carrying out radical polymerization of a monomer having a pigment adhering group or a monomer having no pigment adhering group, to perform alkali treatment with an alkali, such as sodium hydroxide or ammonia, to a polymer obtained from polymerization in the presence of a compound containing a thioester and a thiol group within its molecule, such as thiol carboxylic acid, 2-acetylthioethyl ether or 10-acetylthiodecanethiol, forming a polymer which has a thiol group at one end terminal. Further radical polymerization of the monomer component of another block is then carried out in the presence of the obtained polymer which has a thiol group at one end terminal. Among these methods living polymerization is preferred.

Although the weight average molecular weight of the block polymer compound is not particularly limited, a weight average molecular weight within the range of from 1,000 to 100,000 is preferable, and the range of from 5,000 to 50,000 is more preferable. The stabilization effect can be more effectively obtained at a weight average molecular weight of 1,000 or more, and more effective adhering and good dispersibility can be demonstrated when the weight average molecular weight is 100,000 or less.

(Graft Polymer)

A graft polymer prefers to contain an acid group of the invention in any of main chain, branch and both. With regard to a synthetic method of the graft polymer, as described in Shin Koubunshi Jikkengaku Vol. 2 (KYORITSU SHUPPAN CO., LTD., 1995), usable examples of a general method include a method for polymerizing a branched monomer from a main chain polymer, a method for bonding a branched polymer to a main chain polymer and a method for copolymerizing a main chain monomer with a branched polymer.

That is, the graft polymer usable in the invention is obtained by copolymerizing one kind or more of a monomer containing an acid group represented by the above-mentioned formulae (G-I) to (G-III) in any of main chain, branch and both with another copolymerizable monomer.

Another copolymerizable monomer may be optionally selected by one kind or more from the above-mentioned monomers such as (i) a monomer having an organic coloring matter structure or a heterocyclic structure, (ii) a monomer having an acidic group, (iii) a monomer having a basic nitrogen atom, (iv) a monomer having an urea group, an urethane group, a hydrocarbon group having 4 or more carbon atoms, having a coordinating oxygen atom, an alkoxysilyl group, an epoxy group, an isocyanate group and a hydroxyl group, (v) a monomer containing an ionic functional group, (vi) (meth)acrylates, crotonates, vinyl esters, dimaleates, difumarates, diitaconates, (meth)acrylamides, styrenes, vinyl ethers, vinyl ketones, olefins, maleimides and (meth)acrylonitrile.

Examples of a preferable form in the graft polymer of the invention include the following: a graft polymer having as copolymerizable components a monomer represented by the above-mentioned (i) to (iv), a monomer containing an acid group represented by the above-mentioned formulae (G-I) to (G-III), and a polymerizable oligomer (hereinafter referred to as a macromonomer); a graft polymer having as copolymerizable components a monomer represented by the above-mentioned (i) to (iv), and a polymerizable oligomer containing an acid group represented by the above-mentioned formulae (G-I) to (G-III) (hereinafter referred to as a macromonomer); and a graft polymer having as copolymerizable components a monomer represented by the above-mentioned (i) to (iv), a monomer containing an acid group represented by the above-mentioned formulae (G-I) to (G-III), and a polymerizable oligomer containing an acid group represented by the above-mentioned formulae (G-I) to (G-III) (hereinafter referred to as a macromonomer).

The weight-average molecular weight of the above-mentioned graft polymer is not particularly limited and yet preferably in a range of 1,000 to 100,000, more preferably in a range of 5,000 to 50,000. A weight-average molecular weight of 1,000 or more allows the effect of stabilizing more effectively, while a weight-average molecular weight of 100,000 or less allows more effective adsorption to perform favorable dispersibility. In particular, the weight-average molecular weight of the branch is preferably 300 to 30,000, more preferably 1,000 to 20,000. The molecular weight of the branch in the above-mentioned range brings particularly favorable developability and wide development latitude.

Next, the preferable structure of the macromonomer is represented by the following formulae (4), (5) and (6). Among these, the repeating unit represented by the formula (4) is the most preferable.

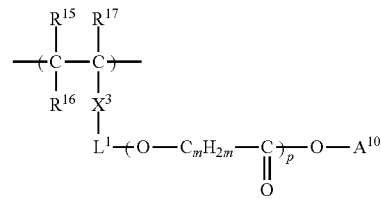

(4)

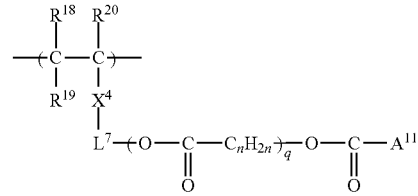

(5)

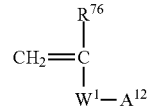

(6)

In the formulae (4) and (5), $R^{15}$ to $R^{20}$: a hydrogen atom, a monovalent organic group $X^3$, $X^4$: —CO—, —C(=O)O—, —CONH—, —OC(=O)—, a phenylene group $L^1$, $L^7$: a single bond, or an organic linking group $A^{10}$, $A^{11}$: a monovalent organic group m, n: an integer of 2 to 8 p, q: an integer of 1 to 100

$R^{15}$ to $R^{20}$ denote a hydrogen atom and a monovalent organic group. The monovalent organic group is preferably a substituted or unsubstituted alkyl group. The alkyl group is preferably an alkyl group having 1 to 12 carbon atoms, more preferably an alkyl group having 1 to 8 carbon atoms and particularly preferably an alkyl group having 1 to 4 carbon atoms.

In the case where the alkyl group has a substituent, examples of the substituent include a hydroxy group, an alkoxy group (preferably having 1 to 5 carbon atoms, more preferably having 1 to 3 carbon atoms), a methoxy group, an ethoxy group and a cyclohexyloxy group. Specific examples of the preferable alkyl group include a methyl group, an ethyl group, a propyl group, an n-butyl group, an isobutyl group, a tert-butyl group, an n-hexyl group, a cyclohexyl group, a 2-hydroxyethyl group, a 3-hydroxypropyl group, a 2-hydroxypropyl group and a 2-methoxyethyl group. It is the most preferable in view of adsorption efficiency on the pigment surface that $R^{15}$, $R^{16}$, $R^{18}$ and $R^{19}$ are hydrogen atoms, and $R^{17}$ and $R^{20}$ are hydrogen atoms or methyl groups.

$X^3$ and $X^4$ denote —CO—, —C(=O)O—, —CONH—, —OC(=O)— and a phenylene group. Among them, —C(=O)O—, —CONH— and a phenylene group are preferable from the viewpoint of adsorptivity in the pigment, and —C(=O)O— is the most preferable. $L^1$ and $L^7$ denote a single bond or an organic linking group. The linking group is preferably a substituted or unsubstituted alkylene group. The alkylene group is preferably an alkylene group having 1 to 12 carbon atoms, more preferably an alkylene group having 1 to 8 carbon atoms and particularly preferably an alkylene group having 1 to 4 carbon atoms.

The alkylene group is further preferably such as to be linked through a hetero atom (such as a oxygen atom, a nitrogen atom or a sulfur atom). Specific examples of the preferable alkylene group include a methylene group, an ethylene group, a propylene group, a trimethylene group and a tetramethylene group. In the case where the alkylene group has a substituent, examples of the substituent include a hydroxy group.

The linking group is preferably in view of adsorptivity in the pigment, such as to have a hetero atom selected from —C(=O)—, —OC(=O)— and —NHC(=O)—, or a partial structure containing the hetero atom in a terminal of the above-mentioned alkylene group, and to be linked through the hetero atom or the partial structure containing the hetero atom.

$A^{10}$ and $A^{11}$ denote a monovalent organic group. The monovalent organic group is preferably a substituted or unsubstituted alkyl group or a substituted or unsubstituted aryl group. Preferable examples of the alkyl group include a straight-chain, branched and cyclic alkyl group having 1 to 20 carbon atoms; specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group.

$A^{10}$ and $A^{11}$ are preferably a straight-chain alkyl group having 1 to 20 carbon atoms, a branched alkyl group having 3 to 20 carbon atoms and a cyclic alkyl group having 5 to 20 carbon atoms, more preferably a straight-chain alkyl group having 4 to 15 carbon atoms, a branched alkyl group having 4 to 15 carbon atoms and a cyclic alkyl group having 6 to 10 carbon atoms, and far more preferably a straight-chain alkyl group having 6 to 10 carbon atoms and a branched alkyl group having 6 to 12 carbon atoms, in view of dispersion stability and developability.

m and n denote an integer of 2 to 8. m and n are preferably 4 to 6, most preferably 5 in view of dispersion stability and developability. p and q denote an integer of 1 to 100. Different p and different q may be mixed by two kinds or more. p and q are preferably 5 to 60, more preferably 5 to 40 and far more preferably 5 to 20, in view of dispersion stability and developability. The repeating unit represented by the formula (4) is preferable in view of dispersion stability. The repeating unit represented by the formula (4-2) is more preferable.

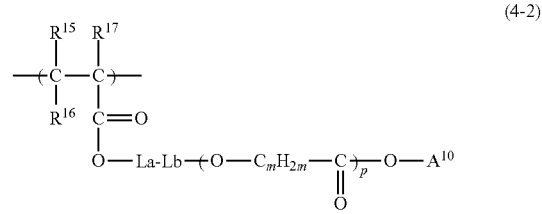

(4-2)

La denotes an alkylene group having 2 to 10 carbon atoms, and Lb denotes —C(=O)— and —NHC(=O)—. $R^{15}$ to $R^{17}$, m, p and $A^{10}$ signify the same as the formula (4).

The repeating units represented by the formulae (4), (5) and (4-2) are introduced as repeating units of a polymeric compound by polymerizing or copolymerizing monomers represented by the following formulae (i), (ii) and (i-2), respectively.

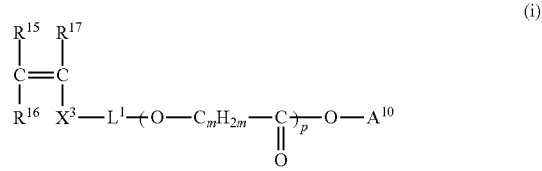

(i)

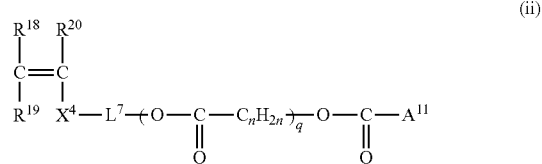

(ii)

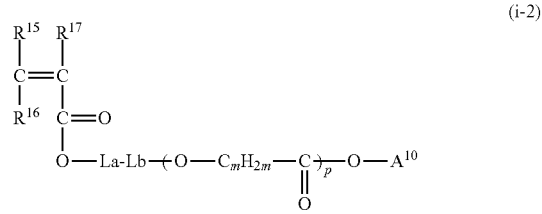

(i-2)

In the above-mentioned formulae, $R^{15}$ to $R^{20}$, m, n, p, q, $X^3$, $X^4$, $L^1$, $L^7$, $A^{10}$ and $A^{11}$ signify the same as the formulae (4) and (5). La and Lb signify the same as the formula (4-2).

A synthetic method thereof is such as to obtain by adding monocarboxylic acid or monoalcohol to ε-caprolactone to start ring opening polymerization. Preferable specific examples of monomers represented by the formulae (i), (ii) and (i-2) are described below but yet the invention is not limited thereto.

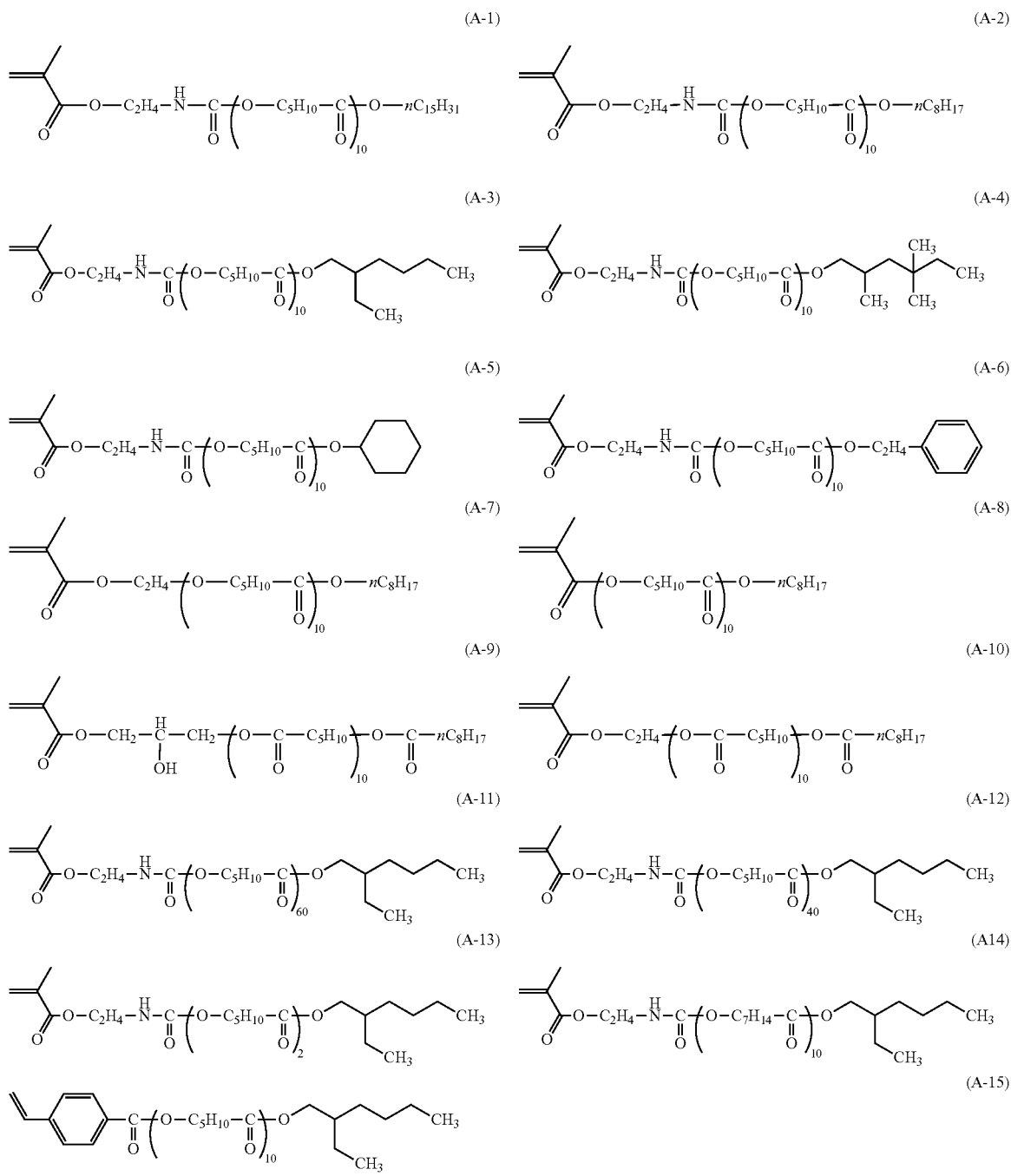

In the formula (6), $R^{76}$ denotes a hydrogen atom or an alkyl group having 1 to 8 carbon atoms, and $W^1$ denotes a single bond, a single linking group or a linking group composed of an optional combination of 2 or more thereof, selected from atomic groups represented by alkylene, alkenylene, cycloalkylene, phenylene, ether, thioether, ester, carbonyl, amino, amide, sulfonylamido and urethane. $A^{12}$ denotes a repeating unit composed of radical polymerizable monomers such as (meth)acrylate, (meth)acrylonitrile, styrene derivative and (meth)acrylamides. Specific examples of a macromonomer represented by the formula (6) include the following.

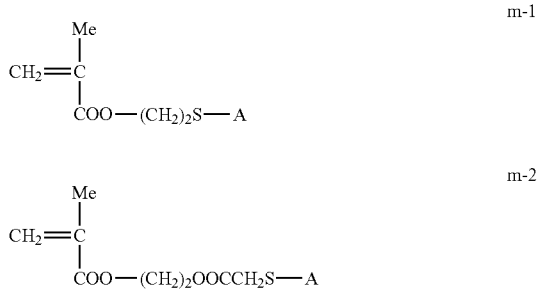

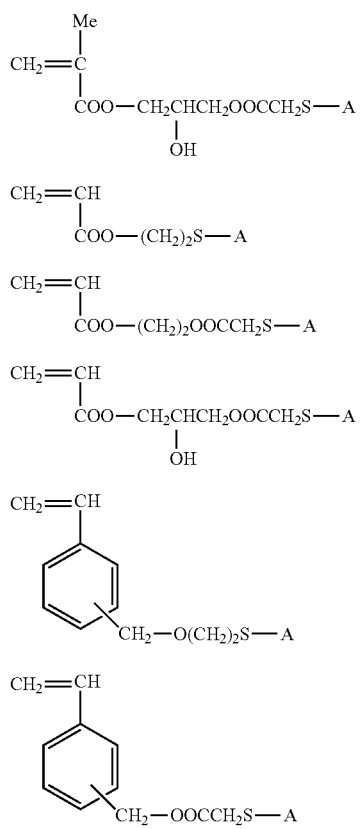

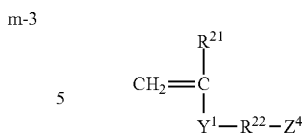

In the formula (7), $R^{21}$ denotes a hydrogen atom, or a substituted or unsubstituted alkyl group. $R^{22}$ denotes a single bond or a divalent linking group. $Y^1$ denotes —CO—, —C(=O)O—, —CONH—, —OC(=O)— or a phenylene group. $Z^4$ denotes a group having a nitrogen-containing heterocyclic structure. In the formula (7), $R^{21}$ denotes a hydrogen atom, or a substituted or unsubstituted alkyl group. The alkyl group is preferably an alkyl group having 1 to 12 carbon atoms, more preferably an alkyl group having 1 to 8 carbon atoms and particularly preferably an alkyl group having 1 to 4 carbon atoms. In the case where the alkyl group represented by $R^{21}$ has a substituent, examples of the substituent include a hydroxy group, an alkoxy group (preferably having 1 to 5 carbon atoms, more preferably having 1 to 3 carbon atoms), a methoxy group, an ethoxy group and a cyclohexyloxy group. Specific examples of the preferable alkyl group represented by $R^{21}$ include a methyl group, an ethyl group, a propyl group, an n-butyl group, an isobutyl group, a tert-butyl group, an n-hexyl group, a cyclohexyl group, a 2-hydroxyethyl group, a 3-hydroxypropyl group, a 2-hydroxypropyl group and a 2-methoxyethyl group. A hydrogen atom or a methyl group is the most preferable.

In the formula (7), $R^{22}$ denotes a single bond or a divalent linking group. The divalent linking group is preferably a substituted or unsubstituted alkylene group. The alkylene group is preferably an alkylene group having 1 to 12 carbon atoms, more preferably an alkylene group having 1 to 12 carbon atoms, far more preferably an alkylene group having 1 to 8 carbon atoms and particularly preferably an alkylene group having 1 to 4 carbon atoms. The alkylene group represented by $R^{22}$ may be such as to be linked by two or more through a hetero atom (such as a oxygen atom, a nitrogen atom or a sulfur atom). Specific examples of the preferable alkylene group represented by $R^{22}$ include a methylene group, an ethylene group, a propylene group, a trimethylene group and a tetramethylene group.

In the case where the preferable alkylene group represented by $R^{22}$ has a substituent, examples of the substituent include a hydroxy group. The divalent linking group represented by $R^{22}$ may be such as to have a hetero atom selected from —O—, —S—, —C(=O)O—, —CONH—, —C(=O)S—, —NHCONH—, —NHC(=O)O—, —NHC(=O)S—, —OC(=O)—, —OCONH— and —NHCO—, or a partial structure containing the hetero atom in a terminal of the above-mentioned alkylene group, and to be linked to $Z^4$ through the hetero atom or the partial structure containing the hetero atom.

In the formula (7), $Z^4$ denotes a group having a heterocyclic structure. Examples of a group having a heterocyclic structure include coloring matter structures of phthalocyanine, insoluble azo, azolake, anthraquinone, quinacridon, dioxazine, diketopyrrolopyrrole, anthrapyridine, anthanthrone, indanthrone, flavanthrone, perinone, perylene and thioindigo, and heterocyclic structures such as thiophene, furan, xanthene, pyrrole, pyrroline, pyrrolidine, dioxolane, pyrazole, pyrazoline, pyrazolidine, imidazole, oxazole, thiazole, oxadiazole, triazole, thiadiazole, pyran, pyridine, piperidine, dioxane, morpholine, pyridazine, pyrimidine, piperazine, triazine, trithiane, isoindolin, isoindolinone, The weight-average molecular weight of the above-mentioned graft polymer is not particularly limited if it is 1,000 or more, and yet preferably in a range of 3,000 to 100,000, more preferably in a range of 5,000 to 50,000 and far more preferably in a range of 10,000 to 30,000. A weight-average molecular weight of 1,000 or more allows the effect of stabilizing more effectively, while a weight-average molecular weight of 100,000 or less allows more effective adsorption to perform favorable dispersibility. In particular, the weight-average molecular weight of the branch is preferably 300 to 10,000, more preferably 500 to 5,000 and far more preferably 1,000 to 3,000. The molecular weight of the branch in the above-mentioned range brings particularly favorable developability and wide development latitude.

The graft polymer may contain a repeating unit composed of a macromonomer by only one kind or two kinds or more. In the graft polymer, the content of a repeating unit composed of a macromonomer is not particularly limited; preferably 5% by mass or more, more preferably 40 to 90% by mass and far more preferably 50 to 80% by mass in the case where the total structural units contained in the polymer is 100% by mass.

The graft polymer particularly preferably has (i) a monomer having an organic coloring matter structure or a heterocyclic structure from the viewpoint of adsorptive power in the pigment.

(i) A monomer having an organic coloring matter structure or a heterocyclic structure is preferably a monomer represented by the following formula (7), maleimide or maleimide derivative, particularly preferably a monomer represented by the following formula (7).

benzimidazolone, benzothiazole, succinimide, phthalimide, naphthalimide, hydantoin, indole, quinoline, carbazole, acridine, acridone, anthraquinone, pyrazine, tetrazole, phenothiazine, phenoxazine, benzimidazole, benztriazole, cyclic amide, cyclic urea and cyclic imide. These heterocyclic structures may have a substituent, and examples of the substituent include an alkyl group, an alkoxy group, a halogen atom, an aliphatic ester group, an aromatic ester group and an alkoxycarbonyl group.

$Z^4$ is more preferably a group having a nitrogen-containing heterocyclic structure having 6 or more carbon atoms, particularly preferably a group having a nitrogen-containing heterocyclic structure having 6 to 12 carbon atoms. Specifically, a nitrogen-containing heterocyclic structure having 6 or more carbon atoms is preferably a phenothiazine ring, a phenoxazine ring, an acridone ring, an anthraquinone ring, a benzimidazole structure, a benztriazole structure, a benzthiazole structure, a cyclic amide structure, a cyclic urea structure and a cyclic imide structure, particularly preferably a structure represented by the following formulae (8), (9) or (10).

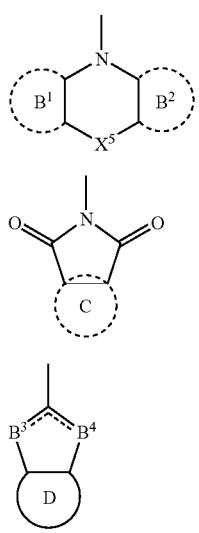

In the formula (8), $X^5$ denotes any selected from the group consisting of a single bond, an alkylene group (such as a methylene group, an ethylene group, a propylene group, a trimethylene group and a tetramethylene group), —O—, —S—, —NR$^A$— and —C(=O)—. Here, R$^A$ denotes a hydrogen atom or an alkyl group. The alkyl group in the case where R$^A$ denotes an alkyl group is preferably an alkyl group having 1 to 18 carbon atoms, more preferably an alkyl group having 1 to 6 carbon atoms; examples thereof include a methyl group, an ethyl group, an n-propyl group, an isopropyl group, an n-butyl group, a tert-butyl group, an n-hexyl group, an n-octyl group, a 2-ethylhexyl group and an n-octadecyl group. Among the above, $X^5$ in the formula (8) is preferably a single bond, a methylene group, —O— or —C(=O)—, particularly preferably —C(=O)—.

In the formula (10), $B^3$ and $B^4$ denote —N=, —NH—, —N(R$^B$)—, —S— or —O— each independently. R$^B$ denotes an alkyl group, and the alkyl group in the case where R$^B$ denotes an alkyl group is preferably an alkyl group having 1 to 18 carbon atoms, more preferably an alkyl group having 1 to 6 carbon atoms; examples thereof include a methyl group, an ethyl group, an n-propyl group, an isopropyl group, an n-butyl group, a tert-butyl group, an n-hexyl group, an n-octyl group, a 2-ethylhexyl group and an octadecyl group. Among the above, $B^3$ and $B^4$ in the formula (10) are particularly preferably —N=, —NH— and —N(R$^B$)—. Examples of a combination of $B^3$ and $B^4$ include an imidazolyl group as a combination such that one of $B^3$ and $B^4$ is —N= and the other is —NH—.

In the formulae (8), (9) or (10), ring $B^1$, ring $B^2$, ring C and ring D denote an aromatic ring each independently. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring and an anthraquinone ring; among them, preferably a benzene ring, a naphthalene ring, an anthracene ring, a pyridine ring, a phenoxazine ring, an acridine ring, a phenothiazine ring, a phenoxazine ring, an acridone ring and an anthraquinone ring, particularly preferably a benzene ring, a naphthalene ring and a pyridine ring.

Specific examples of ring $B^1$ and ring $B^2$ in the formula (8) include a benzene ring, a naphthalene ring, a pyridine ring and a pyrazine ring. Examples of ring C in the formula (9) include a benzene ring, a naphthalene ring, a pyridine ring and a pyrazine ring. Examples of ring D in the formula (10) include a benzene ring, a naphthalene ring, a pyridine ring and a pyrazine ring. Among structures represented by the formulae (8), (9) or (10), a benzene ring and a naphthalene ring are more preferable in view of dispersibility and temporal stability of fluid dispersion; in the formulae (8) or (10), a benzene ring is far more preferable, and in the formula (9), a naphthalene ring is far more preferable.

In a polymeric compound in the invention, preferable specific examples of a monomer represented by the above formula (7), maleimide and maleimide derivative are described below, but yet the invention is not limited thereto.

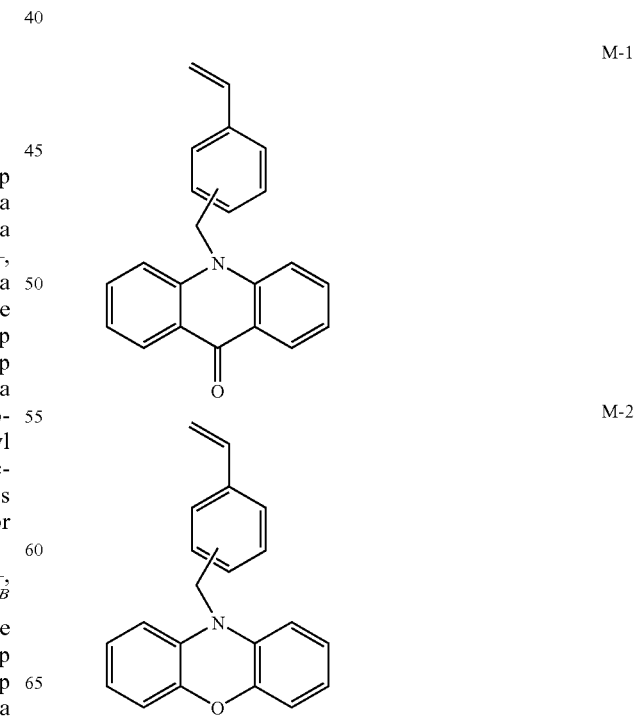

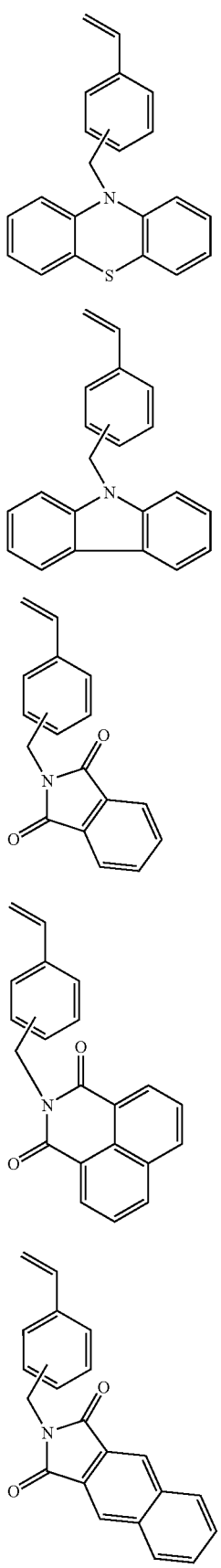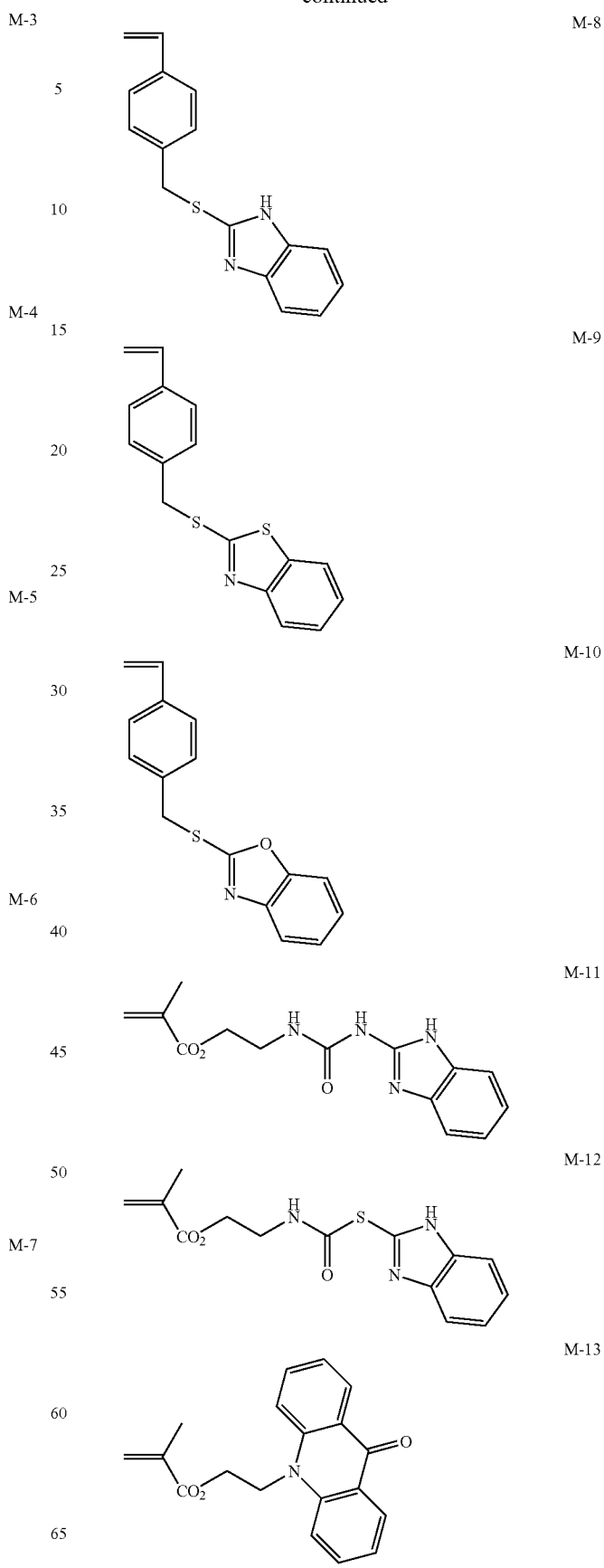

M-14
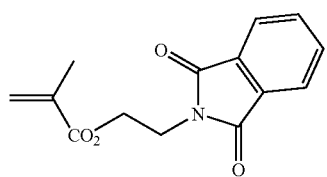
M-15
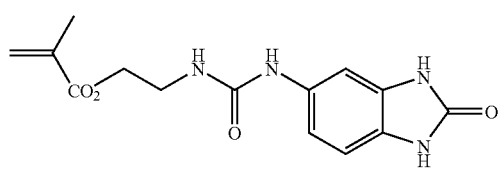
M-16
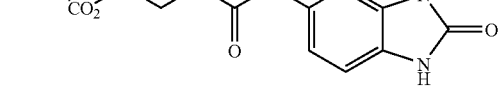
M-17
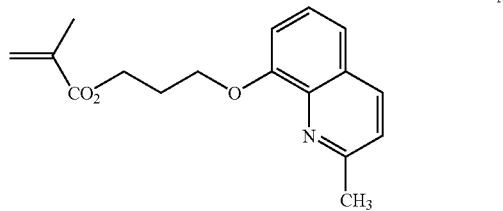
M-18
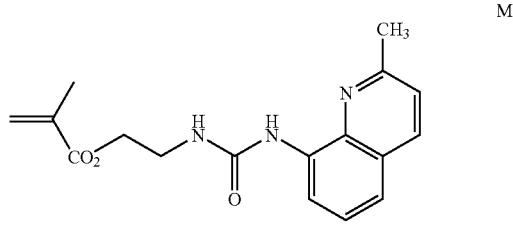
M-19
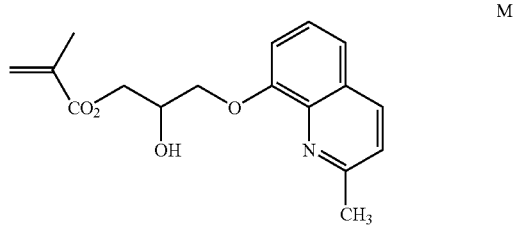
M-20
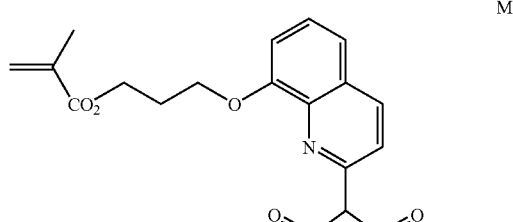
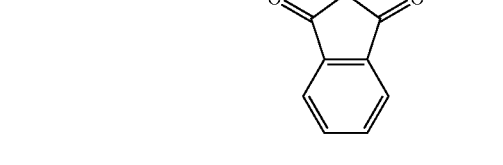
M-21
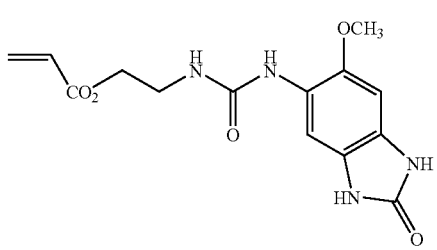
M-22
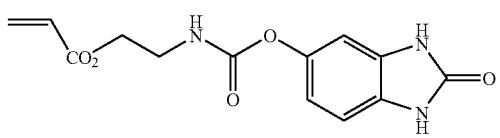
M-23
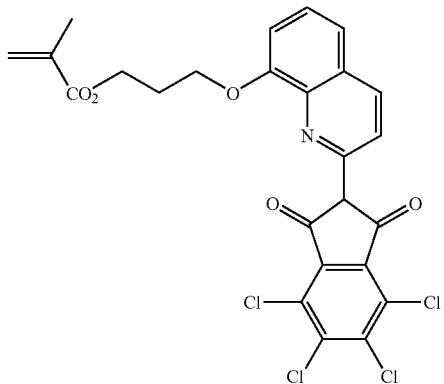
M-24
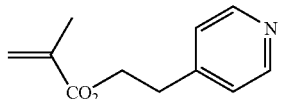
M-25
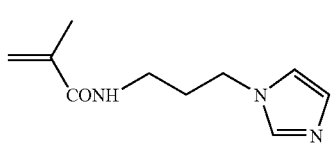
M-26
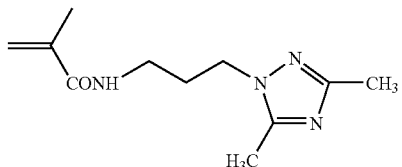
M-27
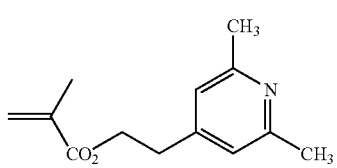
M-28
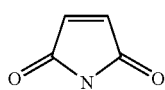
M-29
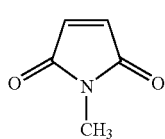

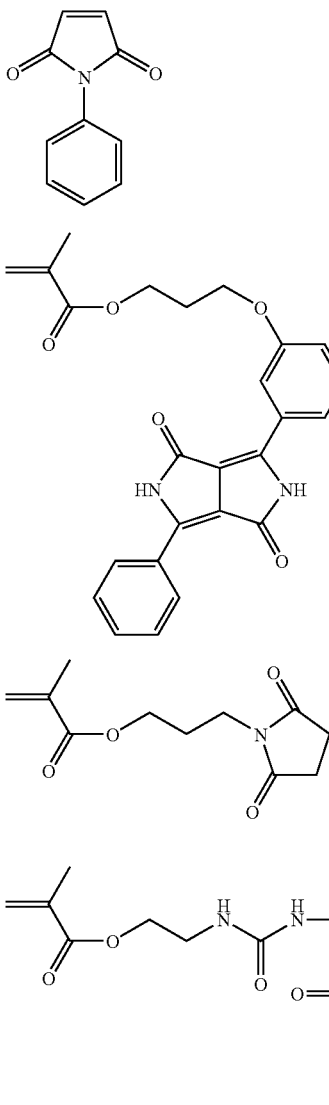

M-30

M-31

M-32

M-33

The polymeric compound (A) of the invention may contain a copolymerization unit derived from a monomer represented by the formula (7), maleimide and maleimide derivative by only one kind or two kinds or more. In the polymeric compound (A), the content of a copolymerization unit derived from a monomer represented by the formula (7), maleimide and maleimide derivative is not particularly limited; preferably 5% by mass or more, more preferably 10 to 50% by mass in the case where the total structural units contained in the polymer is 100% by mass.

Among a monomer represented by the formula (7), maleimide and maleimide derivative, a monomer represented by the formula (7) is preferable in view of high adsorptivity in the pigment. That is, in order to effectively restrain production of secondary aggregate as aggregate of primary particles of the pigment, or effectively weaken cohesive force of secondary aggregate, the content of a copolymerization unit derived from a monomer represented by the formula (7), maleimide and maleimide derivative is preferably 5% by mass or more. The content of a copolymerization unit derived from a monomer represented by the formula (7) is preferably 30% by mass or less from the viewpoint of developability in producing a color filter by a photocurable composition containing a pigment dispersion composition.

The polymeric compound (A) may be produced by an ordinary radical polymerization method with the use of a monomer represented by the formula (i), a polymerizable oligomer (a macromonomer) and another radical polymerizable compound as a copolymerization component, for example. A suspension polymerization method and a solution polymerization method are generally used. Examples of solvent used for synthesizing such a specific polymer include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethyl sulfoxide, toluene, ethyl acetate, methyl lactate and ethyl lactate. These solvents may be mixed singly or by two kinds or more. In the radical polymerization, a radical polymerization initiator may be used and a chain transfer agent (for example, 2-mercaptoethanol and dodecyl mercaptan) may be further used.

(Terminal-Modified Polymer)

A terminal-modified polymer is a polymer such that the main chain contains a repeating unit having an acid group of the invention and the terminal has pigment and a functional group with high affinity. That is, the above-mentioned straight-chain random copolymer may be directly used for the main chain. With regard to a monomer used for copolymerization, for example, the above-mentioned "a monomer having an acid group (b)" and "a monomer composing a block being not adsorbed in pigment (c)" may be used as a radical polymerizable monomer. The terminal-modified polymer usable in the invention is a polymer obtained by performing modification described below at the terminal of this straight-chain random copolymer.

There are no particular limitations to the method used for synthesis of a polymer compound having a functional group at the terminal of the polymer, however, examples thereof include the following methods.

1. A synthesis method of polymerization using an initiator for the functional group contained (for example, radical polymerization, anionic polymerization, cationic polymerization, and the like).
2. A synthesis method of radical polymerization using a chain transfer agent for the functional group contained. Examples of the functional group introduced here include a group selected from an organic dye structure, a heterocyclic structure, an acidic group, a group having a basic nitrogen atom, a urea group, a urethane group, the group that has an oxygen ligand, a hydrocarbon group with 4 or more carbon atoms, an alkoxy silyl group, an epoxy group, an isocyanate group, a hydroxyl group, an ionic functional group and the like.

Examples of the chain transfer agent able to introduce a functional group at the polymer terminus include mercapto compounds (such as, for example, thioglycolic acid, thiomalic acid, thiosalicylic acid, 2-mercaptopropionic acid, 3-mercaptopropionic acid, 3-mercaptobutyric acid, N-(2-mercaptopropyonyl)glycine, 2-mercaptonicotinic acid, 3-[N-(2-mercaptoethyl)carbamoyl]propionic acid, 3-[N-(2-mercaptoethyl)amino]propionic acid, N-(3-mercaptopropionyl)alanine, 2-mercaptoethanesulfonic acid, 3-mercaptopropanesulfonic acid, 4-mercaptobutanesulfonic acid, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole, 2-mercapto- 3-pyridinol, benzenethiol, toluenethiol, mercaptoacetophenone, naphthalenthiol, and naphthalenemethanethiol), disulfide compounds which are the oxidized compounds of the foregoing mercapto compounds, and halogenated compounds (such as, for example, 2-iodoethanesulfonic acid, and 3-iodopropanesulfonic acid).

Examples of the polymerization initiator (polymerization initiator of the functional group contained) used in synthesizing method 1 to introduce a functional group at the polymer terminus include 2,2'-azobis(2-cyanopropanol), 2,2'-azobis(2-cyanopentanol), 4,4'-azobis(4-cyanovaleric acid), 4,4'-azobis(4-cyanovaleric acid chloride), 2,2'-azobis[2-(5-methyl-2-imidazoline-2-yl)propane], 2,2'-azobis[2-(2-imidazoline-2-yl)propane], 2,2'-azobis[2-(3,4,5,6-tetrahydropyrimidine-2-yl)propane], 2,2'-azobis{2-[1-(2-hydroxyethyl)-2-imidazoline 2-yl]propane}, 2,2'-azobis[2-methyl-N-(2-hydroxyethyl)-propionamide], and the like, and derivatives thereof.

The molecular weight of the terminal modified polymer compound is preferably a weight average molecular weight of 1,000 to 50,000. The steric repulsion effect as a pigment dispersant can be more effectively obtained when the number average molecular weight is 1,000 or more, and when the number average molecular weight 50,000 or less the steric effect is more effectively suppressed and the duration of adhesion to a pigment can be shortened further.

The amount of the polymeric compound (A) is preferably so as to become 0.5 mass % to 100 mass % with respect to the pigment, 3 mass % to 100 mass % is more preferable, and 5 mass % to 80 mass % is particularly preferable. When these polymeric compounds are used as pigment dispersant within the above described ranges, sufficient pigment dispersion effect can be obtained. However, the optimal amount of addition of the dispersant is suitably adjusted according to the combination used of the pigment, the kind of solvent and the like.

Pigment (B)

A pigment dispersion composition of the invention has at least one kind of pigment (B) in organic solvent. Conventionally known various inorganic pigments or organic pigments may be properly selected and used as the pigment. With regard to the particle size of the pigment, considering that a color filter for which a pigment dispersion composition of the invention is appropriately used is preferably high in transmittance, organic pigments are preferable and organic pigments having as small particle size as possible are preferably used. Also considering handling ability of a pigment dispersion composition and a photocurable composition containing this, the average primary particle diameter of the pigment is preferably 10 nm or more and 100 nm or less, more preferably 30 nm or less. The particle diameter in the above-mentioned range brings high transmittance and favorable color characteristics, and is effective in forming a color filter having high contrast. The average primary particle diameter is obtained by observing with SEM or TEM and measuring the size of 100 particles in the portion with the particles not aggregated to calculate the average value.

Examples of the organic pigment may include:

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279;

C. I. Pigment Yellows 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214;

C. I. Pigment Orange 2, 5, 13, 16, 17:1, 31, 34, 36, 38, 43, 46, 48, 49, 51, 52, 55, 59, 60, 61, 62, 64, 71, 73;

C. I. Pigment Green 7, 10, 36, 37;

C. I. Pigment Blue 1, 2, 15, 15:1, 15:2, 15:3, 15:4, 15:6, 16, 22, 60, 64, 66, 79, a substituted one of Pigment Green 79 with hydroxyl group instead of chloro-group, 80;

C. I. Pigment Violet 1, 19, 23, 27, 32, 37, 42;

C. I. Pigment Brown 25, 28;

C. I. Pigment Black 1, 7.

Among above, preferable examples of the organic pigment in the exemplary embodiments of the present invention may include:

C. I. Pigment yellows 11, 24, 108, 109, 110, 138, 139, 150, 151, 154, 167, 180, 185;

C. I. Pigment Orange 36, 71;

C. I. Pigment Reds 122, 150, 171, 175, 177, 209, 224, 242, 254, 255, 264;

C. I. Pigment Violet 19, 23, 32;

C. I. Pigment Blues 15:1, 15:3, 15:6, 16, 22, 60, 66;

C. I. Pigment Green 7, 36, 37;

C. I. Pigment Black 1, 7.

In the invention, minute and granulated organic pigment may be used as required.

The micronization of the pigment is the process for triturating as a high-viscosity liquid composition with the pigment, water-soluble organic solvent and water-soluble inorganic salts.

A polymeric compound for covering the pigment and a polymeric compound (A) of the invention may be added as required in this process. The polymeric compound for covering the pigment optionally added is preferably solid at room temperature and insoluble in water, and needs to be at least partially soluble in water-soluble organic solvent used for a wetting agent during salt milling; natural resin, modified natural resin, synthetic resin or synthetic resin modified by natural resin are used therefor. In the case of using dried treated pigment, a used compound is preferably solid at room temperature.

Typical examples of natural resin include rosin, and examples of modified natural resin include a rosin derivative, a cellulose derivative, a rubber derivative, a protein derivative and an oligomer thereof. Examples of synthetic resin include epoxy resin, acrylic resin, maleic resin, butyral resin, polyester resin, melamine resin, phenolic resin and polyurethane resin. Examples of synthetic resin modified by natural resin include rosin-modified maleic resin and rosin-modified phenolic resin. Examples of synthetic resin include polyamideamine and salt thereof, polycarboxylic acid and salt thereof, high-molecular weight unsaturated acid ester, polyurethane, polyester, poly(meth)acrylate, (meth)acrylic copolymer and naphthalenesulfonic acid formalin condensate. With regard to the timing for adding these resins, all may be added or divisions may be added at the beginning of the salt milling process.

Examples of water-soluble organic solvent include methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol and propylene glycol monomethyl ether acetate. However, if the use in small amounts is adsorbed in the pigment without being washed away in waste water, the following may be used: benzene, toluene, xylene, ethyl benzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methylcyclohexane, halogenated hydrocarbon, acetone, methyl ethyl ketone, methyl isobutyl ketone, cyclohexanone, dimethylformamide, dimethyl sulfoxide and N-methylpyrrolidone; also, the solvents of two kinds or more may be used by mixture as required.

Examples of water-soluble inorganic salt in the invention include sodium chloride, potassium chloride, calcium chloride, barium chloride and sodium sulfate.

The used amount of water-soluble inorganic salt is 1 to 50 times by mass the amount of the pigment, and more amounts bring more effect of triturating but yet more preferable amount is 1 to 10 times by mass in view of productivity, and moisture is far more preferably 1% or less.

The used amount of water-soluble organic solvent is a range of 50 to 300% by mass with respect to the pigment, preferably a range of 100 to 200% by mass. A used amount of less than 50% by mass renders uniform kneading difficult to bring a possibility of rendering particle size uneven. A used amount of more than 300% by mass causes the kneaded composition to be weakened too much and does not allow the sufficient effect of micronizing for the reason that shear is applied to the kneaded composition with difficulty. The operating conditions of a wet milling device in the invention are not particularly limited and yet in order to effectively progress trituration by milling media, with regard to the operating conditions in the case where the device is a kneader, the number of revolutions of a blade in the device is preferably 10 to 200 rpm and it is preferable that relatively higher rotation speed ratio of the double spindle brings more effect of triturating. The operating time is preferably 1 to 8 hours together with dry milling time, and the internal temperature of the device is preferably 50 to 150° C. With regard to water-soluble inorganic salt as milling media, it is preferable that the granularity is 5 to 50 µm, the distribution of particle diameter is sharp and the shape is spherical. The mixture after being triturated is dissolved in warm water with water-soluble organic solvent and water-soluble inorganic salts, and then filtered, washed in water and dried by an oven to be capable of obtaining minute pigment.

These organic pigments may be used alone or, to raise the color purity, may be used in combinations of two or more thereof. Specific examples of such combinations are described below. For example, red pigments that can be used as a single pigment include an anthraquinone pigment, a perylene pigment, and a diketopyrrolopyrrole pigment, and one or more of these pigments may be used in combination with a disazo yellow pigment, an isoindoline yellow pigment, a quinophthaline yellow pigment, or a perylene red pigment, an anthraquinone red pigment, and/or a diketopyrrolopyrrole pigment. For example, the anthraquinone pigment may be C. I. Pigment Red 177, the perylene pigment may be C. I. Pigment Red 155 or C. I. Pigment Red 224, and the diketopyrrolopyrrole pigment may be C. I. Pigment Red 254. From the viewpoint of color reproducibility, a combination thereof with C. I. Pigment Yellow 83, C. I. Pigment Yellow 139 or C. I. Pigment Red 177 is preferable. The ratio by mass of the red pigment to the yellow pigment is preferably from 100:5 to 100:80. When the ratio is 100:4 or below, it is difficult to suppress transmittance of light from 400 nm to 500 nm, and sometimes the color purity cannot be raised. Furthermore, if the ratio is 100:81 or above, then sometimes the color strength falls. In particular, the above mass ratio is optimally in the range of 100:10 to 100:65. When a combination of red pigments is used adjustments may be made according to the chromaticity thereof.

Examples of a green pigment that can be used include a halogenated phthalocyanine pigment used alone, and a halogenated phthalocyanine pigment used in combination with a disazo yellow pigment, a quinophthalone yellow pigment, an azomethine yellow pigment and/or an isoindoline yellow pigment. Such examples include a mixture of C. I. Pigment Green 7, 36 or 37 with C. I. Pigment Yellow 83, 138, 139, 150, 180 or 185. The ratio by mass of green pigment to yellow pigment is preferably from 100:5 to 100:200. When the ratio is less than 100:5, it becomes difficult to suppress transmittance of light from 400 nm to 450 nm, and sometimes the color purity cannot be raised. Furthermore, if the ratio exceeds 100:200, the main wave length is biased to the long wavelength side, and sometimes there is a large difference to the target NTSC hue. The range of 100:20 to 100:150 is particularly preferable for the above mass ratio.

Examples of a blue pigment include a phthalocyanine pigment used alone, or a phthalocyanine pigment used in combination with a dioxazine violet pigment.

A preferable example is a combination of C. I. Pigment Blue 15:6 with C. I. Pigment Violet 23. The ratio by mass of the blue pigment to the violet pigment is preferably from 100:0 to 100:100, and 100:70 or below is more preferable.

Suitable pigments for use in a black matrix include carbon black, graphite, titanium black, iron oxide, or titanium oxide, either used singly or in combinations thereof, and a combination of carbon black and titanium black is preferable.

The mass ratio of carbon black to titanium black is preferably in the range of 100:0 to 100:60. When the mass ratio is greater than 100:61 the dispersion stability may be reduced.

Pigment Derivative (C)

A pigment derivative (C) is added to a pigment dispersion composition of the invention as required. The pigment derivative into which a portion having affinity with the dispersant or a polar group is introduced is adsorbed in the pigment surface and used as an adsorption site of the dispersant, so that the pigment is dispersed as minute particles into a photocurable composition and may be prevented from reaggregating, thereby being effective in composing a color filter having high contrast and excellent transparency.

The pigment derivative is specifically a compound such that organic pigment is used as the parent skeleton, and an acidic group, a basic group and an aromatic group are introduced as a substituent into the side chain. Specific examples of the organic pigment include quinacridon pigment, phthalocyanine pigment, azo pigment, quinophthalone pigment, isoindolin pigment, isoindolinone pigment, quinoline pigment, diketopyrrolopyrrole pigment and benzimidazolone pigment. Generally, light-yellow aromatic polycyclic compounds such as naphthalene, anthraquinone, triazine and quinoline, which are not called coloring matter, are also contained therein. The following may be used as a coloring matter derivative, such as are described in JP-A Nos. 11-49974, 11-189732, 10-245501, 2006-265528, 8-295810, 11-199796, 2005-234478, 2003-240938 and 2001-356210.

The content of the pigment derivative according to the invention in a pigment dispersion composition is preferably 1 to 30% by mass, more preferably 3 to 20% by mass with respect to the mass of the pigment. The content within the above-mentioned range allows dispersion to be favorably performed while controlling viscosity low and allows dispersion stability after the dispersion to be improved, and then high transmittance and excellent color characteristics are obtained, so that high contrast having favorable color characteristics may be composed in producing a color filter. With regard to the timing for adding the pigment derivative, it may be added during salt milling or dispersion.

A polymeric compound (A) having an acid group of the invention is used as a dispersant, and the following known dispersants may be used together therewith. Thus, a dispersion state of the pigment in organic solvent becomes further favorable, and high developability and surface smoothness may be developed even in the case of containing the pigment at high concentration, for example, in composing a color filter. Examples of known dispersants include polymeric dispersants [such as polyamideamine and salt thereof, polycarboxylic acid and salt thereof, high-molecular weight unsaturated acid ester, modified polyurethane, modified polyester, modified poly(meth)acrylate, (meth)acrylic copolymer and naphthalenesulfonic acid formalin condensate], and surface-active agents such as polyoxyethylene alkyl phosphate, polyoxyethylene alkylamine and alkanolamine.

A dispersant capable of being used together in the invention is preferably a graft polymer, a terminal-modified polymer and a block polymer, not having an acid group of the invention, particularly preferably among them, a graft polymer containing a copolymerization unit derived from a monomer having an organic coloring matter structure or a heterocyclic structure, and a terminal-modified polymer having as a terminal group a group having an organic coloring matter structure, a heterocyclic structure, an acidic group and a basic nitrogen atom, an urea group or an urethane group.

Examples of a commercial product of a graft polymeric dispersant capable of being used together in the invention include "trade name: SOL-SPERSE 24000, 28000, 32000, 38500, 39000 and 55000", manufactured by Lubrizol Corp. and "trade name: Disperbyk-161, 171 and 174", manufactured by BYK Chemie, examples of a commercial product of a terminal-modified polymeric dispersant include "trade name: SOL-SPERSE 3000, 17000 and 27000", manufactured by Lubrizol Corp., and examples of a commercial product of a block polymeric dispersant include "trade name: Disperbyk-2000 and 2001", manufactured by BYK. Chemie and "trade name: EFKA4330 and 4340", manufactured by EFKA.

The ratio of the polymeric compound (A) to known dispersants in the case of using known dispersants together is not particularly limited and yet preferably 10/90 or more, particularly preferably 20/80 or more. An amount of the polymeric compound (A) less than 10/90 deviates from the spirit of the invention, and the pigment is so easily aggregated by the interaction with known dispersants that preservability of a pigment dispersion composition is deteriorated. The ratio of a polymeric compound for covering the pigment to a polymeric compound added during the dispersion is preferably 10/90 to 50/50, more preferably 15/85 to 30/70. An amount of the polymeric compound for covering the pigment more than this amount is not preferable for the reason that the micronization of the pigment progresses with difficulty.

The polymeric compound (A) having an acid group of the invention may be used in either of the salt milling process and the dispersing process, preferably in the dispersing process. Also, the compound may be used in both of the salt milling process and the dispersing process. Further, the polymeric compound (A) may be added and used in the process of preparing a photocurable composition by using pigment fluid dispersion having the polymeric compound (A) having an acid group of the invention.

—Preparation of a Pigment Dispersion Composition—

The preparation mode of a pigment dispersion composition of the invention is not particularly limited, for example, which composition may be obtained by performing finely dispersed treatment for pigment, dispersant and solvent with beads made of glass and zirconia having a particle diameter of 0.01 to 1 mm by using vertical type or horizontal type sand mill, pin mill, slitting mill and ultrasonic disperser.

Kneaded dispersed treatment may be also performed while applying strong shear force by using twin roll mill, triple roll mill, ball mill, thoron mill, disper, kneader, co-kneader, homogenizer, blender and uniaxial or biaxial extruder before performing beads dispersion.

Details regarding mixing, kneading and dispersion are described in "Paint Flow and Pigment Dispersion", by T. C. Patton (published by John Wiley and Sons Co. 1964) and the like.

A pigment dispersion composition of the invention is appropriately used for a colored photocurable composition used for producing a color filter.

A photocurable composition of the invention contains the above-mentioned pigment dispersion composition of the invention, alkali-soluble resin, a photo-polymerizable compound and a photo polymerization initiator, and may contain other components as required. The details of the pigment dispersion composition of the invention are as described above. Each component is hereinafter described in detail.

The alkali soluble resin is a linear organic polymer, and may be suitably selected from an alkali soluble resin having at least one group within the molecule (preferably a molecule with an acrylic copolymer or a styrene copolymer as a main chain) promoting alkali solubility (such as, for example, a carboxyl group, a phosphoric acid group, or a sulfonic acid group). Among these, resins which are soluble in an organic solvent and developable by a weak alkali aqueous solution are still more preferable.

A known radical polymerization method is, for example, applicable for production of the alkali soluble resin.

Polymerization conditions during manufacturing the alkali soluble resin with a radical polymerization method, such as the temperature, pressure, type of radical initiator and amount thereof, type of solvent, and the like are easily determined by a person skilled in the art, and the conditions can be derived experimentally.

The linear organic polymer preferably is a polymer having a carboxylic acid group in a side chain thereof. Preferable examples include, for example, a methacrylic acid copolymer, an acrylic acid copolymer, an itaconic acid copolymer, a crotonic acid copolymer, a maleic acid copolymer, a partially esterified maleic acid copolymer, or the like as described in JP-A No. 59-44615, JP-B No. 54-34327, JP-B No. 58-12577, JP-B No. 54-25957, JP-A No. 59-53836, and JP-A No. 59-71048, an acidic cellulose derivative having carboxylic acid in a side chain, and a polymer having a hydroxyl group to which an acid anhydride has been added, and a polymer which has an (meth) acryloyl group in a side chain.

Among these, a benzyl(meth)acrylate/(meth)acrylic acid copolymer, and a multi-component copolymer configured from benzyl(meth)acrylate/(meth)acrylic acid/another monomer are preferred. Besides these, products produced by copolymerization with 2-hydroxyethyl methacrylate are also effective. These polymers may be used in the photocurable composition of the invention mixed with a given amount.

Besides the above, other examples include a 2-hydroxypropyl(meta)acrylate/polystyrene macro-monomer/benzyl methacrylate/methacrylic acid copolymer, and a 2-hydroxy-3-phenoxypropylacrylate/polymethylmethacrylate macro-monomer/benzyl methacrylate/methacrylic acid copolymer, a 2-hydroxyethyl methacrylate/polystyrene macro-monomer/methyl methacrylate/methacrylic acid copolymer, and a 2-hydroxyethyl methacrylate/polystyrene macro-monomer/benzyl methacrylate/methacrylic acid copolymer, as described in JP-A No. 7-140654, and the like.

A specific constitutional unit of alkali-soluble resin is particularly appropriately a copolymer of (meth)acrylic acid and another monomer copolymerizable therewith. Here, (meth)acrylic acid is a generic name for acrylic acid and methacrylic acid, and so forth, (meth)acrylate is a generic name for acrylate and methacrylate.

Examples of other monomers copolymerizable with (meth)acrylic acid include alkyl(meth)acrylates, aryl(meth)acrylates, vinyl compounds, and the like. Here, the hydrogen atom(s) of the alkyl group and the aryl group may be substituted by a substituent.

Specific examples of the alkyl(meth)acrylates and aryl (meth)acrylates include methyl (meth)acrylate, ethyl(meth) acrylate, propyl(meth)acrylate, butyl(meth)acrylate, isobutyl(meth)acrylate, pentyl(meth)acrylate, hexyl(meth) acrylate, octyl(meth)acrylate, phenyl(meth)acrylate, benzyl (meth)acrylate, tolyl(meth)acrylate, naphthyl(meth)acrylate, and cyclohexyl(meth)acrylate.

Examples of the vinyl compounds include, for example, styrene, α-methylstyrene, vinyltoluene, glycidyl methacrylate, acrylonitrile, vinyl acetate, N-vinyl pyrrolidone, tetrahydrofurfuryl methacrylate, a polystyrene macro-monomer, a polymethylmethacrylate macro-monomer, $CH_2=CR^{21}R^{22}$, $CH_2=C(R^{21})(COOR^{23})$ (wherein $R^{21}$ represents a hydrogen atom or an alkyl group of 1 to 5 carbon atoms, $R^{22}$ represents an aromatic hydrocarbon ring of 6 to 10 carbon atoms, and $R^{23}$ represents an alkyl group of 1 to 8 carbon atoms, or an aralkyl group of 6 to 12 carbon atoms.

These other copolymerizable monomers may be used singly or in combinations of two or more thereof. Preferable other copolymerizable monomers include at least one monomer selected from $CH_2=CR^{21}R^{22}$, $CH_2=C(R^{21})(COOR^{23})$, phenyl(meth)acrylate, benzyl(meth)acrylate, and/or styrene, and particularly preferable is $CH_2=CR^{21}R^{22}$ and/or $CH_2=C(R^{21})(COOR^{23})$.

The amount contained of alkali soluble resin in the colored curable composition, is preferably 1 to 15 mass % with respect to the total solids of the composition, is more preferably 2 to 12 mass %, and is particularly preferably 3 to 10 mass %.

The photo-polymerizable compound has at least one ethylenically unsaturated group at which addition polymerization is possible, a compound with a boiling temperature at normal pressure of 100° C. or above is preferable therefore, and an acrylate compound with four or more functions is more preferable.

Examples of the compounds having an at least one ethylenically unsaturated group at which addition polymerization is possible and having a boiling temperature at normal pressure of 100° C. or above include: monofunctional acrylates and methacrylates, such as polyethylene glycol mono-(meth)acrylate, polypropylene glycol mono-(meth)acrylate, and phenoxyethyl(meth)acrylate; and polyfunctional acrylates and methacrylates, such as polyethylene glycol di(meth)acrylate, trimethylolethane tri(meth)acrylate, neopentyl glycol di(meth)acrylate, pentaerythritol tri(meth) acrylate, pentaerythritol tetra(meth)acrylate, dipentaerythritol hexa(meth)acrylate, hexandiol(meth)acrylate, trimethylolpropane tri(acryloyloxypropyl)ether, tri(acryloyloxyethyl) isocyanurate, compounds obtained by (meth)acrylation after adding ethylene oxide or propylene oxide to a polyfunctional alcohol, such as glycerin, and trimethylolethane, compounds obtained by poly(meth)acrylation of pentaerythritol or dipentaerythritol described in JP-B No. 48-41708, JP-B No. 50-6034, and JP-A No. 51-37193, and the polyester acrylates, epoxy acrylates that are the resultant products of reacting an epoxy resin and (meth)acrylic acid described in JP-A No. 48-64183, JP-B No. 49-43191, JP-B No. 52-30490. The photo-curable monomers and oligomers introduced in Nippon Secchaku Kyokai Shi [Journal of the Adhesion Society of Japan] Vol. 20, No. 7 pages 300-308 can also be used.

The specific examples of Formula (1) and (2) in JP-A No. 10-62986A, and the described compounds therein obtained by (meth)acrylation after adding ethyleneoxide and propylene oxide in a polyfunctional alcohol, can also be used.

Among them, dipentaerythritol penta(meth)acrylate, dipentaerythritol hexa(meth)acrylate and a structure such that these acryloyl groups are through ethylene glycol and propylene glycol residue are preferable. These oligomer types may be also used.

Preferable compounds also include urethane acrylates, such as those described in JP-B No. 48-41708, JP-A No. 51-37193, JP-A No. 2-32293, JP-A No. 2-16765, and urethane compounds which have an ethyleneoxide skeleton, as described in JP-B No. 58-49860, JP-B No. 56-17654, JP-B No. 62-39417, and JP-B No. 62-39418. Furthermore, polymerizable compositions with extremely excellent sensitization speed, depending on use, may be obtained by using the addition polymerizable compounds having an amino structure and a sulfide structure within their molecules, as described in JP-A No. 63-277653, JP-A No. 63-260909, and JP-A No. 1-105238.

Examples of commercial products thereof include urethane oligomers UAS-10, UAB-140 (trade names, made by Sanyo-Kokusaku Pulp Co., Ltd.), UA-7200 (trade name, made by Shin Nakamura Kagaku Co., Ltd.), DPHA-40H (trade names, made by Nippon Kayaku Co., Ltd.), UA-306H, UA-306T, UA-306I, AH-600, T-600, AI-600 (trade names, made by Kyoeisha Co., Ltd.), and the like.

A photo-polymerizable compound may be used singly by one kind or by combination of two kinds or more. The content of a photo-polymerizable compound in a photocurable composition is preferably 3 to 55% by mass, more preferably 10 to 50% by mass with respect to 100 parts by mass of the total solid content of the composition. The content of a photo-polymerizable compound within the above-mentioned range allows curing reaction to be sufficiently performed.

<Photopolymerization Initiator>

Examples of the photopolymerization initiator include, for example: a halomethyl oxadiazole, as described in JP-A No. 57-6096; activitated halogenated compounds, such as halomethyl-s-triazine described in JP-B No. 59-1281, JP-A No. 53-133428, and the like;

aromatic carbonyl compounds, such as ketal, acetal or benzoin alkyl ethers, as described in the specifications of U.S. Pat. No. 4,318,791 and European Patent Application Laid-Open No. EP-88050 and the like; aromatic ketone compounds, such as the benzophenone described in the specification of U.S. Pat. No. 4,199,420; (thio)xanthone compounds and acridine compounds, as described in the specification of Fr-2456741; coumarin compounds and biimidazole compounds, as described in JP-A No. 10-62986; and organosulfonium boron complexes, such as those described in JP-A No. 8-015521; and the like.

Preferred examples of the photopolymerization initiator include acetophenone-, ketal-, benzophenone-, benzoin-, benzoyl-, xanthone-, activated halogenated compound-(triazine-, halomethyl oxadiazole-, coumarin-), acridines-, biimidazole-, and oxime ester-initiators.

Preferred examples of acetophenone-photopolymerization initiators include 2,2-diethoxyacetophenone, p-dimethylamino acetophenone, 2-hydroxy-2-methyl-1-phenyl-propan-1-one, p-dimethylamino acetophenone, 4'-isopropyl-2-hydroxy-2-methyl-propiophenone, 1-hydroxy-cyclohexyl phenyl ketone, 2-benzyl-2-dimethylamino-1-(4-morpholinophenyl)-butanone-1,2-tolyl-2-dimethylamino-1-(4-morpholinophenyl)-butanone-1, and 2-methyl-1-[4-(methylthio)phenyl]-2-morpholino-propanone-1.

Preferred examples of ketal-photopolymerization initiators include benzyl dimethyl ketal, benzyl-β-methoxy ethyl acetal, and the like.

Preferred examples of benzophenone-photopolymerization initiators include benzophenone, 4,4',-(bisdimethylamino)benzophenone, 4,4'-(bisdiethylamino)benzophenone, and 4,4'-dichloro benzophenone.

Preferred examples of benzoin- or benzoyl-photopolymerization initiators include benzoin isopropyl ether, benzoin isobutyl ether, benzoin methyl ether, methyl-o-benzoylbenzoate, and the like.

Preferred examples of xanthone-photopolymerization initiators include diethylthioxanthone, diisopropylthioxantone, mono isopropyl thioxantone, chlorothioxantone, and the like.

Preferred examples of activated halogen photopolymerization initiators (triazine-, oxadiazole-, coumarin-initiators) include 2,4-bis(trichloromethyl)-6-p-methoxyphenyl-s-triazine, 2,4-bis(trichloromethyl)-6-p-methoxy styryl-s-triazine, 2,4-bis(trichloromethyl)-6-(1-p-dimethylaminophenyl)-1,3-butadienyl-s-triazine, 2,4-bis(trichloromethyl)-6-biphenyl-s-triazine, 2,4-bis(trichloromethyl)-6-(p-methylbiphenyl)-s-triazine, p-hydroxyethoxystyryl-2,6-di(trichloromethyl)-s-triazine, methoxystyryl 2,6-di(trichloromethyl)-s-triazine, 3,4-dimethoxystyryl-2,6-di(trichloromethyl)-s-triazine, 4-benzoxolane-2,6-di(trichloromethyl)-s-triazine, 4-(o-bromo-p-N,N-(diethoxycarbonylamino)-phenyl)-2,6-di(chloromethyl)-s-triazine, 4-(p-N,N-(diethoxycarbonylamino)-phenyl)-2,6-di(chloromethyl)-s-triazine, 2-trichloromethyl-5-styryl-1,3,4-oxodiazole, 2-trichloromethyl-5-(cyanostyryl)-1,3,4-oxodiazole, 2-trichloromethyl-5-(naphth-1-yl)-1,3,4-oxo diazole, 2-trichloromethyl-5-(4-styryl)styryl-1,3,4-oxodiazole, 3-methyl-5-amino-((s-triazine-2-yl)amino)-3-phenylcoumarin, 3-chloro-5-diethylamino-((s-triazine-2-yl)amino)-3-phenylcoumarin, 3-butyl-5-dimethylamino-((s-triazine-2-yl)amino)-3-phenylcoumarin, and the like.

Preferred examples acridine-photopolymerization initiators include 9-phenylacridine, 1,7-bis(9-acridinyl)heptane, and the like.

Preferred examples of biimidazole-photopolymerization initiators include 2-(o-chlorophenyl)-4,5-diphenyl imidazolyl dimer, 2-(o-methoxyphenyl)-4,5-diphenyl imidazolyl dimer, 2-(2,4-dimethoxyphenyl)-4,5-diphenyl imidazolyl dimer, and the like.

Other examples thereof, in addition to the above, include 1-phenyl-1,2-propanedione-2-(o-ethoxycarbonyl)oxime, O-benzoyl-4'-(benzmercapto)benzoyl-hexyl-ketoxime, 2,4,6-trimethyl phenylcarbonyl diphenylphosphonyl oxide, salts of hexafluoro-phosphoro-trialkylphenylphosphonium, and the like.

In the present invention, there is no limitation to the above photopolymerization initiators, and other known initiators can be used. Examples thereof include: vicinal polyketolaldonyl compounds, as described in the specification of U.S. Pat. No. 2,367,660; α-carbonyl compounds, as described in the specification of U.S. Pat. Nos. 2,367,661 and 2,367,670; acyloin ethers, as described in the specification of U.S. Pat. No. 2,448,828; aromatic acyloin compounds substituted with an α-hydrocarbon, as described in the specification of U.S. Pat. No. 2,722,512; polynuclear quinone compounds, as described in the specification of U.S. Pat. Nos. 3,046,127 and 2,951,758; combinations of triarylimidazole dimer/p-aminophenyl ketone, as described in the specification of U.S. Pat. No. 3,549,367; benzothiazole compound/trihalomethyl-s-triazine compound, as described in JP-B No. 51-48516; oxime ester compounds, as described in J. C. S. Perkin II (1979) 1653-1660, J. C. S. Perkin II (1979) 156-162, Journal of Photopolymer Science and Technology (1995) 202-232, and in JP-A No. 2000-66385; and the like. These photopolymerization initiators can also be used in combinations thereof.

The amount contained of photopolymerization initiator in the photo-curable composition is preferably 0.1 mass % to 10.0 mass %, and is more preferably 0.5 mass % to 5.0 mass %, with respect to the total solids of the composition. When the amount contained of photopolymerization initiator is within these ranges then there is good polymerization reaction promotion and film formation with good strength is possible.

—Sensitizing Dye—

In the present invention, a sensitizing dye is preferably added as required. The radical generating reaction of the polymerization initiator component is promoted by light-exposure of the wavelengths absorbed by the sensitizing dye, and the polymerization reaction of the polymerizable compound is promoted thereby. Examples of such a sensitizing dye include known spectral sensitizing dyes or colorants, or dyes or colorants that absorb light and interact with the photopolymerization initiator.

(Spectral Sensitizing Dye or Dye)

Examples of preferable spectral sensitizing dyes or colorants used for the sensitization dye for the present invention include: polynuclear aromatics (for example, pyrene, perylene, triphenylene); xanthenes (for example, fluorescein, eosin, erythrosin, rhodamine B, rose bengal; cyanines (for example, thiacarbocyanine, oxacarbocyanine); merocyanines (for example, merocyanine, carbomerocyanine); thiazines (for example, thionine, methylene blue and toluidine blue); acridines (for example, acridine orange, chloroflavin, acriflavine); phthalocyanines (for example, phthalocyanine, metal phthalocyanines); porphyrins (for example, tetraphenylporphyrin, central metal-substituted porphyrins); chlorophylls (for example, chlorophyll, chlorophyllin, central metal-substituted chlorophyll); metal complexes (for example, the following compounds); anthraquinones (for example, anthraquinone); squaryliums (for example, squarylium); and the like.

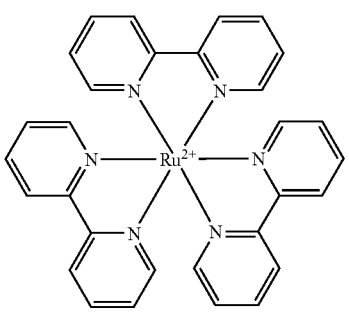

More preferable examples of the spectral sensitizing dyes include styryl-based dyes described in JP-B No. 37-13034, cation dyes described in JP-A No. 62-143044, quinoxalinium salts described in JP-B No. 59-24147, novel methylene blue compounds described in JP-A No. 64-33104, anthraquinones described in JP-A No. 64-56767, benzoxanthene dyes described in JP-A No. 2-1714, acridines described in JP-A No. 2-226148 and JP-A No. 2-226149, pyrylium salts described in JP-B No. 40-28499, cyanines described in JP-B No. 46-42363, benzofuran dyes described in JP-A No. 2-63053, conjugate ketone dyes described in JP-A No. 2-85858 and JP-A No. 2-216154, dyes described in JP-A No. 57-10605, azocinnamylidene derivatives described in JP-B No. 2-30321, cyanine-based dyes described in JP-A No. 1-287105, xanthene-based dyes described in JP-A No. 62-31844, JP-A No. 62-31848, and JP-A No. 62-143043, aminostyryl ketones described in JP-B No. 59-28325, dyes described in JP-A No. 2-179643, merocyanine dyes described in JP-A No. 2-244050, melocyanine dyes described in JP-B No. 59-28326, merocyanine dyes described in JP-A No. 59-89303, merocyanine dyes described in JP-A No. 8-129257, and benzopyran-based dyes described in JP-A No. 8-334897.

(Dyes Having Absorption Maximum Wavelength at 350 nm to 450 nm)

Examples of other preferable embodiments of sensitizing dyes include compounds belonging to the following groups of dyes having an absorption maximum wavelength at 350 nm to 450 nm. Examples include: polynuclear aromatics (for example, pyrene, perylene and triphenylene); xanthenes (for example, fluorescein, eosin, erythrosine, rhodamine B, and rose bengal); cyanines (for example, thiacarbocyanine and oxacarbocyanine); merocyanines (for example, merocyanine and carbomerocyanine); thiazines (for example, thionine, methylene blue and toluidine blue); acridines (for example, acridine orange, chloroflavin, acriflavine); anthraquinones (for example, anthraquinone); and squaryliums (for example, squarylium).

More preferable examples of sensitizing dyes include the compounds represented by the following Formulae (XIV) to (XVIII).

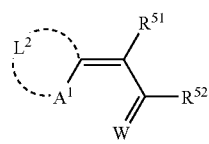

(XIV)

In Formula (XIV), $A^1$ represents a sulfur atom or $NR^{50}$, $R^{50}$ represents an alkyl group or an aryl group, $L^2$ represents a nonmetallic atom group which forms the basic nucleus of a dye in combination with adjoining $A^1$ and the adjacent carbon atom, $R^{51}$ and $R^{52}$ each independently represent a hydrogen atom or a monovalent group of nonmetallic atoms, and $R^{51}$ and $R^{52}$ may be joined together and form an acidic nucleus of a dye. W represents an oxygen atom or a sulfur atom. Specific preferable examples of compounds represented by Formula (XIV) are shown in [(F-1) to (F-5)] below.

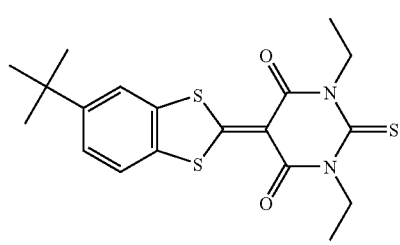

(F-1)

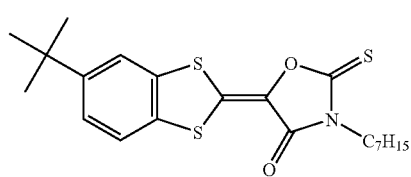

(F-2)

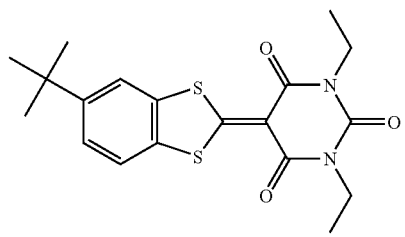

(F-3)

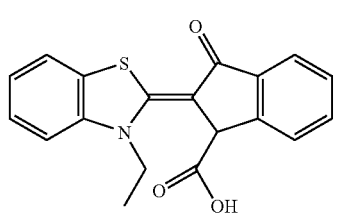

(F-4)

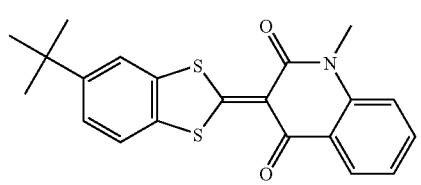

(F-5)

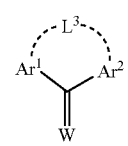

(XV)

(In Formula (XV), $Ar^1$ and $Ar^2$ each independently represents an aryl group, and $Ar^1$ and $Ar^2$ are connected together by -L3-. $L^3$ represents —O— or —S—. W has the same meaning as indicated for W in Formula (XIV). Preferable examples of compounds represented by Formula (XV) are shown in [(F-6) to (F-8)] below.

(F-6)

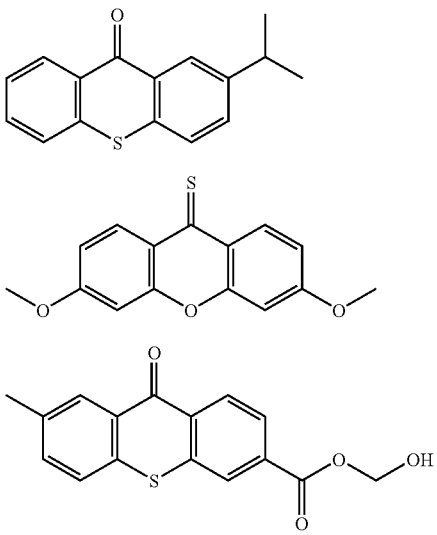

(F-7)

(F-8)

(XVI)

(In Formula (XVI), $A^2$ represents a sulfur atom or $NR^{59}$, $L^4$ represents a nonmetallic atom group which forms a basic nucleus of a dye in combination with adjoining $A^2$ and the adjacent carbon atom, $R^{53}$, $R^{54}$, $R^{55}$, $R^{56}$, $R^{57}$, and $R^{58}$ each independently represents a monovalent group of nonmetallic atoms, and $R^{59}$ represents an alkyl group or an aryl group. Preferable examples of compounds represented with Formula (XVI) are shown in [(F-9) to (F-11)] below.

(F-9)

(F-10)

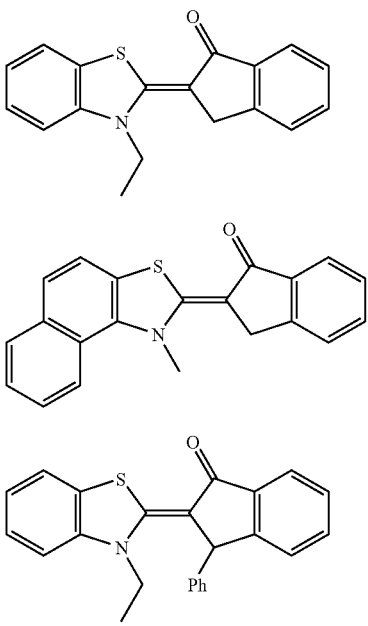

(F-11)

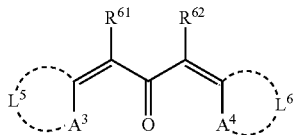

(XVII)

(In Formula (XVII), $A^3$ and $A^4$ each independently represents —S— or —$NR^{63}$, $R^{63}$ represents a substituted or unsubstituted alkyl group or a substituted or unsubstituted aryl group, $L^5$ and $L^6$ each independently represents a nonmetallic atom group and forms a basic nucleus of a dye in combination with the respective adjoining $A^3$, $A^4$ and adjacent carbon atom, $R^{61}$ and $R^{62}$ are each independently a monovalent group of nonmetallic atoms, or $R^{61}$ and $R^{62}$ are joined together to form an aliphatic or aromatic ring). Preferable examples of compounds represented by Formula (XVII) are shown in [(F-12) to (F-15)] below.

(F-12)

(F-13)

(F-14)

(F-15)

Compounds according to the following formula (XVIII) are also preferable examples of the sensitizing dye used for the present invention.

(XVIII)

In the formula (XVIII), $A^9$ represents an optionally substituted aromatic ring or heterocycle, X represents an oxygen atom, a sulfur atom, or —N($P^1$)—, and Y represents an oxygen atom, a sulfur atom, or —N($P^1$)—. $P^1$, $P^2$, and $P^3$ each independently represents a hydrogen atom or a monovalent group of nonmetal atoms. $A^9$, $P^1$, $P^2$, and $P^3$ may be combined with each other to form an aliphatic or aromatic ring. When $R^1$, $R^2$, and $R^3$ each represents a monovalent group of nonmetal atoms, and preferably represents a substituted or unsubstituted alkyl group or aryl group.

When $P^1$, $P^2$, and $P^3$ each represents a monovalent group of nonmetal atoms, and preferably represents a substituted or unsubstituted alkyl group or aryl group. Specific preferable examples of $P^1$, $P^2$, and $P^3$ are described below. Preferable examples of the alkyl group include linear, branched, and cyclic alkyl groups having 1 to 20 carbon atoms, and specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, s-butyl, t-butyl, isopentyl, neopentyl, 1-methylbutyl, isohexyl, 2-ethylhexyl, 2-methylhexyl, cyclohexyl, cyclopentyl, and 2-norbornyl groups. Among them, straight-chain alkyl groups having 1 to 12 carbon atoms, branched-chain alkyl groups having 3 to 12 carbon atoms, and cyclic alkyl group having 5 to 10 carbon atoms are more preferable.

The substituent group in the substituted alkyl groups is a group of monovalent non-metal atomic groups excluding a hydrogen atom; and preferable examples thereof include halogen atoms (—F, —Br, —Cl, and —I); hydroxyl, alkoxy, aryloxy, mercapto, aklythio, arylthio, alkyldithio, aryldithio, amino, N-alkylamino, N,N-dialkylamino, N-arylamino, N,N-diarylamino, N-alkyl-N-arylamino, acyloxy, carbamoyloxy, N-alkylcarbamoyloxy, N-arylcarbamoyloxy, N,N-dialkylcarbamoyloxy, N,N-diarylcarbamoyloxy, N-alkyl-N-arylcarbamoyloxy, alkylsulfoxy, arylsulfoxy, acylthio, acylamino, N-alkylacylamino, N-arylacylamino, ureido, N'-alkylureido, N',N'-dialkylureido, N'-arylureido, N',N'-diarylureido, N'-alkyl-N'-arylureido, N'-alkylureido, N-arylureido, N'-alkyl-N-alkylureido, N'-alkyl-N-arylureido, N',N'-dialkyl-N-alkylureido, N',N'-dialkyl-N-arylureido, N'-aryl-N-alkylureido, N'-aryl-N-arylureido, N',N'-diaryl-N-alkylureido, N',N'-diaryl-N-arylureido, N'-alkyl-N'-aryl-N-alkylureido, N'-alkyl-N'-aryl-N-arylureido, alkoxycarbonylamino, aryloxycarbonylamino, N-alkyl-N-alkoxycarbonylamino, N-alkyl-N-aryloxycarbonylamino, N-aryl-N-alkoxycarbonylamino, N-aryl-N-aryloxycarbonylamino, formyl, acyl($R^{O1}$CO—), carboxyl, alkoxycarbonyl, aryloxycarbonyl, carbamoyl, N-alkylcarbamoyl, N,N-dialkylcarbamoyl, N-arylcarbamoyl, N,N-diarylcarbamoyl, N-alkyl-N-arylcarbamoyl, alkylsulfinyl, arylsulfinyl, alkylsulfonyl, arylsulfonyl, sulfo (—$SO_3$H) and the conjugate base (referred to as sulfonato), alkoxysulfonyl, aryloxysulfonyl, sulfinamoyl, N-alkylsulfinamoyl, N,N-dialkylsulfinamoyl, N-arylsulfinamoyl, N,N-diarylsulfinamoyl, N-alkyl-N-arylsulfinamoyl, sulfamoyl, N-alkylsulfamoyl, N,N-dialkylsulfamoyl, N-arylsulfamoyl, N,N-diarylsulfamoyl, N-alkyl-N-arylsulfamoyl, phosphono (—$PO_3H_2$) and the conjugate base (referred to as phosphonato), dialkylphosphono (—$PO_3$(alkyl)$_2$), diarylphosphono (—$PO_3$(aryl)$_2$), alkylarylphosphono (—$PO_3$(alkyl)(aryl)), monoalkylphosphono (—$PO_3$H(alkyl)) and the conjugate base (referred to as alkylphosphonato), monoarylphosphono (—$PO_3$H(aryl)) and the conjugate base (referred to as arylphosphonato), phosphonooxy (—$OPO_3H_2$) and the conjugate base (referred to as phosphonatooxy), dialkylphosphonooxy (—$OPO_3$(alkyl)$_2$), diarylphosphonooxy (—$OPO_3$(aryl)$_2$), alkylarylphosphonooxy (—$OPO_3$(alkyl)(aryl)), monoalkylphosphonooxy (—$OPO_3$H(alkyl)) and the conjugate base (referred to as alkylphosphonatooxy), monoarylphosphonooxy (—$OPO_3$H(aryl)) and the conjugate base (referred to as arylphosphonatooxy), cyano, nitro, aryl, alkenyl, alkynyl, heterocyclic, and silyl groups, and the like. Specific examples of the alkyl groups in these groups include the alkyl groups described above, and these may have substituents furthermore on them.

Specific examples of the aryl groups include phenyl, biphenyl, naphthyl, toluyl, xylyl, mesityl, cumenyl, chlorophenyl, bromophenyl, chloromethylphenyl, hydroxyphenyl, methoxyphenyl, ethoxyphenyl, phenoxyphenyl, acetoxyphenyl, benzyoloxyphenyl, methylthiophenyl, phenylthiophenyl, methylaminophenyl, dimethylaminophenyl, acetylaminophenyl, carboxyphenyl, methoxycarbonylphenyl, ethoxyphenylcarbonyl, phenoxycarbonylphenyl, N-phenylcarbamoylphenyl, cyanophenyl, sulfophenyl, sulfonatophenyl, phosphonophenyl, and phosphonatophenyl groups, and the like.

The heteroaryl group is a group derived from a monocyclic or polycyclic aromatic ring containing at least one of a nitrogen atom, an oxygen atom, and a sulfur atom. Particularly preferable examples of the heteroaryl ring in the heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolysine, isoindolysine, indoyl, indazole, prine, quinolizine, isoquinoline, phthalazine, naphthyridine, quinazoline, cinnoline, pteridine, carbazole, carboline, phenantliroline, acridine, perimidine, phenanthroline, phenarsazine, and furazan, which may be further benzo-condensed ring, or may be substituted.

Examples of the alkenyl groups in these substituent groups include vinyl, 1-propenyl, 1-butenyl, cinnamyl, and 2-chloro-1-ethenyl group, and the like; and examples of the alkynyl groups include ethynyl, 1-propynyl, 1-butynyl, and trimethylsilylethynyl groups, and the like. Further, examples of $G^1$ in the acyl group ($G^1$CO—) of these substituent groups include a hydrogen atom, and the alkyl and aryl groups described above. Among these substituent groups, still more preferable are halogen atoms (—F, —Br, —Cl, and —I); and alkoxy, aryloxy, aklylthio, arylthio, N-alkylamino, N,N-dialkylamino, acyloxy, N-alkylcarbamoyloxy, N-arylcarbamoyloxy, acylamino, formyl, acyl, carboxyl, alkoxycarbonyl, aryloxycarbonyl, carbamoyl, N-alkylcarbamoyl, N,N-dialkylcarbamoyl, N-arylcarbamoyl, N-alkyl-N-arylcarbamoyl, sulfo, sulfonato, sulfamoyl, N-alkylsulfamoyl, N,N-dialkylsulfamoyl, N-arylsulfamoyl, N-alkyl-N-arylsulfamoyl, phosphono, phosphonato, dialkylphosphono, diarylphosphono, monoalkylphosphono, alkylphosphonato, monoarylphosphono, arylphosphonato, phosphonooxy, phosphonatooxy, aryl, alkenyl and alkylidene (e.g. methylene etc.) groups.

On the other hand, the alkylene group in the substituted alkyl group is, for example, a bivalent organic residue obtained by removing a hydrogen atom on the carbon atom of the alkyl group above having 1 to 20 carbon atoms; and preferable examples thereof include straight-chain alkylene groups having 1 to 12 carbon atoms, branched alkylene groups having 3 to 12 carbon atoms, and cyclic alkylene groups having 5 to 10 carbon atoms.

Typical favorable examples of the substituted alkyl groups obtained by binding the alkylene group to a substituent group as the $P^1$, $P^2$ or $P^3$ group include chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, allyloxycarbonylbutyl, chlorophenoxycarbonylmethyl, carbamoylmethyl, N-methylcarbamoylethyl, N,N-dipropylcarbamoylmethyl, N-(methoxyphenyl)carbamoylethyl, N-methyl-N-(sulfophenyl)carbamoylmethyl, sulfobutyl, sulfonatopropyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl, phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonooxypropyl, phosphonatooxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl, and 3-butynyl groups, and the like.

Preferable examples of the aryl groups of $P^1$, $P^2$ or $P^3$ include groups having a benzene ring, a fused ring of 1 to 3 benzene rings and a fused ring of a benzene ring and a five-membered unsaturated ring; specific examples thereof include phenyl, naphthyl, anthryl, phenanthryl, indenyl, acenaphthenyl, and fluorenyl groups; and among them, phenyl and naphthyl groups are more preferable.

An aryl group described above having a monovalent non-metal atomic groups excluding a hydrogen atom as the substituent group on the ring carbon thereon is used as the substituted aryl group represented by $P^1$, $P^2$ or $P^3$. Preferable examples of the substituent groups include the alkyl and substituted alkyl groups described above and the substituent groups described above for the substituted alkyl groups. Typical favorable example of the substituted aryl groups include biphenyl, toluyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allylphenyl, 1-propenylmethylphenyl, 2-butenylphenyl, 2-methylallylphenyl, 2-methylpropenylphenyl, 2-propynylphenyl, 2-butynylphenyl, and 3-butynylphenyl groups, and the like.

Particularly preferable examples of $P^2$ and $P^3$ include a substituted or unsubstituted alkyl group. More preferable examples of $P^1$ include a substituted or unsubstituted aryl group. The reason for this is not evident, but is considered that these substituents particularly strengthen the interaction between electrons excited upon light absorption and the initiator compound, which improves the efficiency of the initiator compound to generate a radical, acid, or base.

In the next place, $A^9$ in the formula (XVIII) is further described. $A^9$ represents an optionally substituted aromatic ring or heterocycle, and specific examples of the optionally substituted aromatic ring or heterocycle include the same examples as those listed in the above-described description of $P^1$, $P^2$, or $P^3$ in the formula (XVIII). Among them, preferable examples of $A^9$ include an aryl group having an alkoxy group, a thioalkyl group, or an amino group, and particularly preferable examples of $A^9$ include an aryl group having an amino group.

In the next place, compound represented by the following formula (XVIII-3), which is a preferable exemplary embodiment of the compound represented by the formula (XVIII), is further described.

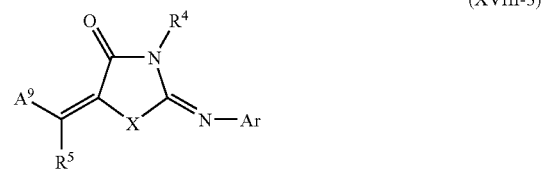

(XVIII-3)

In the formula (XVIII-3), A represents an optionally substituted aromatic ring or heterocycle, and X represents an oxygen atom, a sulfur atom, or —N($R^1$)—. $R^1$, $R^4$, and $R^5$ are each independently a hydrogen atom or a monovalent group of nonmetal atoms, and A, $R^1$, $R^4$, and $R^5$ may be combined with each other to form an aliphatic or aromatic ring. Ar represents a substituted aromatic ring or heterocycle. The sum total of the Hammett's values of the substituents on the Ar skeleton must be greater than 0. The "sum total of Hammett's values is larger than 0" as used herein may be that one substituent is present and the Hammett's value of the substituent is larger than 0 or that a plurality of substituents are present and the sum total of the Hammett's values of these substituents is larger than 0.

In the formula (XVIII-3), A and $R^1$ are equivalent to those in the formula (XVIII), $R^4$ is equivalent to $R^2$ in the formula (XVIII), and $R^5$ is equivalent to R3 in the formula (XVIII). Ar represents a substituted aromatic ring or heterocycle, and specific examples thereof include the same specific examples of the substituted aromatic ring or heterocycle as those listed for A in the description of the formula (XVIII). The total sum of the Hammett's values of the substituents to be introduced into Ar in the formula (XVIII-3) must be 0 or more. Examples of the substituents include a trifluoromethyl group, a carbonyl group, an ester group, a halogen atom, a nitro group, a cyano group, a sulfoxide group, an amide group, and a carboxyl group. The Hammett's value of these substituents are as follows: trifluoromethyl group (—$CF_3$, m: 0.43, p: 0.54); carbonyl group (e.g. —COH, in: 0.36, p: 0.43); ester group (—$COOCH_3$, m: 0.37, p: 0.45); halogen atom (e.g. Cl, m: 0.37, p: 0.23); cyano group (—CN, m: 0.56, p: 0.66); sulfoxide group (e.g. —$SOCH_3$, m: 0.52, p: 0.45); amide group (e.g. —$NHCOCH_3$, m: 0.21, p: 0.00); and carboxyl group (—COOH, m: 0.37, p: 0.45). The site of the substituent in the aryl skeleton and the Hammett's value of the substituent are listed inside the parentheses, and (m: 0.50) means that the Hammett's value of the substituent upon introduction into the meta position is 0.50. Preferable examples of Ar include a substituted phenyl group, and preferable examples of the substituent on the Ar skeleton include an ester group and a cyano group. The substituent is particularly preferably located in the ortho position on the Ar skeleton.

Specific preferable examples of sensitizing dyes represented by Formula (XVIII) according to the present invention are shown in [exemplary compound (F-1) to exemplary compound (F-56)] below, however, the present invention is not limited thereto.
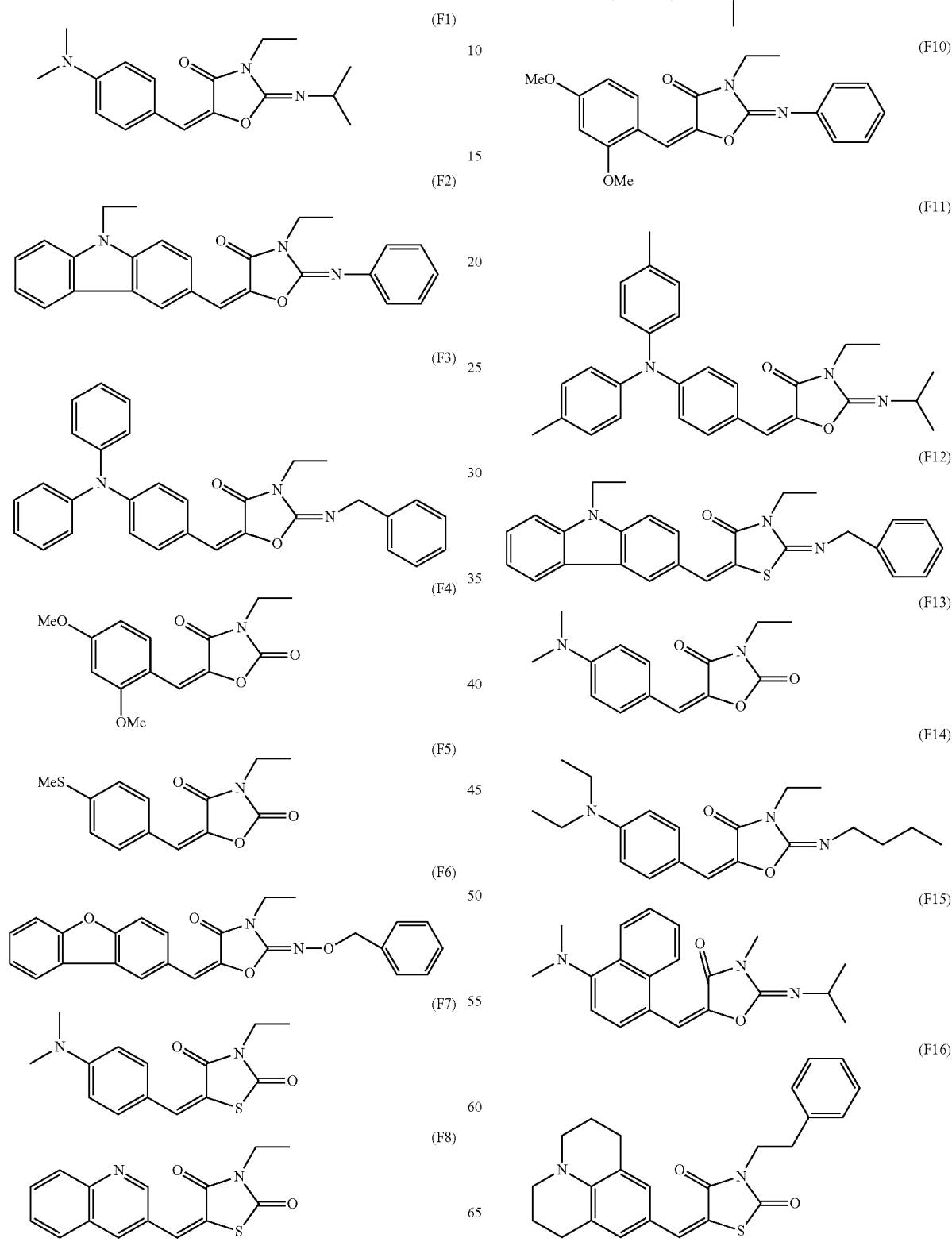

(F17) 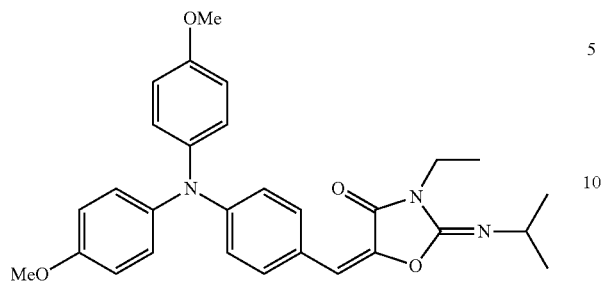
(F18) 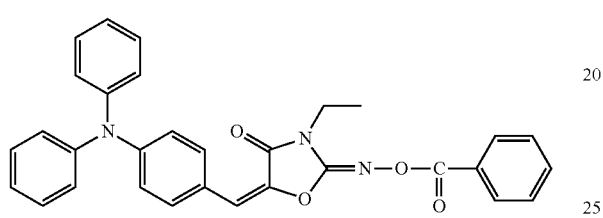
(F19) 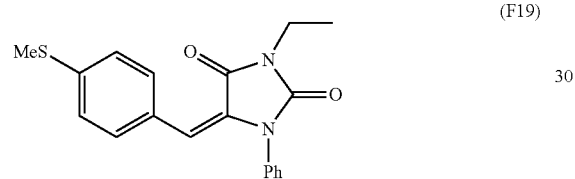
(F-20) 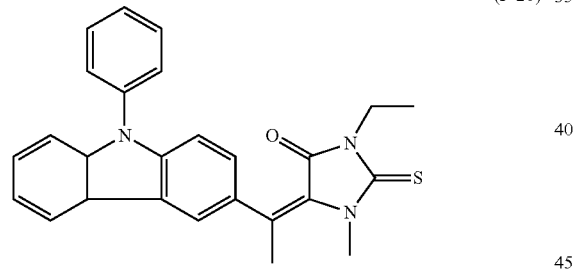
(F-21) 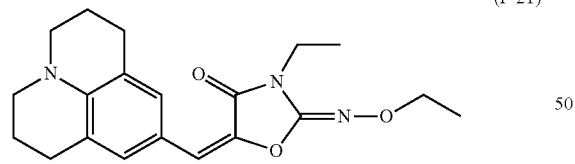
(F-22) 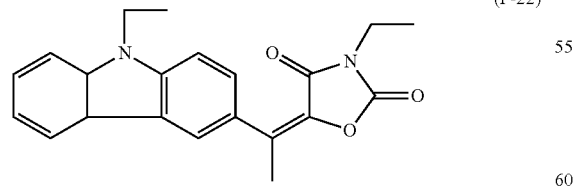
(F-23) 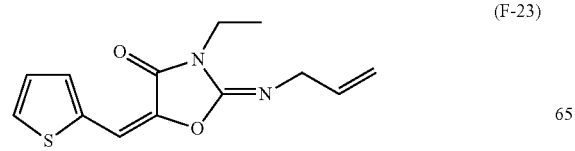
(F-24) 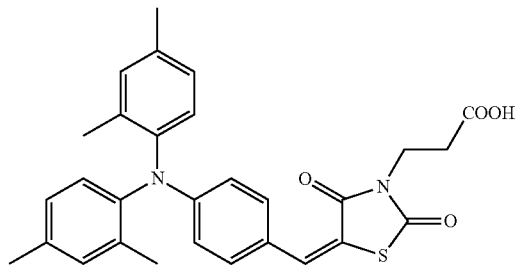
(F-25) 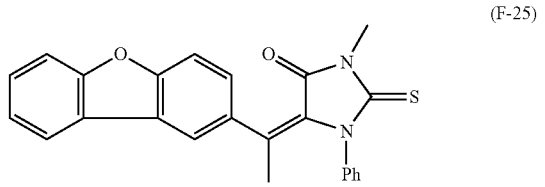
(F-26) 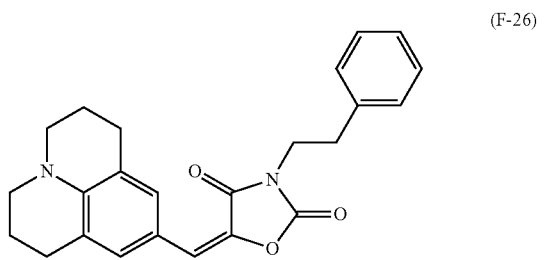
(F27) 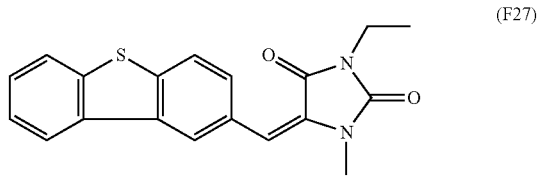
(F28) 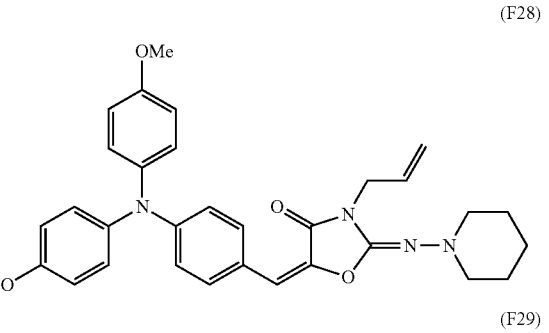
(F29) 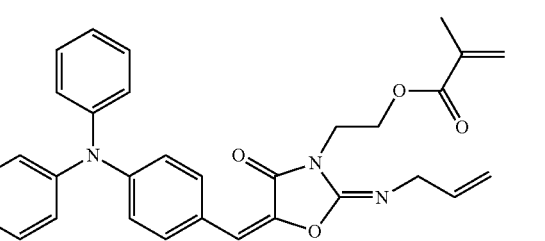
(F30) 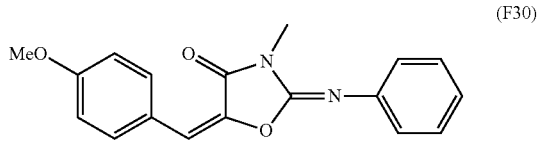

(F31)
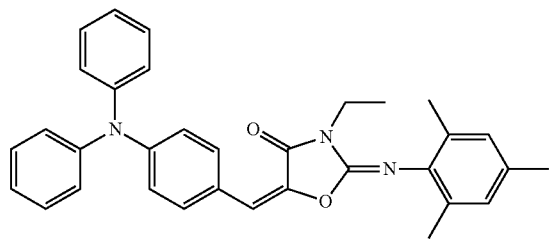
(F32)
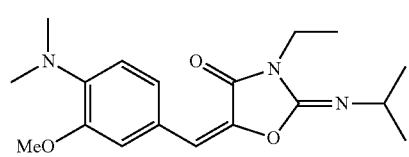
(F33)
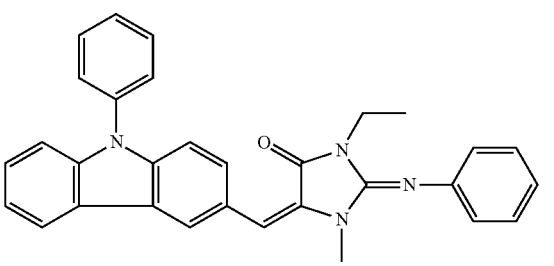
(F34)
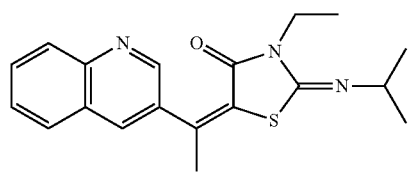
(F35)
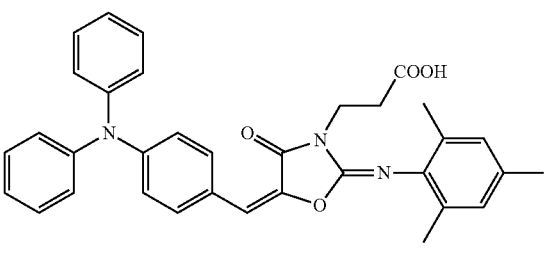
(F36)
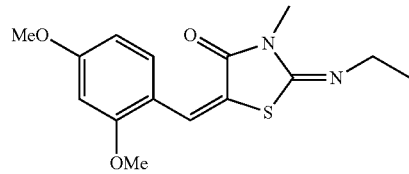
(F37)
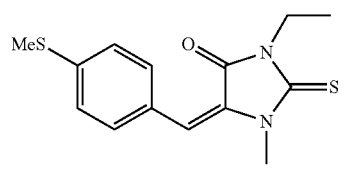
(F38)
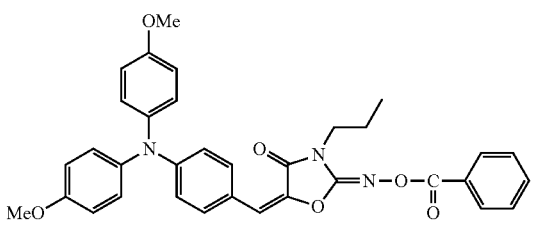
(F39)
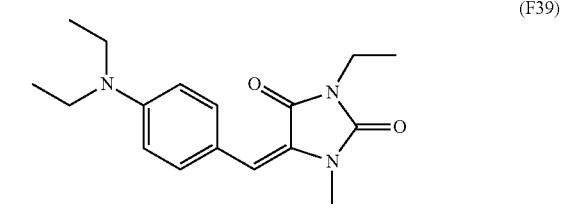
(F40)
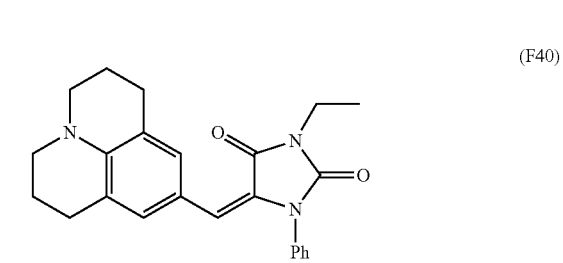
(F41)
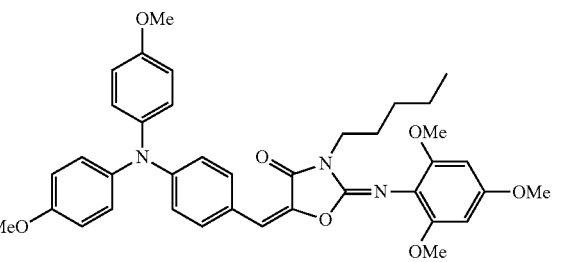
(F42)
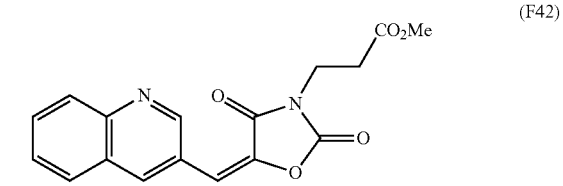
(F43)
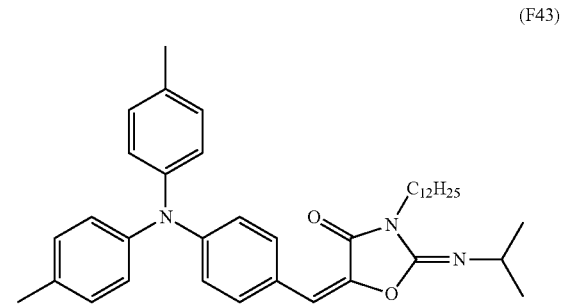

(F44)
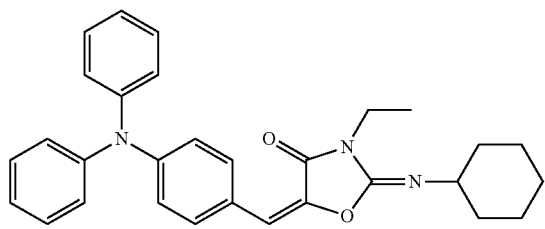
(F45)
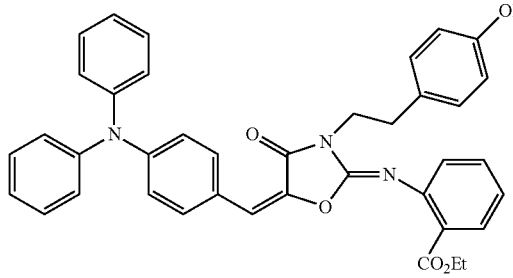
(F46)
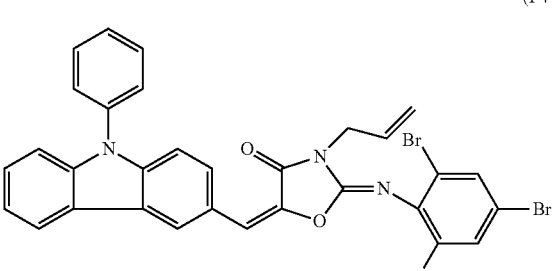
(F47)
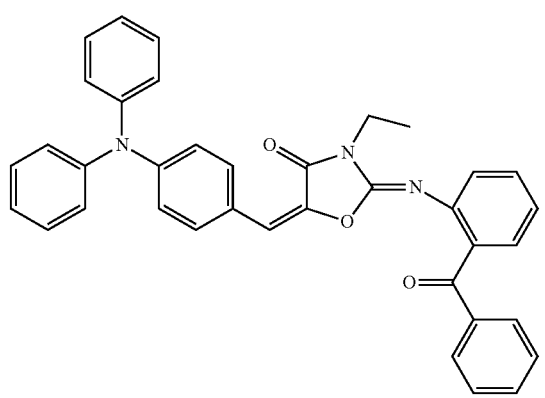
(F48)
(F49)
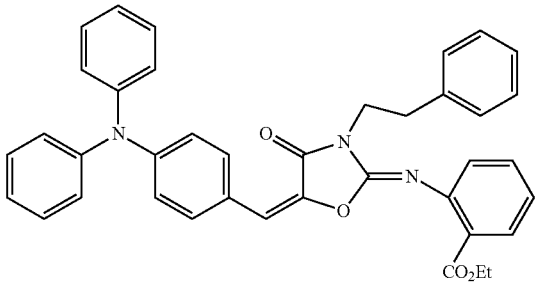
(F50)
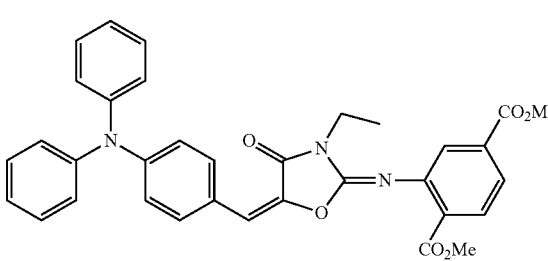
(F51)
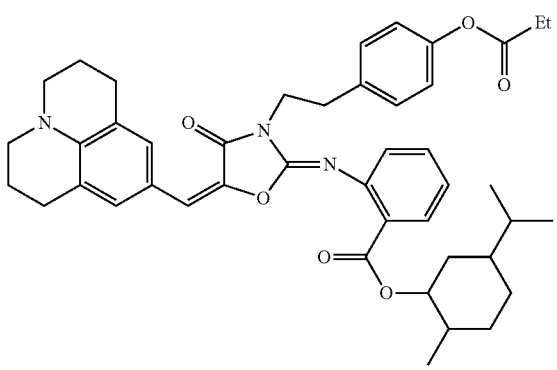
(F52)
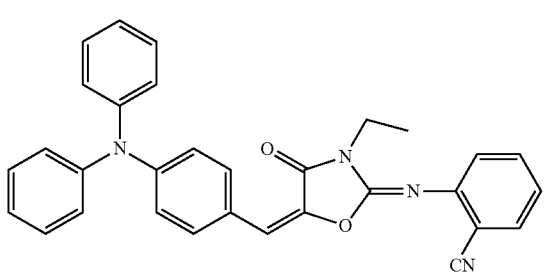
(F53)
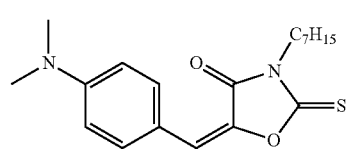
(F54)
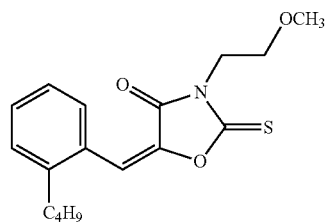

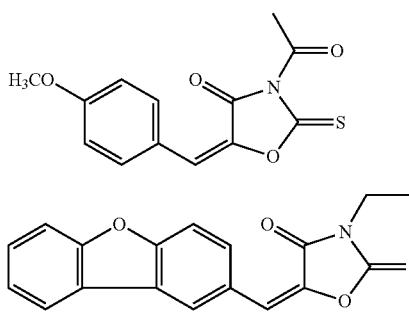

(F55)

(F56)

The compounds represented by Formula (XVIII) from among the sensitizing dyes applicable to the present invention are preferable from the standpoint of curability of the lower portions.

With respect to the sensitizing dyes, the following various chemical modifications may be performed thereto in order to improve the characteristics of the photosensitive composition of the present invention. For example, by combining the sensitizing dye with an additional polymerizable compound structure (for example, an acryloyl group or a methacryloyl group) using methods such as a covalent bond, an ionic bond, or a hydrogen bond, an improvement in the strength of the cross-linked curing layer and an improvement in the ability to suppress unwanted precipitation of the dye from the cross-linked curing layer can be obtained.

The amount contained of the sensitizing dye is preferably 0.01 mass % to 20 mass %, is more preferably 0.01 mass % to 10 mass %, and still more preferably 0.1 mass % to 5 mass %, with respect to the total solids of the colored photosensitive composition for color filters of the present invention. The amount contained of the sensitizing dye within these ranges is preferable since there is high sensitivity to the exposure wavelengths of an ultrahigh pressure mercury lamp, and curability of the lower layer portions may be obtained, and these ranges are also preferable in terms of developing margin and pattern forming characteristics.

—Solvent—

Generally the pigment dispersion composition and the photocurable composition of the present invention can be appropriately prepared by using a solvent with each of the components described above. Examples of solvents that may be used therefor include: esters, for example, ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate; 3-oxypropionic acid alkyl esters, such as methyl 3-oxypropionate, and ethyl 3-oxypropionate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, ethyl 2-oxobutanoate; ethers, for example diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, propylene glycol propyl ether acetate, ethyl carbitol acetate, butyl carbitol acetate and the like; ketones, for example, methyl ethyl ketone, cyclohexanone, 2-heptanone, and 3-heptanone; aromatic hydrocarbons, for example, toluene, such as xylene; and the like.

Preferable among these are methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether acetate, and the like.

The solvents may be used singly or in combinations of two or more thereof.

—Other Usable Components—

A photocurable composition of the invention may contain as required various kinds of additives such as a chain transfer agent, a fluorine organic compound, a thermal polymerization initiator, a thermal polymerization component, a thermal polymerization inhibitor, a coloring agent, a photo polymerization initiator, another filler, a polymeric compound except the above-mentioned alkali-soluble resin, a surface-active agent, an adhesion accelerator, an antioxidant, an ultraviolet absorbing agent and an aggregation inhibitor.

—Chain Transfer Agent—

Examples of the chain transfer agent which can be added to the colored curable composition of the present invention include, alkyl esters of N,N-dialkylamino benzoic acid, such as N,N-dimethylaminobenzoic acid ethyl ester, mercapto compounds that contain heterocycles, such as 2-mercaptobenzothiazole, 2-mercaptobenzoxazole, and 2-mercaptobenzimidazole, aliphatic polyfunctional mercapto compounds, and the like.

The chain transfer agents may be used singly or in combinations of two or more thereof.

—Fluoro Organic Compound—

By including a fluoro organic compound, liquid characteristics (in particular flowability) can be improved when the composition of the present invention is a coating liquid, and the uniformity of coating thickness, and ability to save on liquid used can be improved.

Namely, the colored photosensitive composition containing a fluoro organic compound has improved wettability to a coated face and the coatability of a coated face is improved, since the surface tension between the coated face and the coating liquid is reduced. Therefore, such an embodiment is effective for enabling film formation with little unevenness at a uniform thickness, even when a thin layer is formed of the order of several μm thickness using a small amount of liquid.

The fluorine content in the fluoro organic compound is preferably 3 mass % to 40 mass %, is more preferably 5 mass % to 30 mass %, and is particularly preferably 7 mass % to 25 mass %. Effective coating thickness uniformity and ability to save on liquid used is obtained when the fluorine content being this within these ranges, and the solubility with the composition is also good.

Compounds having a fluoroalkyl group or a fluoroalkylene group at at least one of a terminal, main chain, and/or side chain of the compound are preferably used as the fluoro organic compound. Examples of specific commercial products thereof include MEGAFAC F142D, MEGAFAC F172, MEGAFAC F173, MEGAFAC F176, MEGAFAC F177, MEGAFAC F183, MEGAFAC 780, MEGAFAC 781, MEGAFAC R30, MEGAFAC R08, MEGAFAC F-472 SF, MEGAFAC BL20, MEGAFAC R-61, MEGAFAC R-90 (trade names, made by Dainippon Ink), FLUORAD FC-135, FLUORAD FC-170C, FLUORAD FC-430, FLUORAD FC-431, NOVEC FC-4430 (trade name, made by Sumitomo 3M), ASAHI GUARD AG7105, 7000, 950, 7600, SURFLON S-112, SURFLON S-113, SURFLON S-131, SURFLON S-141, SURFLON S-145, SURFLON S-382, SURFLON SC-101, SURFLON SC-102, SURFLON SC-103, SURFLON SC-104, SURFLON SC-105, SURFLON SC-106 (trade names, made by Asahi Glass Co., Ltd.) and EFTOP EF351, EFTOP 352, EFTOP 801, EFTOP 802 (trade name, made by JEMCO), and the like.

A fluorine organic compound is particularly effective in preventing irregular application and irregular thickness in thinning an applied film. In addition, the compound is effective also in slit coating, in which readily causes lack of liquid.

The addition amount of the fluoro organic compound is preferably 0.001 mass % to 2.0 mass %, and is more preferably 0.005 mass % to 1.0 mass %, with respect to the total mass of colored photosensitive composition.

—Thermal Polymerization Initiator—

Including a thermal polymerization initiator in the colored photosensitive composition of the present invention is also effective.

Examples of the thermal polymerization initiator include various kinds of azo compounds and peroxide compounds. Examples of the azo compounds include azobis compounds and examples of the peroxide compounds include ketone peroxide, peroxyketal, hydroperoxide, dialkyl peroxide, diacyl peroxide, peroxyester, and peroxydicarbonate.

—Thermal-Polymerization Component—

Including a thermal-polymerization component in the colored photosensitive composition of the present invention is also effective. An epoxy compound can be used as the thermal-polymerization component in order to raise the strength of the coated layer formed with the colored photosensitive composition of the present invention. Examples of the epoxy compounds include a compound having two or more epoxy rings in its molecule, such as bisphenol-A epoxy compounds, cresol novolac epoxy compounds, biphenyl epoxy compounds, and alicyclic epoxy compounds. Examples of bisphenol-A epoxy compounds include EPOTOHTO YD-115, YD-118T, YD-127, YD-128, YD-134, YD-8125, YD-7011R, ZX-1059, YDF-8170, YDF-170 (trade names, made by Tohto Kasei Co., Ltd.), DENACOL EX-1101, EX-1102, and EX-1103 (trade name, made by Nagase Kasei Co., Ltd.), PRAXEL GL-61, GL-62, G101, and G102 (trade names, made by Daicel Chemical Industries, Ltd.), and the like, and also similar bisphenol-F epoxy compounds and bisphenol-S epoxy compounds. Epoxy acrylates, such as EBECRYL 3700, 3701, 600 (trade names, made by Daicel UCB Ltd.) can also be used. Examples of cresol novolac epoxy compounds include EPOTOHTO YDPN-638, YDPN-701, YDPN-702, YDPN-703, YDPN-704 (trade name, made by Tohto Kasei Co., Ltd.), DENACOL EM-125 (trade name, made by Nagase Kasei Co., Ltd.); examples of biphenyl epoxy compounds include 3,5,3',5'-tetramethyl-4,4' diglycidyl biphenyl, and the like. Examples of alicyclic epoxy compounds include CELLOXIDE 2021, 2081, 2083, 2085, EPOLEAD GT-301, GT-302, GT-401, GT-403, EHPE-3150 (trade names, made by Daicel Chemical Industries, Ltd.), SUNTOHTO ST-3000, ST-4000, ST-5080, ST-5100 (trade names, made by Tohto Kasei Co., Ltd.), and the like. Other examples of compound that may be used include 1,1,2,2-tetrakis(p-glycidyloxy phenyl)ethane, tris(p-glycidyloxy phenyl)methane, triglycidyl tris(hydroxyethyl)isocyanurate, diglycidyl o-phthalate, diglycidyl terephthalate, as well as amine epoxy resins EPOTOHTO YH-434, YH-434L (trade names, made by Tohto Kasei Co., Ltd.), and glycidyl esters with bisphenol-A epoxy resin skeletons thereof which have been modified with a dimer acid.

—Surfactant—

Various kinds of surfactants may preferably be composed to the pigment dispersion composition of the present invention in order to improve the coatability thereof. Besides the above fluorosurfactants, various nonionic surfactants, cationic surfactants, and anionic surfactants can also be used as such a surfactant. Preferable among these are fluorine organic compounds (fluorosurfactants) and non-ionic surfactants.

Particularly preferable examples of non-ionic surfactants include non-ionic surfactants, such as polyoxyethylene alkyl ethers, polyoxyethylene alkylaryl ethers, polyoxyethylene alkyl esters, sorbitan alkyl esters, monoglyceride alkyl esters, and the like. Specific non-ionic surfactants include: polyoxyethylene alkyl ethers, such as polyoxyethylene lauryl ether, polyoxyethylene stearyl ether, and polyoxyethylene oleyl ether; polyoxyethylene aryl ethers, such as polyoxyethylene octylphenyl ether, polyoxyethylene poly styrylated ether, polyoxyethylene tribenzyl phenyl ether, polyoxyethylene-propylene polystyryl ether, and polyoxyethylene nonylphenyl ether; polyoxyethylene dialkyl esters, such as polyoxyethylene dilaurate, polyoxyethylene distearate, sorbitan fatty acid esters, polyoxyethylene sorbitan fatty acid esters, ethylene diamine polyoxyethylene-polyoxypropylene condensates, and the like.

Commercially available products thereof by Kao Corporation, NOF Corporation, Takemoto Oil and Fat Co., Ltd., Adeka Corporation, Sanyo Chemical Industries, Ltd, and the like can be suitably applied therefor. Besides these, the dispersants described above are also usable as the surfactant.

Various kinds of additives can be added to the colored photosensitive composition of the present invention besides those described above. Specific examples of such additives include: ultraviolet absorbers, such as 2-(3-t-butyl-5-methyl-2-hydroxyphenyl)-5-chlorobenzotriazole and alkoxybenzophenone; aggregation inhibitors, such as sodium polyacrylate; fillers, such as glass and alumina; alkali soluble resins, such as an itaconic acid copolymer, a crotonic acid copolymer, a maleic acid copolymer, a partially esterified maleic acid copolymer, an acidic cellulose derivative, a product formed by adding polymer having a hydroxyl group to an acid anhydride, an alcohol soluble nylon, a phenoxy resin formed from bisphenol A and epichlorohydrin, and the like.

The pigment-dispersed composition of the invention preferably may further contain an organic carboxylic acid, which preferably has a low molecular weight of 1,000 or less, to accelerate dissolution of non-cured portions in alkali and further improve the developing property of the pigment-dispersed composition. Specific examples thereof include aliphatic monocarboxylic acid, such as formic acid, acetic acid, propionic acid, butyric acid, valeric acid, pivalic acid, caproic acid, diethylacetic acid, enanthic acid, and caprylic acid; aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acid, such as tricarballylic acid, aconitic acid, and camphoronic acid; aromatic monocarboxylic acid, such as benzoic acid, toluic acid, cuminic acid, hemellitic acid, and mesitylenic acid; aromatic polycarboxylic acid, such as phthalic acid, isophthalic acid, terephthalic acid, trimellitic acid, trimesic acid, mellophanic acid, and pyromellitic acid; and other carboxylic acid, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid, and umbellic acid.

—Thermal-Polymerization Inhibitor—

A thermal-polymerization inhibitor may preferablly be added further other than the above to the pigment dispersion composition of the present invention. Examples of compounds that may be used as the thermal-polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, and the like.

—Producing Method of a Photocurable Composition and a Color Filter Using This—

A photocurable composition of the invention may be prepared in such a manner that alkali-soluble resin, a photopolymerizable compound and a photo polymerization initiator (preferably with solvent) are contained in the above-mentioned pigment dispersion composition of the invention, into which an additive such as a surface-active agent is mixed as required to pass through the process for mixing and dispersing by using various kinds of mixers and dispersers.

A photocurable composition of the invention is applied to a substrate directly or through another layer by methods of application such as spin coating, slit coating, cast coating, roll coating and bar coating to form a photocurable applied film, which is exposed through a predetermined mask pattern to develop and remove the uncured portion with developing solution after the exposure, and thereby form a patterned film composed of a picture element in each color (three or four colors), leading to a color filter.

On this occasion, radial rays to be used are particularly preferably ultraviolet rays such as g-rays, h-rays, i-rays and j-rays. A color filter for a liquid crystal display is preferably subject to exposure by mainly using h-rays and i-rays with the use of a proximity exposing machine and a mirror projection exposing machine, while a color filter for a solid-state image sensing device is preferably subject to exposure by mainly using i-rays with the use of a stepper exposing machine.

A color filter of the invention is formed on a substrate such as glass by using the above-mentioned photocurable composition of the invention, and is appropriately produced in such a manner that the photocurable composition of the invention is subject to, for example, slit coating on a substrate directly or through another layer to form an applied film, which is thereafter dried and sequentially subject to patterned exposure and development process by using developing solution. Thus, a color filter used for a liquid crystal display and a solid-state image sensing device may be produced with less difficulty in the processes, high quality and low costs.

Examples of the above-mentioned substrate include alkalifree glass, soda glass, pyrex (registered trademark) glass, quartz glass and these with a transparent conductive film attached, which are used for a liquid crystal display, and a photoelectric conversion element substrate such as a silicon substrate and a plastic substrate, which are used for a solid-state image sensing device. On these substrates, typically, a black matrix for isolating each picture element is formed and a transparent resin layer is provided for accelerating adhesion.

A plastic substrate preferably has a gas barrier layer and/or a solvent-resistant layer on the surface thereof. In addition thereto, a patterned film composed of the photocurable composition of the invention is formed also on a driver substrate (hereinafter referred to as "TFT type liquid crystal driver substrate"), on which a thin-film transistor (TFT) of a thin-film transistor (TFT) type color liquid crystal display is disposed, to be capable of forming a color filter. A photomask used on that occasion is provided with a pattern for forming a picture element as well as a pattern for forming a through hole or a U-shaped hollow. Examples of the substrate in a TFT type liquid crystal driver substrate include glass, silicon, polycarbonate, polyester, aromatic polyamide, polyamide imide and polyimide. Proper pretreatments may be also performed for these substrates by request, such as chemical treatment by a silane coupling agent, plasma treatment, ion plating, sputtering, vapor phase reaction method and vacuum deposition. Examples thereof include a substrate such that a passivation film such as a silicon nitride film is formed on the surface of the TFT type liquid crystal driver substrate or the driver substrate.

A method for applying the photocurable composition of the invention to a substrate is not particularly limited, preferably a method by using a slit nozzle (hereinafter referred to as a slit nozzle applying method), such as a slit and spin method and a spinless applying method. In a slit nozzle applying method, a slit and spin method and a spinless applying method differ in the conditions by the size of a substrate to be applied; for example, in the case of applying to a fifth-generation glass substrate (1100 mm×250 mm) by a spinless applying method, the discharge amount of the photocurable composition from a slit nozzle is typically 500 to 2000 microliter/second, preferably 800 to 1500 microliter/second, and the coating rate is typically 50 to 300 mm/second, preferably 100 to 200 mm/second. The solid content of the photocurable composition is typically 10 to 20%, preferably 13 to 18%. In the case where an applied film by the photocurable composition of the invention is formed on a substrate, the thickness of the applied film (after pre-bake treatment) is typically 0.3 to 5.0 μm, preferably 0.5 to 4.0 μm and most preferably 0.8 to 3.0 μm.

Prebaking treatment is usually preformed after carrying out coating.

Vacuum treatment can also be performed, as required, before prebaking.

The amount of vacuum applied in vacuum drying is usually about 0.1 torr to 1.0 torr, and is preferably about 0.2 torr to 0.5 torr.

Prebaking treatment can be performed using a hot plate, oven, or the like, under conditions of a temperature range of 50° C. to 140° C., preferably about 70° C. to 110° C., for 10 to 300 seconds. Radio frequency treatment or the like may be used together with the prebaking treatment. Radio frequency treatment may also be used independently thereof.

In a development process, after carrying out light-exposure, the non-cured portions of the coated layer are dissolved in the developing liquid, and only the cured portions are left remaining on the substrate. The developing temperature is usually 20° C. to 30° C., and the developing time is usually 20 to 90 seconds. Anything can be used as the developing liquid as long as cured portions are not dissolved when dissolving the non-cured portions of the coated layer formed from the photocurable composition.

Specifically, various combinations of organic solvents and various alkaline aqueous solutions can be used.

The above described solvents used when preparing the pigment dispersion composition or the photocurable composition of the present invention can also be used as organic solvents for developing. Examples of the alkaline aqueous solutions include those prepared by dissolving alkaline compounds (such as, for example, sodium hydroxide, potassium hydroxide, sodium carbonate, sodium hydrogencarbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, or 1,8-diazacyclo-[5,4,0]-7-undecene). The concentration of the alkaline aqueous solution is 0.001 mass % to 10 mass %, and is preferably 0.01 mass % to 1 mass %. A suitable quantity of, for example, a water soluble organic solvent, such as methanol and ethanol, a surfactant, or the like, can also be added to the alkaline aqueous solution.

Any one of a dip method, a shower method, a spray method, or the like can be used as the developing method, and these may be combined with a swing method, a spin method, an ultrasonic method, or the like. The surface to be developed may also be wetted with water or the like in advance before the developing liquid is contacted thereto, in order to prevent uneven development. The substrate may also be inclined and developed. Paddle development is also used in the case of a color filter for a solid-state image sensing device.

After developing, rinsing is carried out to wash away excess developing liquid and then drying is performed. Then heat-treatment (post bake) is undertaken to complete curing. Although pure water is usually used for performing rinsing, in order to save water a method may be used in which pure water is used in the final washing stage and such processed pure water is recycled and used in previous washing stages, in combination with the substrate being inclined for washing, and/or ultrasound irradiation thereto.

After rinsing, draining and drying, heat-treatment (at about 200° C. to 250° C.) is usually performed. This heat-treatment (post bake) may be performed to the coated layer after developing by a continuous or batch heating method so as to achieve the above conditions using a heating device such as a hot plate, a convection oven (circulating hot air dryer), a radio frequency heating device, or the like. A color filter formed from plural colors of cured layers (colored patterns) is producible by repeating for each color each of the above processes a number of times according to the desired number of hues.

The application to a color filter is mainly described as applications of the pigment dispersion composition and the photocurable composition of the invention, which may be also applied to the formation of a black matrix for isolating each coloring picture element composing a color filter. The above-mentioned black matrix may be formed in such a manner that the pigment dispersion composition of the invention using as the pigment black pigments such as carbon black and titanium black is exposed, developed and thereafter further post-baked as required to accelerate curing of the film.

EXAMPLES

More specific explanation will now be given of the present invention using the Examples, however, the present invention is not limited the following Examples, as long as the main principles of the invention are not departed from. It should be noted that unless otherwise stated, "parts" refers to parts by mass.

<Synthesis of a Random Polymer of the Invention>
(Synthesis of Monomer G-16)

69 g of methacrylamide, 136 g of triethylamine and 130 mL of tetrahydrofuran were prepared and water-cooled in a 1-L three-necked flask. Solution such that 161 g of camphorsulfonyl chloride was dissolved in 200 mL of tetrahydrofuran was dropped into this solution over 1.5 hours and stirred for 1 hour. After the reaction, the solution was neutralized with 2-mol/L diluted hydrochloric acid and extracted twice with ethyl acetate. The oil layer was extracted with 2-mol/L sodium hydroxide aqueous solution. The water layer was ice-cooled, into which hydrochloric acid was thereafter dropped, and then the crystallized and precipitated white crystal was filtered off and washed in water to obtain 103 g of the intended compound G-16.

$^1$H-NMR (400 MHz, CDCl$_3$) was measured to identify the compound.

δ 0.91 (S, 3H), 1.08 (S, 3H), 1.47 (td, 1H), 2.03 (M, 4H), 2.00 (S, 3H), 2.36 (M, 2H), 3.38 (D, 1H), 3.93 (D, 1H), 5.65 (D, 1H), 5.92 (D, 1H), 8.65 (bs, 1H)

(Synthesis of Polymer 1)

27.0 g of BzMA, 126.0 g of MMA, 27.0 g of G-16 and 420.0 g of 1-methoxy-2-propanol were introduced into a nitrogen-substituted three-necked flask, stirred by a stirrer (trade name: THREE-ONE MOTOR, manufactured by Shinto Scientific Co., Ltd.) and heated-up to a temperature of 90° C. by heating while blowing nitrogen into the flask. 1.69 g of 2,2-azobis(2,4-dimethylvaleronitrile) (trade name: V-65, manufactured by Wako Pure Chemical Industries, Ltd.) was added thereto and stirred while heated at a temperature of 90° C. for 2 hours. 1.69 g of V-65 was further added after 2 hours and stirred while heated for 3 hours to thereafter obtain 30%-solution of the polymer 1. The weight-average molecular weight of the obtained polymeric compound measured 20,000 by gel permeation chromatography (GPC) using polystyrene as a standard reference material. The acid value per solid content was 98 mgKOH/g by titration using sodium hydroxide.

The polymers 2 to 6 were synthesized in the same manner.

(Synthesis of Polymer 7)

21.0 g of a-3, 98.0 g of MMA, 14.0 g of G-18, 7.0 g of MAA and 420.0 g of 1-methoxy-2-propanol were introduced into a nitrogen-substituted three-necked flask, stirred by a stirrer (trade name: THREE-ONE MOTOR, manufactured by Shinto Scientific Co., Ltd.) and heated-up to a temperature of 90° C. by heating while blowing nitrogen into the flask. 1.69 g of 2,2-azobis(2,4-dimethylvaleronitrile) (trade name: V-65, manufactured by Wako Pure Chemical Industries, Ltd.) was added thereto and stirred while heated at a temperature of 90° C. for 2 hours. 1.69 g of V-65 was further added after 2 hours and stirred while heated for 3 hours to thereafter obtain 30%-solution of the polymer 7.

The weight-average molecular weight of the obtained polymeric compound measured 15,000 by gel permeation chromatography (GPC) using polystyrene as a standard reference material. The acid value of solid content was 98 mgKOH/g by titration using sodium hydroxide, and the composition ratio (mass ratio) of the repeating unit measured from $^1$H-NMR was a-3/MMA/G-18/MAA=15/70/10/5.

<Synthesis of a Graft Polymer of the Invention>
(Synthesis of Polymer 8)

28.0 g of BzMA, 91.0 g of polymethyl methacrylate having a methacryloyl group at a terminal (trade name: AA-6, manufactured by Toagosei Chemical Industry Co., Ltd.), 21.0 g of G-16, 2.9 g of n-dodecyl mercaptan and 327 g of methoxypropylene glycol were introduced into a nitrogen-substituted three-necked flask, stirred by a stirrer (trade name: THREE-ONE MOTOR, manufactured by Shinto Scientific Co., Ltd.) and heated-up to a temperature of 78° C. by heating while blowing nitrogen into the flask. 0.8 g of 2,2-azobis(2-dimethyl methylpropionate) (trade name: V-601, manufactured by Wako Pure Chemical Industries, Ltd.) was added thereto and stirred while heated at a temperature of 78° C. for 2 hours. 0.8 g of V-601 was further added after 2 hours and stirred while heated for 3 hours to thereafter obtain 30%-solution of the polymer 8. The acid value per solid content was 98 mgKOH/g by titration using sodium hydroxide.

The polymers 9 and 10 were synthesized in the same manner.

<Synthesis of a Terminal-Modified Polymer of the Invention>
(Synthesis of Precursor TM-1 of Polymer 11)

7.83 parts of dipentaerythritol hexakis(3-mercaptopropionate) (DPMP; manufactured by Sakai Chemical Industry Co., Ltd.) and 4.55 parts of itaconic acid were dissolved in 28.90 parts of 1-methoxy-2-propanol and heated to a temperature of 70° C. under a nitrogen stream. 0.04 part of 2,2'-azobis(2,4-dimethylvaleronitrile) (trade name: V-65, manufactured by Wako Pure Chemical Industries, Ltd.) was added thereto and heated for 3 hours. 0.04 part of V-65 was further added and reacted at a temperature of 70° C. under a nitrogen stream for 3 hours. 30%-solution of mercaptan compound (TM-1) according to the invention described below was obtained by cooling to room temperature.

The polymers 12 and 13 were synthesized in the same manner. The obtained polymeric compounds were shown together in Table 1.

<Synthesis of a Block Polymer>
(Synthesis of Polymer 14)

Degassed solution of 140 g of benzyl methacrylate, 2 g of the following compound (45) and 100.0 g of cyclohexanone was stirred at a temperature of 80° C. for 2 hours and thereafter heated at a temperature of 120° C. for 0.5 hour to obtain a polymer of Mn=6500. 20 g of methacrylic acid was projected thereinto to heat the degassed solution at a temperature of 120° C. for 1 hour and obtain a polymer of Mn=7200. 40 g of G-16 was further added to heat the degassed solution at a temperature of 120° C. for 1 hour. After finishing the reaction, the solution was diluted with 392.0 g of 1-methoxy-2-propyl acetate to obtain 30%-solution of the polymer 14. The weight-average molecular weight of the obtained polymeric compound measured 8,000 by gel permeation chromatography (GPC) using polystyrene as a standard reference material. The composition ratio (mass ratio) of the repeating unit measured from $^1$H-NMR was 70/10/20.

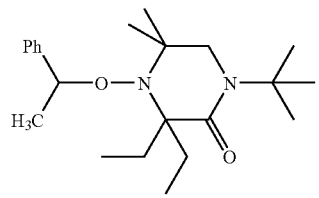

Compound (45)

The polymer 15 was synthesized in the same manner.

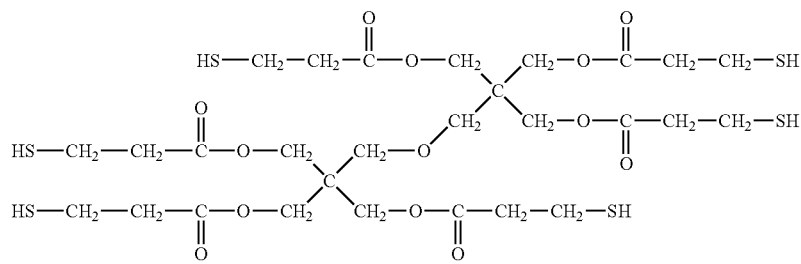

[TM-1]

(Synthesis of Polymer 13)

Mixed solution of 5.03 parts of 30%-solution of the above-mentioned TM-1, 90.0 g of methyl methacrylate, 10.0 g of G-16 and 23.3 g of 1-methoxy-2-propanol was heated to a temperature of 90° C. under a nitrogen stream. Mixed solution of 0.7 g of 2,2'-azobisdimethyl isobutyrate (trade name: V-601, manufactured by Wako Pure Chemical Industries, Ltd.), 26.8 g of 1-methoxy-2-propanol and 47 g of 1-methoxy-2-propyl acetate was dropped thereinto over 2.5 hours while stirring this mixed solution. After finishing the dropping and then reacting at a temperature of 90° C. for 2.5 hours, mixed solution of 0.23 g of 2,2'-azobisdimethyl isobutyrate and 20.0 g of 1-methoxy-2-propyl acetate was projected thereinto and reacted for another 2 hours. 7.5 g of 1-methoxy-2-propanol and 105.0 g of 1-methoxy-2-propyl acetate were added to the reaction solution and cooled to room temperature to obtain 30%-solution of the polymer 11.

(Synthesis of A-3)

160.0 g of ε-caprolactone and 18.3 g of 2-ethyl-1-hexanol were introduced into a 500-mL three-necked flask, and stirred and dissolved while blowing nitrogen thereinto. 0.1 g of monobutyltin oxide was added thereto and heated to a temperature of 100° C. After confirming by gas chromatography that the raw materials vanished in 8 hours, the solution was cooled to a temperature of 80° C. 0.1 g of 2,6-ditert-butyl-4-methyl phenol was added to thereafter add 22.2 g of 2-methacryloyloxyethyl isocyanate. After confirming by H-NMR that the raw materials vanished in 5 hours, the solution was cooled to room temperature to obtain 200 g of solid-state (A-3). It was confirmed by H-NMR, IR and mass spectrometric analysis that the product was (A-3).

(Synthesis of Polymer 16)

28.0 g of M-1, 78.8 g of A-3 synthesized in the above, 21.0 g of methacrylic acid, 4.2 g of n-dodecyl mercaptan and 327 g of methoxypropylene glycol were introduced into a nitrogen-substituted three-necked flask, stirred by a stirrer (trade name: THREE-ONE MOTOR, manufactured by Shinto Scientific Co., Ltd.) and heated-up to a temperature of 75° C. by heating while blowing nitrogen into the flask. 1.0 g of 2,2-azobis(2-dimethyl methylpropionate) (trade name: V-601, manufactured by Wako Pure Chemical Industries, Ltd.) was added thereto and stirred while heated at a temperature of 75° C. for 2 hours. Thereafter, 1.0 g of V-601 was further added and stirred while heated for 2 hours, and thereafter heated-up to a temperature of 90° C. and stirred while heated for 2 hours to thereafter obtain 30%-solution of the polymer 4.

The weight-average molecular weight of the obtained polymeric compound measured 23,000 by gel permeation chromatography (GPC) using polystyrene as a standard reference material.

The acid value per solid content was 117 mgKOH/g by titration using sodium hydroxide, and the composition ratio (mass ratio) of the repeating unit measured from $^1$H-NMR was 10/65/15.

The polymer 17 was synthesized in the same manner.

TABLE 1

| polymer | composition ratio of polymer | | | | weight-average molecular weight | acid value |
|---|---|---|---|---|---|---|
| 1 | BzMA 15 | MMA 70 | G-16 15 | | 20,000 | 98 |
| 2 | BzMA 18 | MMA 79 | G-16 3 | | 19,000 | 31 |
| 3 | BzMA 18 | MMA 77 | G-16 5 | | 21,000 | 42 |
| 4 | CHMA 15 | MMA 65 | G-21 20 | | 5,000 | 126 |
| 5 | BzMA 60 | G-1 40 | | | 20,000 | 126 |
| 6 | a-21 15 | MMA 70 | G-18 15 | | 21,000 | 98 |
| 7 | a-3 15 | MMA 70 | G-18 10 | MAA 5 | 15,000 | 98 |
| 8 | a-1 20 | AA-6 65 | G-13 15 | | 20,000 | 98 |
| 9 | MMA 30 | AA-6 50 | G-18 20 | | 23,000 | 126 |
| 10 | DMAEMA 5 | AA-6 80 | G-16 15 | | 20,000 | 70 |
| 11 | MMA 90 | G-16 10 | | | 18,000 | 100 |
| 12 | MMA 80 | MAA 5 | G-1 15 | | 18,000 | 100 |
| 13 | G-1 100 | | | | 15,000 | 120 |
| 14 | BzMA 70 | MMA 20 | G-16 10 | | 8,000 | 65 |
| 15 | BzMA 50 | G-21 50 | | | 9,000 | 120 |
| 16 | M-1 10 | A-3 60 | MMA 15 | G-1 15 | 23,000 | 98 |
| 17 | M-1 10 | AA-6 60 | MMA 15 | G-1 15 | 25,000 | 98 |

The compounds by the abbreviations used in Examples, Comparative Examples and Table 1 were described below.
MAA: methacrylic acid
MMA: methyl methacrylate
BzMA: benzyl methacrylate
CHMA: cyclohexyl methacrylate
DMAEMA: 2-dimethylaminoethyl methacrylate
AA-6: one terminal-methacryloylized polymethyl methacrylate oligomer (Mn=6000, manufactured by Toagosei Chemical Industry Co., Ltd.)
M-1, G-1, G-13, G-16, G-18 and G-21 were the compounds exemplified in the specification, and $R^3$ of G-1, G-13, G-16 and G-18 denoted a methyl group.

<Preparation of Processed Pigment>

50 g of C. I. pigment green 36, 500 g of sodium chloride, 25 g of solution of the polymer of the invention described in Table 2 or the polymeric compound of comparative experiments, and 100 g of diethylene glycol were charged into a 1-gallon kneader made of stainless steel (manufactured by Inoue Mfg., Inc.), and kneaded for 9 hours. Next, this mixture was projected into approximately 3 liters of water, stirred for approximately 1 hour by a high-speed mixer, and thereafter filtered and washed in water to remove sodium chloride and the solvent therefrom and obtain processed pigment coated with the polymeric compound by drying.

When the polymeric compound was not used in the processed pigment process, the same experiment was performed without using the solution of the polymeric compound in the above-mentioned formulation.

<Preparation of a Pigment Dispersion Composition>

The components by the following composition (1) were mixed and stirred at a number of revolutions of 3,000 rpm for 3 hours by using a homogenizer to prepare mixed solution containing pigment.

| [Composition (1)] | |
|---|---|
| Processed pigment | 95 parts |
| Pigment derivative A [46] | 5 parts |
| Dispersant described in Table 2 (30%-solution of 1-methoxy-2-propyl acetate) | the amount described in Table 2 |
| 1-methoxy-2-propyl acetate | 750 parts |

Subsequently, the mixed solution obtained from the above was further subject to dispersion treatment for 6 hours by a beads disperser using 0.3 mmφ zirconia beads "DISPER-MAT" (manufactured by Getzmann), and thereafter further subject to dispersion treatment under a pressure of 2000 kg/cm$^3$ at a flow rate of 500 g/min by using a high-pressure disperser with decompression mechanism "NANO-3000-10" (manufactured by Japan BEE Co., Ltd.). This dispersion treatment was repeated ten times to obtain a pigment dispersion composition.

<Evaluation of a Pigment Dispersion Composition>

The following evaluations were performed for the obtained pigment dispersion composition. The results are shown in Table 2.

(1) Measurement and Evaluation of Viscosity

The viscosity η1 of the pigment dispersion composition immediately after dispersion and the viscosity η2 of the pigment dispersion composition with 1 week passed (at room temperature) after dispersion were measured for the obtained pigment dispersion composition by using an E-type viscometer to evaluate the degree of thickening. Here, low viscosity signifies that the viscosity resulting from the dispersant is restrained from increasing to offer favorable dispersibility and dispersion stability of the pigment.

(2) Measurement and Evaluation of Contrast

The obtained pigment dispersion composition was applied on a glass substrate to produce a sample so that the thickness of the applied film after being dried became 1 μm. This sample was put between two sheets of polarizing plates to measure luminance with the polarizing plates parallel and luminance with the polarizing plates orthogonal by "BM-5" manufactured by Topcon Corp., and then calculate in accordance with contrast=luminance with the polarizing plates parallel/luminance with the polarizing plates orthogonal. Here, high contrast signifies that the pigment is uniformly dispersed in a highly micronized state.

TABLE 2

| | polymeric compound used for processing pigment | polymeric compound used in dispersing process | used amount in composition 1 | initial viscosity (mPa · s) | viscosity with time (mPa · s) | contrast |
|---|---|---|---|---|---|---|
| Example 1 | none | polymer 1 | 100 | 25 | 30 | 5000 |
| Example 2 | none | polymer 2 | 100 | 25 | 30 | 5000 |
| Example 3 | none | polymer 3 | 200 | 25 | 30 | 5000 |
| Example 4 | none | polymer 4 | 100 | 25 | 30 | 5000 |
| Example 5 | none | polymer 5 | 200 | 25 | 30 | 5000 |
| Example 6 | none | polymer 6 | 100 | 25 | 30 | 5000 |
| Example 7 | none | polymer 7 | 150 | 25 | 30 | 5000 |
| Example 8 | none | polymer 8 | 150 | 20 | 25 | 6000 |
| Example 9 | none | polymer 9 | 200 | 23 | 28 | 5500 |
| Example 10 | none | polymer 11 | 200 | 15 | 20 | 7000 |
| Example 11 | none | polymer 12 | 200 | 15 | 20 | 7000 |
| Example 12 | none | polymer 13/ D-1 | 100/100 | 15 | 20 | 6500 |
| Example 13 | none | polymer 14 | 150 | 20 | 25 | 6000 |
| Example 14 | none | polymer 15 | 150 | 20 | 25 | 6000 |
| Example 15 | polymer 1 | polymer 8 | 90 | 20 | 22 | 7000 |
| Example 16 | polymer 6 | polymer 6 | 80 | 25 | 27 | 6000 |
| Example 17 | P-1 | polymer 11 | 100 | 15 | 17 | 8000 |
| Example 18 | P-2 | polymer 7 | 80 | 20 | 22 | 7000 |
| Example 19 | polymer 6 | D-1 | 80 | 25 | 27 | 6000 |
| Example 20 | P-1 | polymer 16 | 90 | 14 | 15 | 8000 |
| Example 21 | P-2 | polymer 17 | 90 | 20 | 22 | 6000 |
| Comparative Example 1 | none | D-1 | 100 | 50 | 100 | 2000 |
| Comparative Example 2 | none | D-2 | 200 | 50 | 100 | 2000 |
| Comparative Example 3 | P-1 | D-1 | 800 | 40 | 80 | 3000 |
| Comparative Example 4 | P-2 | D-2 | 100 | 40 | 80 | 3000 |

The compounds by the abbreviations used in Table 2 were described below.

P-1: copolymer of methyl methacrylate/methacrylic acid=85/15% by mass weight-average molecular weight: 20000, acid value: 98 mgKOH/g P-2: hydrogenated rosin ester (trade name: ESTER GUM HP, manufactured by Arakawa Chemical Industries, Ltd.)

D-1: copolymer of a-1/AA-6/MAA=20/65/15% by mass weight-average molecular weight: 23000, acid value: 100 mgKOH/g D-2: trade name: "SOL-SPERSE 24000", manufactured by Lubrizol Corp.

It is found that the use of the polymeric compound of the invention in the processing process, the dispersing process or both of the pigment improves preservability of the pigment dispersion composition and allows the pigment dispersion composition with high contrast and difficulty in precipitating.

<Preparation of a Colored Photocurable Composition>

The following colored photocurable composition was produced by using the obtained pigment dispersion composition.

| | |
|---|---|
| Pigment fluid dispersion described in Table 3 | 2100 parts |
| Dipentaerythritol hexaacrylate (photo-polymerizable compound) | 90 parts |
| 4-[ortho-bromo-para-N,N-di(ethoxycarbonyl)aminophenyl]-2,6-di(trichloromethyl)-sec-triazine (photo-polymerization initiator) | 30 parts |
| Propylene glycol monoethyl ether acetate solution (solid content of 30%) of benzyl methacrylate/ methacrylic acid (=75/25 [mass ratio]) copolymer (weight-average molecular weight: 10,000) (alkali-soluble resin) | 300 parts |
| 1-methoxy-2-propyl acetate (solvent) | 390 parts |

<Preparation of a Color Filter Using a Colored Photosensitive Composition>

The obtained colored photocurable composition (color resist liquid) was applied on a glass substrate of 100 mm×100 mm (trade name: 1737, manufactured by Corning), and dried in an oven of 90° C. for 60 seconds (pre-bake). Thereafter, the whole plane of the applied film was exposed at 200 mJ/cm² (an illuminance of 20 mW/cm²), and the applied film after being exposed was coated with 1%-aqueous solution of alkaline developing sohltion "CDK-1" (manufactured by FUJIFILM Electronic Materials Co., Ltd.), and rendered still for 60 seconds. After being rendered still, the developing solution was washed away by spraying pure water as a shower. Then, the applied film subject to the exposure and development as described above was subject to heat treatment in an oven of 220° C. for 1 hour (post-bake) to form a colored pattern (colored resin film) for a color filter on the glass substrate, and produce a colored filter substrate (color filter).

Here, the application was performed in Examples 20, 21 and Comparative Example 5 at a film thickness such that x value as an index for color density became 0.650, while the application was performed in Examples 22, 23 and Comparative Example 6 at a film thickness such that y value as an index for color density became 0.650.

<Evaluation of a Color Filter>

The evaluations were performed for the produced colored filter substrate (color filter) in the following manner. The results are shown in the following Table 3.

(1) Contrast: the Same Method as the Evaluation of the Pigment Fluid Dispersion (2) Development Residue The substrate after being developed was observed by an optical microscope for a remaining state in the unexposed portion of the glass substrate. The state such that no residues existed in the unexposed portion was regarded as A, the state such that few residues were confirmed in the unexposed portion and brought no problems practically was regarded as B, and the state such that residues were remarkably confirmed in the unexposed portion was regarded as C.

(3) Surface Smoothness

The evaluation of slit application aptitude was performed by using a slit applying device provided with a slit head having a slit interval of 100 μm and an application effective width of 500 mm. After applying on 10 sheets of glass substrates (a width of 550 mm, a length of 650 mm and a thickness of 0.7 mm) by an ordinary method, the above-mentioned slit head was made to stand in the air for 5 minutes and subjected to forced drying. Dummy dispense was performed for 3 seconds after standing to intermittently slit-apply directly on 10 sheets of the glass substrates. The interval between the slit and the glass substrates was adjusted so that the applied film thickness after post-baking became 2 μm to apply the curable composition at an applying speed of 100 mm/second. After applying and then pre-baking at a temperature of 90° C. for 60 seconds by a hot plate, the number of striped surface irregularities on the applied surface was visually counted by using a sodium light source to evaluate by the following standard and show in Table 3.

—Evaluation Standard—

A: no striped surface irregularities were observed on the applied surface

B: striped surface irregularities were observed by 1 to 5

C: striped surface irregularities were observed by 6 or more

In Table 3, PR254 and PG36 denote C. I. pigment red 254 and pigment green 36, respectively. P-1 and D-1 are the same as in Table 2. The polymers are compounds shown in Table 1. The pigment derivatives are described below.

Pigment Derivative-A

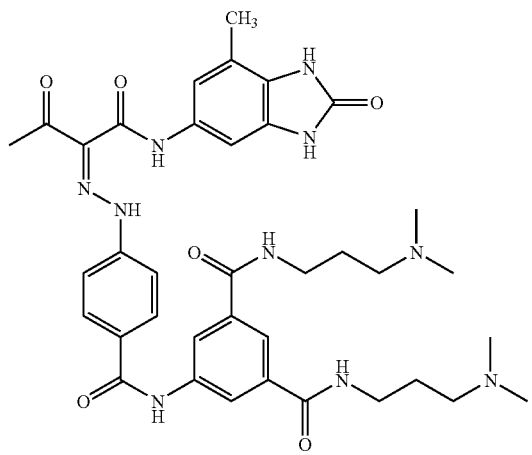 [SMILES: CC(=O)/C(=N/Nc1ccc(C(=O)Nc2cc(C(=O)NCCCN(C)C)cc(C(=O)NCCCN(C)C)c2)cc1)C(=O)Nc1cc(C)c2[nH]c(=O)[nH]c2c1]

Pigment Derivative-B

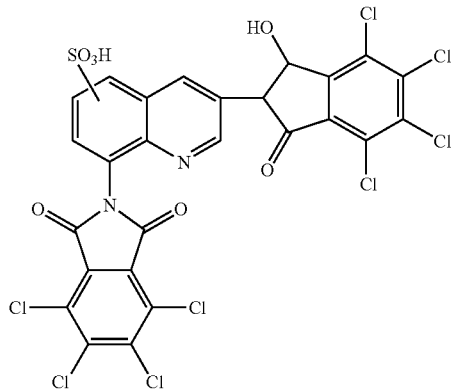

TABLE 3

| Example | processed pigment | | | polymer used in dispersing | evaluations | | |
|---|---|---|---|---|---|---|---|
| | pigment | pigment derivative | processing pigment | | contrast | development residue | surface smoothness |
| Example 22 | PR254 | A | none | polymer 9 | 5500 | A | A |
| Example 23 | PR254 | A | P-1 | polymer 8 | 7000 | A | A |
| Example 24 | PR254 | B | P-1 | polymer 16 | 7000 | A | A |
| Comparative Example 5 | PR254 | A | P-1 | D-1 | 3000 | C | C |
| Example 25 | PG36 | A | P-1 | using polymer 8 and polymer 12 together at a mass ratio of 3/7 | 7500 | A | A |
| Example 26 | PG36 | B | none | polymer 10 | 6000 | A | A |
| Comparative Example 6 | PG36 | A | none | D-1 | 2000 | C | C |

It is found from Table 3 that the use of the polymeric compound of the invention in the pigment processing process or the dispersing process allows a color filter having high contrast, few residues in development and excellent surface smoothness.

Next, an example of the preparation of a colored photocurable composition is described for the formation of a color filter for a solid-state image sensing device.

—Preparation of Resist Liquid—

The components by the following composition were mixed and dissolved to prepare resist liquid.

| | |
|---|---|
| Propylene glycol monomethyl ether acetate | 19.20 parts |
| 40%-propylene glycol monomethyl ether acetate solution of benzyl methacrylate/methacrylic acid/2-hydroxyethyl methacrylate (molar ratio = 60/22/18) copolymer | 30.51 parts |
| Dipentaerythritol hexaacrylate | 12.20 parts |
| Polymerization inhibitor (para-methoxyphenol) | 0.0061 part |
| Fluorine surface-active agent (trade name: F-475, manufactured by Dainippon Ink And Chemicals, Inc.) | 0.83 part |
| TAZ-107 (trihalomethyltriazine-type photo polymerization initiator, manufactured by Midori Kagaku Co., Ltd.) | 0.586 part |

—Production of a Silicon Wafer with an Under Coat—

A 6-inch silicon wafer was subject to heat treatment at a temperature of 200° C. for 30 minutes by using an oven. Subsequently, the colored photocurable composition was applied on this silicon wafer so that the dried film thickness thereof became 1.5 μm, and further dried by heating in an oven of 220° C. for 1 hour to form an under coat and obtain a silicon wafer substrate with the under coat.

—Preparation of Pigment Fluid Dispersion—

| | |
|---|---|
| C.I. pigment green 36 as pigment (an average primary particle diameter of 30 nm) | 95 parts |
| Dispersant described in Table 4 (solid content concentration of 30%) | 35.5 parts |
| Propylene glycol monomethyl ether acetate (solvent) | 830 parts |

The above-mentioned compositions were mixed, and further mixed and dispersed for 15 hours by a bead mill to prepare pigment fluid dispersion.

—Preparation of a Photocurable Composition (Application Liquid)—

The following compositions using the pigment fluid dispersion obtained in the above were stirred and mixed to prepare solution of a photocurable composition.

| | |
|---|---|
| The above-mentioned pigment fluid dispersion | 600 parts |
| IRGACURE 907 (acetophenone-type photo polymerization initiator, manufactured by Ciba Specialty Chemicals) | 5 parts |
| Dipentaerythritol hexaacrylate (photo-polymerizable compound) | 15 parts |
| Propylene glycol monomethyl ether acetate (solvent) | 280 parts |

—Production and Evaluation of a Color Filter by a Photocurable Composition—

The photocurable composition prepared as described above was applied on the under coat of the silicon wafer with the under coat obtained in the above so that the dried film thickness of the applied film (the colored layer) became 0.7 μm. Thereafter, the applied film was subject to heat treatment (pre-bake) for 120 seconds by using a hot plate of 100° C.

Subsequently, the applied film was exposed at various exposure amounts in a range of 50 to 1200 mJ/cm$^2$ at a wavelength of 365 nm through an Island pattern mask with a pattern 1.5 μm square by using an i-ray stepper exposure equipment "FPA-3000i5+" (manufactured by Canon Inc.).

Thereafter, the silicon wafer substrate with the applied film after being exposed formed was put on a horizontal rotary table of a spin shower developing machine (trade name: DW-30, manufactured by CHEMITRONICS CO., LTD.), and subjected to paddle development at a temperature of 23° C. for 60 seconds by using "CD-2000" (manufactured by FUJIFILM Electronic Materials Co., Ltd.) to form a colored pattern on the silicon wafer.

The silicon wafer with the colored pattern formed was fixed to the horizontal rotary table by a vacuum chuck system to perform rinse treatment by supplying pure water as a shower from an exit nozzle above the center of rotation while rotating the silicon wafer at a number of revolutions of 50 r.p.m. by a rotary device, which silicon wafer was thereafter spray-dried.

Storage stability of solution (application liquid) of the photocurable composition prepared in the above, and developability of the photocurable composition layer formed on the glass substrate by using the photocurable composition were evaluated. The results of evaluating are shown in Table 4.

<Developability>

The presence of residues in the unexposed area (unexposed portion) was confirmed after post-baking by an optical microscope and SEM photographic observation to evaluate developability in accordance with the following evaluation standard.

—Evaluation Standard—

A: no residues were confirmed in the unexposed portion

B: few residues were confined in the unexposed portion and brought no problems practically C: residues were remarkably confirmed in the unexposed portion <Dispersibility>

The viscosity of the pigment dispersion composition immediately after dispersion and the viscosity of the pigment dispersion composition with 1 week passed at room temperature after dispersion were measured for the obtained pigment dispersion composition by using an E-type viscometer to evaluate the degree of thickening. Here, low viscosity signifies that the viscosity resulting from the dispersant is restrained from increasing to offer favorable dispersibility and dispersion stability of the pigment.

TABLE 4

| | dispersant | developability | initial viscosity (mPa · s) | viscosity with time (mPa · s) |
|---|---|---|---|---|
| Example 28 | polymer 1 | A | 30 | 50 |
| Example 29 | polymer 6 | A | 25 | 50 |
| Example 30 | polymer 9 | A | 30 | 60 |
| Example 31 | polymer 11 | A | 20 | 30 |
| Example 32 | polymer 16 | A | 20 | 25 |
| Comparative Example 8 | D-1 | C | 80 | gel |
| Comparative Example 9 | D-2 | C | 80 | gel |

In Table 4, D-1 and D-2 are the same as in Table 2. The polymers are compounds shown in Table 1.

It has been clarified also in the application to a solid-state image sensing device from Table 4 that the pigment dispersion composition of the invention has favorable dispersion stability and the photocurable composition has favorable developability.

The invention allows a pigment dispersion composition having high pigment dispersibility and dispersion stability and favorable color characteristics even in the case of containing pigment at high concentration. Also, the invention may provide a colored photocurable composition superior in developability and surface smoothness of a picture element, allowing high contrast, in composing a color filter; a color filter having favorable color characteristics and high contrast; and a liquid crystal display and a solid-state image sensing device using a color filter.

That is to say, the invention may provide the following items of <1> to <9>.

<1>. A pigment dispersion composition containing a polymeric compound (A) comprising one or more of a partial structure selected from either of the following formulae (1) and (2), and a weight-average molecular weight of 1,000 to 100,000, and pigment (B).

Formula (1)

wherein in formula (1), $Q^1$ denotes —(C=O)— or —$SO_2$—, $Q^2$ denotes —NH— or —$CHR^8$—, and Z denotes —(C=O)—$R^9$— or —$SO_2$—$R^9$—.

$R^8$ denotes a hydrogen atom, a halogen atom, a cyano group or an alkyl group, and $R^9$ denotes an alkylene group, a cycloalkylene group or an arylene group.

$R^8$ and $R^9$ may be linked to each other through a linking group.

Formula (2)

wherein in formula (2), Rf denotes an alkylene group with at least one fluorine atom substituted.

<2>. The pigment dispersion composition according to the item <1>, wherein the formula (1) is —(C=O)—$CHR^8$—(C=O)—$R^7$—.

In the formula, $R^8$ signifies the same as the formula (1), and $R^7$ denotes an alkylene group, a cycloalkylene group and an arylene group.

<3>. The pigment dispersion composition according to the item <1> or <2>, wherein the polymeric compound (A) is a polymeric compound containing 5 to 100% by mass of a repeating unit containing one or more of a partial structure selected from the formulae (1) and (2).

<4>. The pigment dispersion composition according to any one of the items <1> to <3>, wherein an acid value of the polymeric compound (A) is 30 to 300 mgKOH/g.

<5>. The pigment dispersion composition according to any one of the items <1> to <4>, wherein the polymeric compound (A) is a compound comprising polycaprolactone as a graft chain.

<6>. A photocurable composition containing the pigment dispersion composition according to any one of the items <1> to <5>, alkali-soluble resin, a photo-polymerizable compound and a photo polymerization initiator.

<7>. A color filter comprising the photocurable composition according to the item <6> used.

<8>. A liquid crystal display using the color filter according to the item <7>.

<9>. A solid-state image sensing device using the color filter according to the item <7>.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated.

All publications, patent applications, and technical standards mentioned in this specification are herein incorporated by reference to the same extent as if such individual publication, patent application, or technical standard was specifically and individually indicated to be incorporated by reference. It will be obvious to those having skill in the art that many changes may be made in the above-described details of the preferred embodiments of the present invention. It is intended that the scope of the invention be defined by the following claims and their equivalents.

What is claimed is:

1. A photocurable composition containing a pigment dispersion composition, an alkali-soluble resin, a photopolymerizable compound, an organic solvent in a range of from 80% by mass to 90% by mass with respect to a total mass of the photocurable composition, and a photopolymerization initiator, the pigment dispersion composition containing a pigment (B) dispersed with a polymeric compound (A) which comprises at least one partial structure selected from the following formulae (1) and (2) and has a vinyl polymer main chain having a weight-average molecular weight of 1,000 to 100,000:

Formula (1)

wherein in formula (1), $Q^1$ denotes —(C=O)— or —$SO_2$—; $Q^2$ denotes —NH— or —$CHR^8$—; Z denotes —(C=O)—$R^9$— or —$SO_2$—$R^9$—; $R^8$ denotes a hydrogen atom, a halogen atom, a cyano group or an alkyl group; $R^9$ denotes an alkylene group, a cycloalkylene group or an arylene group; and $R^8$ and $R^9$ may be linked to each other by a linking group;

Formula (2)

wherein in formula (2), Rf denotes an alkylene group with at least one fluorine atom substituted, wherein an acid value of the polymeric compound (A) is 50 to 200 mgKOH/g, and the polymeric compound (A) contains 15 to 100% by mass of a repeating unit containing at least one partial structure selected from the formulae (1) and (2).

2. The photocurable composition according to claim 1, wherein formula (1) is

wherein $R^8$ is the same as in formula (1), and $R^7$ denotes an alkylene group, a cycloalkylene group or an arylene group.

3. A photocurable composition containing a pigment dispersion composition, an alkali soluble resin, a photopolymerizable compound and a photopolymerization initiator, the pigment dispersion composition containing a pigment (B) dispersed with a polymeric compound (A) which comprises at least one partial structure selected from the following formulae (1) and (2) and polycaprolactone as a graft chain, and has a vinyl polymer main chain having a weight-average molecular weight of 1,000 to 100,000;

-Q$^1$-Q$^2$-Z—                    Formula (1)

wherein in formula (1), Q$^1$ denotes —(C=O)— or —SO$_2$—; Q$^2$ denotes —NH— or —CHR$^8$—; Z denotes —(C=O)—R$^9$— or —SO$_2$—R$^9$—; R$^8$ denotes a hydrogen atom, a halogen atom, a cyano group or an alkyl group; R$^9$ denotes an alkylene group, a cycloalkylene group or an arylene group; and R$^8$ and R$^9$ may be linked to each other by a linking group;

-Rf-OH                              Formula (2)

wherein in formula (2), Rf denotes an alkylene group with at least one fluorine atom substituted, wherein an acid value of the polymeric compound (A) is 50 to 200 mgKOH/g, and the polymeric compound (A) contains 15 to 100% by mass of a repeating unit containing at least one partial structure selected from the formula (1) and (2).

4. A color filter comprising a substrate and a patterned film composed of a picture element formed by applying the photocurable composition according to claim 1 onto the substrate.

5. The photocurable composition according to claim 1, wherein the at least one partial structure is a structure formed through a polymerization of a monomer selected from the group consisting of the following Formulae G-1 to G-20 and G-25 to G-28:

G-1
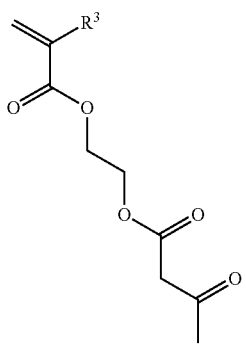

G-2
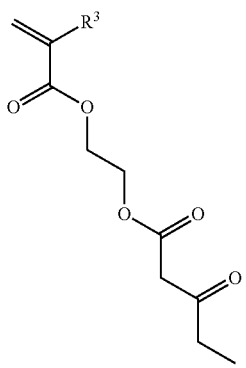

-continued

G-3
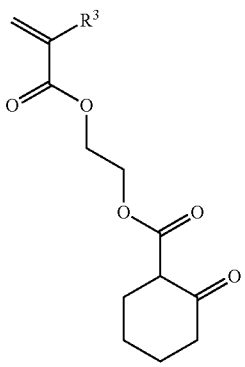

G-4
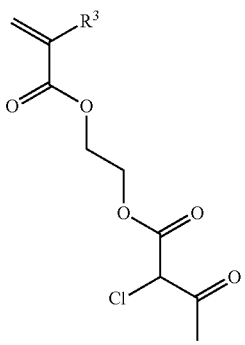

G-5
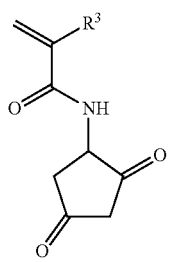

G-6
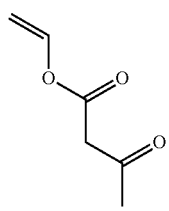

G-7
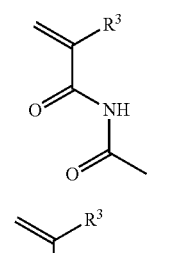

G-8

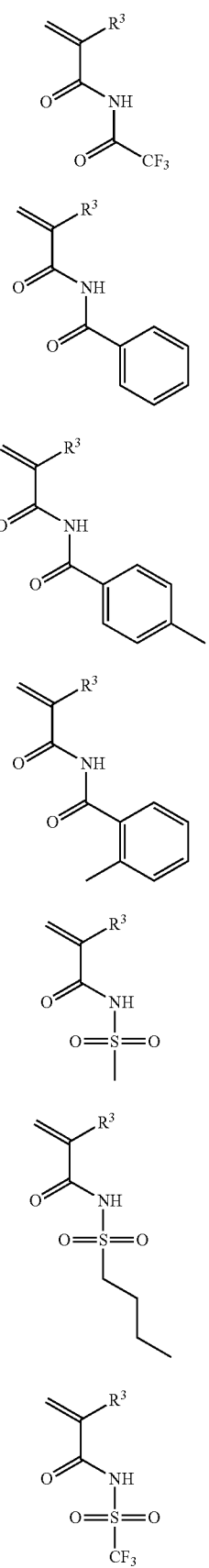
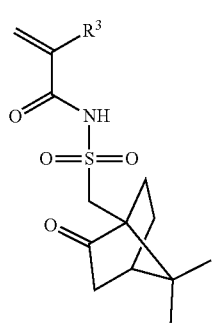
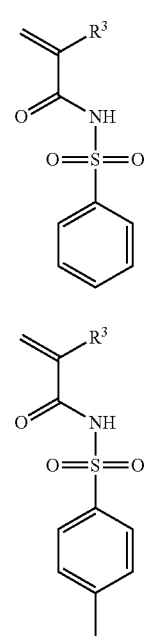
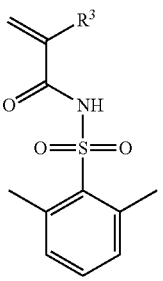
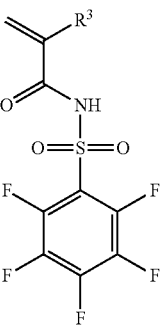

-continued

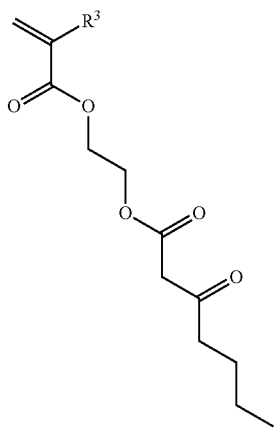
G-25

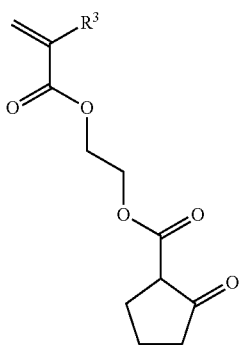
G-26

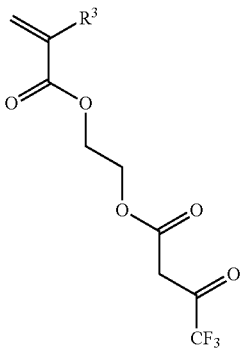
G-27

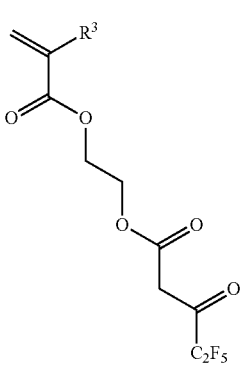
G-28 wherein, in Formulae, $R^3$ denotes a hydrogen atom or a methyl group.

6. The photocurable composition according to claim 1, wherein the vinyl polymer main chain consists of repeating units derived from at least one vinyl monomer.

7. The photocurable composition according to claim 5, wherein the at least one partial structure is a structure formed through a polymerization of a monomer selected from the group consisting of Formulae G-2 to G-20 and G-25 to G-28.

8. A pigment dispersion composition comprising a pigment (B) and a polymeric compound (A) which comprises polycaprolactone as a graft chain and a repeating unit formed by polymerization of at least one selected from the following monomers represented by Formulae G-1 to G-20 and G-25 to G-28 and is a polymer having a weight-average molecular weight of 1,000 to 100,000, and an acid value of 30 to 300 mgKOH/g:

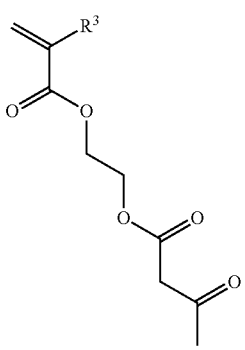
G-1

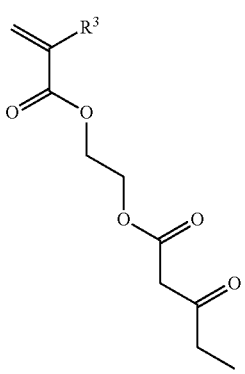
G-2

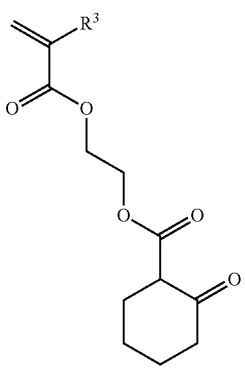
G-3

-continued
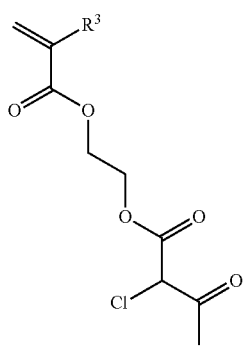
G-4
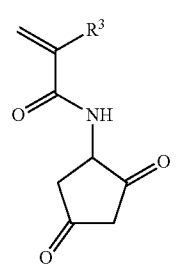
G-5
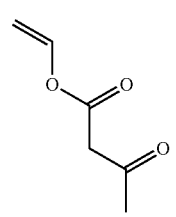
G-6
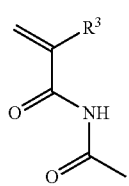
G-7
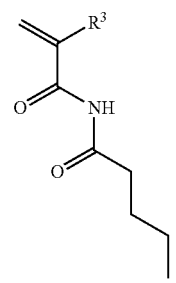
G-8
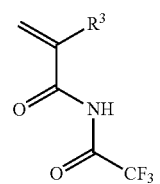
G-9
-continued
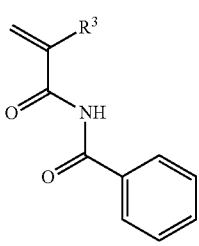
G-10
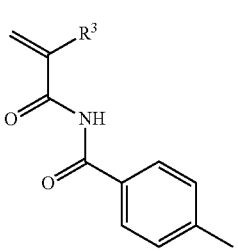
G-11
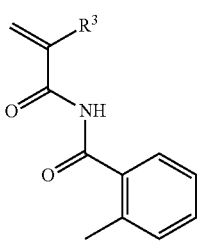
G-12
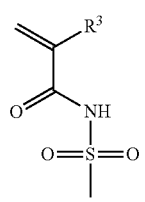
G-13
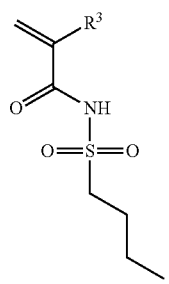
G-14
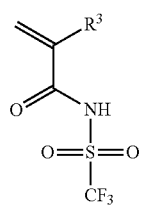
G-15

G-16
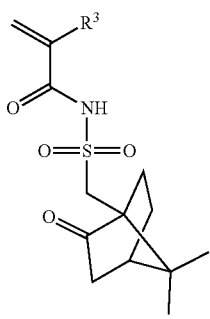
G-17
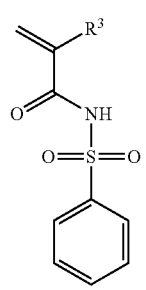
G-18
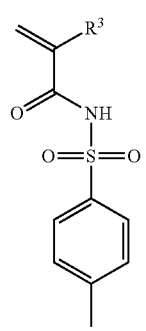
G-19
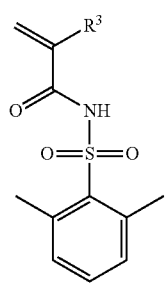
G-20
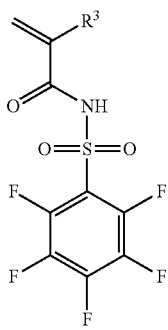
G-25
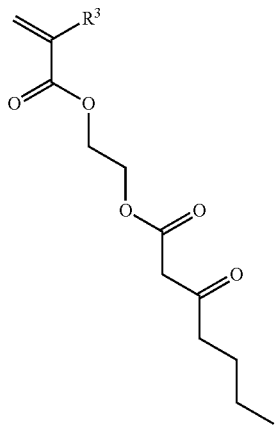
G-26
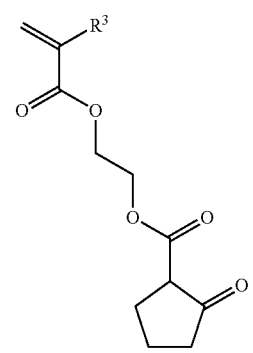
G-27
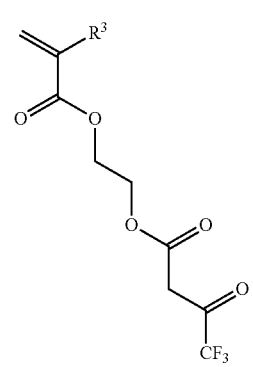
G-28
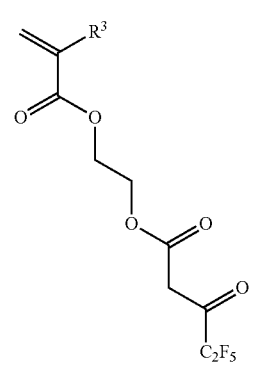
wherein, in Formulae, $R^3$ denotes a hydrogen atom or a methyl group.
9. The pigment dispersion composition according to claim 8, wherein the polymeric compound (A) comprises a repeating unit formed by polymerization of a monomer represented by Formula G-1.

10. A photocurable composition comprising the pigment dispersion according to claim 8, an alkali-soluble resin, a photopolymerizable compound, and a photopolymerization initiator.

11. A color filter comprising a substrate and a patterned film composed of a picture element formed by applying the photocurable composition according to claim 10 onto the substrate.

12. A solid-stage image sensing device comprising the color filter according to claim 11.

13. The photocurable composition according to claim 8, wherein the polymeric compound (A) comprises a repeating unit formed by polymerization of a monomer selected from the group consisting of the Formulae G-2 to G-20 and G-25 to G-28.

14. The photocurable composition according to claim 1, wherein the at least one partial structure is represented by Formula (1).

* * * * *